(12) United States Patent
Yoscovich et al.

(10) Patent No.: US 12,057,807 B2
(45) Date of Patent: Aug. 6, 2024

(54) CHAIN OF POWER DEVICES

(71) Applicant: Solaredge Technologies Ltd., Herzeliya (IL)

(72) Inventors: Ilan Yoscovich, Ramat Gan (IL); Tzachi Glovinsky, Petah Tikva (IL); Ofir Bieber, Ra'anana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 17/141,709

(22) Filed: Jan. 5, 2021

(65) Prior Publication Data
US 2021/0167723 A1 Jun. 3, 2021

Related U.S. Application Data

(63) Continuation-in-part of application No. 15/593,761, filed on May 12, 2017, now Pat. No. 11,201,476, and (Continued)

(51) Int. Cl.
*H02J 3/38* (2006.01)
*H01B 9/02* (2006.01)
(Continued)

(52) U.S. Cl.
CPC .............. *H02S 40/36* (2014.12); *H01B 9/02* (2013.01); *H02J 1/12* (2013.01); *H02J 3/381* (2013.01);
(Continued)

(58) Field of Classification Search
CPC .......... H02S 40/36; H02S 40/32; H02S 40/34; H02S 50/00; H02S 40/30; H01B 9/02;
(Continued)

(56) References Cited

U.S. PATENT DOCUMENTS 2,367,925 A   1/1945   Brown
2,586,804 A   2/1952   Fluke
(Continued)

FOREIGN PATENT DOCUMENTS

AU   2073800 A    9/2000
AU   2005262278 A1   1/2006
(Continued)

OTHER PUBLICATIONS

Nov. 17, 2021—CN Office Action—CN App No. 201810025083.8.
(Continued)

*Primary Examiner* — Rexford N Barnie
*Assistant Examiner* — Thai H Tran
(74) *Attorney, Agent, or Firm* — Banner & Witcoff, Ltd.

(57) ABSTRACT

Methods for deploying connected power devices and systems of connected power devices prior to deployment in a photovoltaic installation are described. For example, a string of power devices pre-coupled by conductors is disclosed, which saves cost, provides convenient storage, reduces electromagnetic interference, and is easy to deploy. Various implementations described herein are also directed to employing photovoltaic strings including a photovoltaic power device with a specialized wiring configuration, which enables high string efficiency without incurring excessive wiring costs. Implementations may include a cable built into photovoltaic generators that carry one portion of the current, and other portions of the current may be carried by direct-current (DC) or alternating-current (AC) cables bypassing the photovoltaic generators.

19 Claims, 54 Drawing Sheets

Related U.S. Application Data a continuation-in-part of application No. 15/478,526, filed on Apr. 4, 2017, now Pat. No. 11,177,663.

(60) Provisional application No. 62/395,461, filed on Sep. 16, 2016, provisional application No. 62/395,461, filed on Sep. 16, 2016, provisional application No. 62/341,147, filed on May 25, 2016, provisional application No. 62/318,303, filed on Apr. 5, 2016.

(51) Int. Cl.
*H02J 1/12* (2006.01)
*H02S 40/32* (2014.01)
*H02S 40/34* (2014.01)
*H02S 40/36* (2014.01)
*H02S 50/00* (2014.01)

(52) U.S. Cl.
CPC .............. *H02S 40/32* (2014.12); *H02S 40/34* (2014.12); *H02S 50/00* (2013.01); *H02J 2300/26* (2020.01)

(58) Field of Classification Search
CPC .......... H02J 1/12; H02J 3/381; H02J 2300/26; H01L 31/02021; H01L 31/042; Y02E 10/56

See application file for complete search history.

(56) References Cited

U.S. PATENT DOCUMENTS

| | | |
|---|---|---|
| 2,758,219 A | 8/1956 | Miller |
| 2,852,721 A | 9/1958 | Harders et al. |
| 2,958,171 A | 11/1960 | Deckers |
| 3,369,210 A | 2/1968 | Manickella |
| 3,380,035 A | 4/1968 | Hecker |
| 3,392,326 A | 7/1968 | Lamberton |
| 3,496,029 A | 2/1970 | King et al. |
| 3,566,143 A | 2/1971 | Paine et al. |
| 3,569,784 A | 3/1971 | Carroll et al. |
| 3,643,564 A | 2/1972 | Uchiyama |
| 3,696,286 A | 10/1972 | Ule |
| 3,740,652 A | 6/1973 | Burgener |
| 3,958,136 A | 5/1976 | Schroeder |
| 3,982,105 A | 9/1976 | Eberle |
| 4,060,757 A | 11/1977 | McMurray |
| 4,101,816 A | 7/1978 | Shepter |
| 4,104,687 A | 8/1978 | Zulaski |
| 4,127,797 A | 11/1978 | Perper |
| 4,129,788 A | 12/1978 | Chavannes |
| 4,129,823 A | 12/1978 | van der Pool et al. |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,324,225 A | 4/1982 | Trihey |
| 4,327,318 A | 4/1982 | Kwon et al. |
| 4,346,341 A | 8/1982 | Blackburn et al. |
| 4,363,040 A | 12/1982 | Inose |
| 4,367,557 A | 1/1983 | Stern et al. |
| 4,375,662 A | 3/1983 | Baker |
| 4,384,321 A | 5/1983 | Rippel |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,470,213 A | 9/1984 | Thompson |
| 4,479,175 A | 10/1984 | Gille et al. |
| 4,481,654 A | 11/1984 | Daniels et al. |
| 4,488,136 A | 12/1984 | Hansen et al. |
| 4,526,553 A | 7/1985 | Guerrero |
| 4,533,986 A | 8/1985 | Jones |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,611,090 A | 9/1986 | Catella et al. |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,746,879 A | 5/1988 | Ma et al. |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,041,739 A | 8/1991 | Goto |
| 5,045,988 A | 9/1991 | Gritter et al. |
| 5,081,558 A | 1/1992 | Mahler |
| 5,097,196 A | 3/1992 | Schoneman |
| 5,138,422 A | 8/1992 | Fujii et al. |
| 5,143,556 A | 9/1992 | Matlin |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,210,519 A | 5/1993 | Moore |
| 5,235,266 A | 8/1993 | Schaffrin |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |

(56) References Cited

U.S. PATENT DOCUMENTS

| | | |
|---|---|---|
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,475,296 A | 12/1995 | Vinsant et al. |
| 5,477,091 A | 12/1995 | Fiorina et al. |
| 5,493,154 A | 2/1996 | Smith et al. |
| 5,497,289 A | 3/1996 | Sugishima et al. |
| 5,501,083 A | 3/1996 | Kim |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |
| 5,576,941 A | 11/1996 | Nguyen et al. |
| 5,580,395 A | 12/1996 | Yoshioka et al. |
| 5,585,749 A | 12/1996 | Pace et al. |
| 5,604,430 A | 2/1997 | Decker et al. |
| 5,616,913 A | 4/1997 | Litterst |
| 5,625,539 A | 4/1997 | Nakata et al. |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,258 A | 3/1998 | Esser |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A | 12/1999 | Duba et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,127,801 A | 10/2000 | Manor |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,191,498 B1 | 2/2001 | Chang |
| 6,215,286 B1 | 4/2001 | Scoones et al. |
| 6,219,623 B1 | 4/2001 | Wills |
| 6,222,351 B1 | 4/2001 | Fontanella et al. |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,275,016 B1 | 8/2001 | Ivanov |
| 6,281,485 B1 | 8/2001 | Siri |
| 6,285,572 B1 | 9/2001 | Onizuka et al. |
| 6,291,764 B1 | 9/2001 | Ishida et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |

(56) References Cited

U.S. PATENT DOCUMENTS

| | | |
|---|---|---|
| 6,329,808 B1 | 12/2001 | Enguent |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Lautenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,362 B1 | 9/2002 | Choo |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,479,963 B1 | 11/2002 | Manor et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,515,217 B1 | 2/2003 | Aylaian |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,664,762 B2 | 12/2003 | Kutkut |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,708,507 B2 | 3/2004 | Sem et al. |
| 6,709,291 B1 | 3/2004 | Wallace et al. |
| 6,724,593 B1 | 4/2004 | Smith |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,828,901 B2 | 12/2004 | Birchfield et al. |
| 6,835,491 B2 | 12/2004 | Gartstein et al. |
| 6,837,739 B2 | 1/2005 | Gorringe et al. |
| 6,838,611 B2 | 1/2005 | Kondo et al. |
| 6,838,856 B2 | 1/2005 | Raichle |
| 6,842,354 B1 | 1/2005 | Tallam et al. |
| 6,844,739 B2 | 1/2005 | Kasai et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,894,911 B2 | 5/2005 | Telefus et al. |
| 6,897,370 B2 | 5/2005 | Kondo et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,970,365 B2 | 11/2005 | Turchi |
| 6,980,783 B2 | 12/2005 | Liu et al. |
| 6,984,967 B2 | 1/2006 | Notman |
| 6,984,970 B2 | 1/2006 | Capel |
| 6,985,967 B1 | 1/2006 | Hipp |
| 6,987,444 B2 | 1/2006 | Bub et al. |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,039,941 B1 | 5/2006 | Caporizzo et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,088,595 B2 | 8/2006 | Nino |
| 7,089,780 B2 | 8/2006 | Sunshine et al. |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,150,938 B2 | 12/2006 | Munshi et al. |
| 7,157,888 B2 | 1/2007 | Chen et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,176,667 B2 | 2/2007 | Chen et al. |
| 7,183,667 B2 | 2/2007 | Colby et al. |
| 7,193,872 B2 | 3/2007 | Siri |

(56) References Cited

U.S. PATENT DOCUMENTS

| | | |
|---|---|---|
| 7,202,653 B2 | 4/2007 | Pai |
| 7,208,674 B2 | 4/2007 | Aylaian |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,282,924 B1 | 10/2007 | Wittner |
| 7,291,036 B1 | 11/2007 | Daily et al. |
| 7,298,113 B2 | 11/2007 | Orikasa |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,391,190 B1 | 6/2008 | Rajagopalan |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,510 B2 | 11/2008 | Ito et al. |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,634,667 B2 | 12/2009 | Weaver et al. |
| 7,646,116 B2 | 1/2010 | Batarseh et al. |
| 7,649,434 B2 | 1/2010 | Xu et al. |
| 7,659,701 B1 | 2/2010 | Metsker et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,777,570 B2 | 8/2010 | Lai |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,007 B2 | 3/2011 | Gibson et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,962,249 B1 | 6/2011 | Zhang et al. |
| 7,969,043 B2 | 6/2011 | Caraghiorghiopol et al. |
| 7,969,133 B2 | 6/2011 | Zhang et al. |
| 7,977,810 B2 | 7/2011 | Choi et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,237 B2 | 8/2011 | Manor et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,049,363 B2 | 11/2011 | McLean et al. |
| 8,050,804 B2 | 11/2011 | Kernahan |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |

(56) References Cited

U.S. PATENT DOCUMENTS

| | | |
|---|---|---|
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,232,790 B2 | 7/2012 | Leong et al. |
| 8,233,301 B1 | 7/2012 | Guo |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,284,574 B2 | 10/2012 | Chapman et al. |
| 8,289,183 B1 | 10/2012 | Foss |
| 8,289,742 B2 | 10/2012 | Adest et al. |
| 8,294,451 B2 | 10/2012 | Hasenfus |
| 8,299,757 B2 | 10/2012 | Yamauchi et al. |
| 8,299,773 B2 | 10/2012 | Jang et al. |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,319,471 B2 | 11/2012 | Adest et al. |
| 8,324,921 B2 | 12/2012 | Adest et al. |
| 8,325,059 B2 | 12/2012 | Rozenboim |
| 8,344,548 B2 | 1/2013 | Stern |
| 8,369,113 B2 | 2/2013 | Rodriguez |
| 8,378,656 B2 | 2/2013 | de Rooij et al. |
| 8,379,418 B2 | 2/2013 | Falk |
| 8,391,031 B2 | 3/2013 | Garrity |
| 8,391,032 B2 | 3/2013 | Garrity et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,410,889 B2 | 4/2013 | Garrity et al. |
| 8,410,950 B2 | 4/2013 | Takehara et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,466,789 B2 | 6/2013 | Muhlberger et al. |
| 8,472,220 B2 | 6/2013 | Garrity et al. |
| 8,473,250 B2 | 6/2013 | Adest et al. |
| 8,509,032 B2 | 8/2013 | Rakib |
| 8,526,205 B2 | 9/2013 | Garrity |
| 8,531,055 B2 | 9/2013 | Adest et al. |
| 8,542,512 B2 | 9/2013 | Garrity |
| 8,570,017 B2 | 10/2013 | Perichon et al. |
| 8,581,441 B2 | 11/2013 | Rotzoll et al. |
| 8,587,151 B2 | 11/2013 | Adest et al. |
| 8,618,692 B2 | 12/2013 | Adest et al. |
| 8,624,443 B2 | 1/2014 | Mumtaz |
| 8,653,689 B2 | 2/2014 | Rozenboim |
| 8,669,675 B2 | 3/2014 | Capp et al. |
| 8,670,255 B2 | 3/2014 | Gong et al. |
| 8,674,548 B2 | 3/2014 | Mumtaz |
| 8,674,668 B2 | 3/2014 | Chisenga et al. |
| 8,686,333 B2 | 4/2014 | Arditi et al. |
| 8,710,351 B2 | 4/2014 | Robbins |
| 8,751,053 B2 | 6/2014 | Hadar et al. |
| 8,773,236 B2 | 7/2014 | Makhota et al. |
| 8,791,598 B2 | 7/2014 | Jain |
| 8,796,884 B2 | 8/2014 | Naiknaware et al. |
| 8,809,699 B2 | 8/2014 | Funk |
| 8,811,047 B2 | 8/2014 | Rodriguez |
| 8,816,535 B2 | 8/2014 | Adest et al. |
| 8,823,212 B2 | 9/2014 | Garrity et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,859,884 B2 | 10/2014 | Dunton et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,917,156 B2 | 12/2014 | Garrity et al. |
| 8,922,061 B2 | 12/2014 | Arditi |
| 8,933,321 B2 | 1/2015 | Hadar et al. |
| 8,934,269 B2 | 1/2015 | Garrity |
| 8,947,194 B2 | 2/2015 | Sella et al. |
| 8,963,375 B2 | 2/2015 | DeGraaff |
| 8,963,378 B1 | 2/2015 | Fornage et al. |
| 8,963,501 B2 | 2/2015 | Shigemizu et al. |
| 8,963,518 B2 | 2/2015 | Wolfs |
| 8,972,765 B1 | 3/2015 | Krolak et al. |
| 9,041,339 B2 | 5/2015 | Adest et al. |
| 9,130,401 B2 | 9/2015 | Adest et al. |
| 9,257,848 B2 | 2/2016 | Coccia et al. |
| 9,291,696 B2 | 3/2016 | Adest et al. |
| 9,362,743 B2 | 6/2016 | Gazit et al. |
| 9,397,497 B2 | 7/2016 | Ledenev |
| 9,401,664 B2 | 7/2016 | Perreault et al. |
| 9,407,161 B2 | 8/2016 | Adest et al. |
| 9,466,737 B2 | 10/2016 | Ledenev |
| 9,577,454 B2 | 2/2017 | Seymour et al. |
| 9,647,442 B2 | 5/2017 | Yoscovich et al. |
| 9,660,527 B2 | 5/2017 | Glovinski |
| 9,673,630 B2 | 6/2017 | Ledenev et al. |
| 9,819,178 B2 | 11/2017 | Gazit et al. |
| 9,831,916 B2 | 11/2017 | Behrends |
| 9,843,193 B2 | 12/2017 | Getsla |
| 9,865,411 B2 | 1/2018 | Friebe et al. |
| 9,869,701 B2 | 1/2018 | Sella et al. |
| 9,923,516 B2 | 3/2018 | Har-Shai et al. |
| 9,991,717 B1 | 6/2018 | Rowe et al. |
| 10,032,939 B2 | 7/2018 | Ledenev et al. |
| 10,673,253 B2 | 6/2020 | Adest et al. |
| 10,969,412 B2 | 4/2021 | Sella et al. |
| 11,018,623 B2 | 5/2021 | Loewenstern et al. |
| 11,476,799 B2 | 10/2022 | Sella et al. |
| 11,682,918 B2 | 6/2023 | Adest et al. |
| 2001/0000957 A1 | 5/2001 | Birchfield et al. |
| 2001/0011881 A1 | 8/2001 | Emori et al. |
| 2001/0013767 A1 | 8/2001 | Takemoto |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0002040 A1 | 1/2002 | Kline et al. |
| 2002/0014262 A1 | 2/2002 | Matsushita et al. |
| 2002/0017900 A1 | 2/2002 | Takeda et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0105765 A1 | 8/2002 | Kondo et al. |
| 2002/0113689 A1 | 8/2002 | Gehlot et al. |
| 2002/0118559 A1 | 8/2002 | Kurokami et al. |
| 2002/0127980 A1 | 9/2002 | Amanullah et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0001709 A1 | 1/2003 | Visser |
| 2003/0002303 A1 | 1/2003 | Riggio et al. |
| 2003/0025594 A1 | 2/2003 | Akiyama et al. |

(56) References Cited

U.S. PATENT DOCUMENTS

| | | |
|---|---|---|
| 2003/0038615 A1 | 2/2003 | Elbanhawy |
| 2003/0043597 A1 | 3/2003 | Betts-LaCroix |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0121514 A1 | 7/2003 | Davenport et al. |
| 2003/0127126 A1 | 7/2003 | Yang |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0206424 A1 | 11/2003 | Jungreis et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0027101 A1 | 2/2004 | Vinciarelli et al. |
| 2004/0027112 A1 | 2/2004 | Kondo et al. |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211456 A1 | 10/2004 | Brown et al. |
| 2004/0211458 A1 | 10/2004 | Gui et al. |
| 2004/0211459 A1 | 10/2004 | Suenaga et al. |
| 2004/0213169 A1 | 10/2004 | Allard et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0255999 A1 | 12/2004 | Matsushita et al. |
| 2004/0258141 A1 | 12/2004 | Tustison et al. |
| 2004/0262998 A1 | 12/2004 | Kunow et al. |
| 2004/0263119 A1 | 12/2004 | Meyer et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0122747 A1 | 6/2005 | Gaksch |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0191528 A1 | 9/2005 | Cortes et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |
| 2005/0231183 A1 | 10/2005 | Li et al. |
| 2005/0242795 A1 | 11/2005 | Al-Kuran et al. |
| 2005/0248428 A1 | 11/2005 | Coleman et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0286510 A1 | 12/2005 | Nakajima et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0055384 A1 | 3/2006 | Jordan et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0091958 A1 | 5/2006 | Bhatti et al. |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0125449 A1 | 6/2006 | Unger |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222912 A1 | 10/2006 | Smith |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |

(56) References Cited

U.S. PATENT DOCUMENTS

| | | |
|---|---|---|
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0238750 A1 | 10/2006 | Shimotomai |
| 2006/0243318 A1 | 11/2006 | Feldmeier et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0103297 A1 | 5/2007 | Armstrong et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0217178 A1 | 9/2007 | Johnson et al. |
| 2007/0223165 A1 | 9/2007 | Itri et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0246546 A1 | 10/2007 | Yoshida |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273240 A1 | 11/2007 | Steele et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0030198 A1 | 2/2008 | Kawata et al. |
| 2008/0036440 A1 | 2/2008 | Garmer |
| 2008/0055941 A1 | 3/2008 | Victor et al. |
| 2008/0072091 A1 | 3/2008 | Hanson et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1* | 6/2008 | Adest ................. H02J 3/381 702/188 |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0156551 A1 | 7/2008 | Kawahara et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192510 A1 | 8/2008 | Falk |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0283118 A1 | 11/2008 | Rotzoll et al. |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0010035 A1 | 1/2009 | Williams |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039833 A1 | 2/2009 | Kitagawa |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0097283 A1 | 4/2009 | Krein et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0183763 A1 | 7/2009 | Meyer |

(56) References Cited

U.S. PATENT DOCUMENTS

| | | |
|---|---|---|
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243385 A1 | 10/2009 | Ichikawa |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0295225 A1 | 12/2009 | Asplund et al. |
| 2009/0296434 A1 | 12/2009 | De Rooij et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Wrutsky et al. |
| 2010/0026736 A1 | 2/2010 | Plut |
| 2010/0038907 A1 | 2/2010 | Hunt et al. |
| 2010/0043781 A1 | 2/2010 | Jones et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0103579 A1 | 4/2010 | Carkner et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0131108 A1 | 5/2010 | Meyer |
| 2010/0132757 A1 | 6/2010 | He et al. |
| 2010/0132758 A1 | 6/2010 | Gilmore |
| 2010/0132761 A1 | 6/2010 | Echizenya et al. |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0141153 A1 | 6/2010 | Recker et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195357 A1 | 8/2010 | Fornage et al. |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0213897 A1 | 8/2010 | Tse |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0315043 A1 | 12/2010 | Chau |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0019444 A1 | 1/2011 | Dargatz et al. |
| 2011/0025130 A1 | 2/2011 | Hadar et al. |
| 2011/0026282 A1 | 2/2011 | Chapman et al. |
| 2011/0027626 A1 | 2/2011 | Lattin |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0088741 A1 | 4/2011 | Dunton et al. |
| 2011/0101949 A1 | 5/2011 | Lopata et al. |
| 2011/0108087 A1 | 5/2011 | Croft et al. |
| 2011/0109158 A1 | 5/2011 | Olsen |
| 2011/0114154 A1 | 5/2011 | Lichy et al. |
| 2011/0115295 A1 | 5/2011 | Moon et al. |
| 2011/0115393 A1 | 5/2011 | He |
| 2011/0116294 A1 | 5/2011 | Wolf |
| 2011/0121441 A1 | 5/2011 | Halstead et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0133556 A1 | 6/2011 | Choi |
| 2011/0139213 A1 | 6/2011 | Lee |
| 2011/0140535 A1 | 6/2011 | Choi et al. |
| 2011/0140536 A1 | 6/2011 | Adest et al. |
| 2011/0141644 A1 | 6/2011 | Hastings et al. |
| 2011/0144822 A1 | 6/2011 | Choi |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0179726 A1 | 7/2011 | Pao et al. |
| 2011/0181251 A1 | 7/2011 | Porter et al. |
| 2011/0181340 A1 | 7/2011 | Gazit |
| 2011/0183537 A1 | 7/2011 | Fornage et al. |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |

(56) References Cited

U.S. PATENT DOCUMENTS

| | | |
|---|---|---|
| 2011/0260866 A1 | 10/2011 | Avrutsky et al. |
| 2011/0267721 A1 | 11/2011 | Chaintreuil et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273024 A1 | 11/2011 | Butzmann |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0285375 A1 | 11/2011 | Deboy |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007434 A1 | 1/2012 | Perreault et al. |
| 2012/0007558 A1 | 1/2012 | Pigott |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0042588 A1 | 2/2012 | Erickson, Jr. |
| 2012/0043818 A1 | 2/2012 | Stratakos et al. |
| 2012/0043823 A1 | 2/2012 | Stratakos et al. |
| 2012/0044014 A1 | 2/2012 | Stratakos et al. |
| 2012/0044717 A1 | 2/2012 | Suntio et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0049819 A1 | 3/2012 | Mao et al. |
| 2012/0056483 A1 | 3/2012 | Capp et al. |
| 2012/0056591 A1 | 3/2012 | Abe et al. |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104861 A1 | 5/2012 | Kojori et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0127764 A1 | 5/2012 | Phadke et al. |
| 2012/0133372 A1 | 5/2012 | Tsai et al. |
| 2012/0134058 A1 | 5/2012 | Pamer et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0169291 A1 | 7/2012 | Abe et al. |
| 2012/0174961 A1 | 7/2012 | Larson et al. |
| 2012/0175961 A1 | 7/2012 | Har-Shai et al. |
| 2012/0175963 A1 | 7/2012 | Adest et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0200311 A1 | 8/2012 | Chaintreuil |
| 2012/0212066 A1 | 8/2012 | Adest et al. |
| 2012/0215367 A1 | 8/2012 | Eizips et al. |
| 2012/0217797 A1 | 8/2012 | Butzmann |
| 2012/0217973 A1 | 8/2012 | Avrutsky |
| 2012/0228931 A1 | 9/2012 | Butzmann |
| 2012/0240490 A1 | 9/2012 | Gangemi |
| 2012/0242156 A1 | 9/2012 | Butzmann et al. |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0268969 A1 | 10/2012 | Cuk |
| 2012/0271576 A1 | 10/2012 | Kamel et al. |
| 2012/0274145 A1 | 11/2012 | Taddeo |
| 2012/0274264 A1 | 11/2012 | Mun et al. |
| 2012/0280571 A1 | 11/2012 | Hargis |
| 2012/0299380 A1 | 11/2012 | Haupt |
| 2012/0318320 A1 | 12/2012 | Robbins |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0039028 A1 | 2/2013 | Korman et al. |
| 2013/0049710 A1 | 2/2013 | Kraft et al. |
| 2013/0057223 A1 | 3/2013 | Lee |
| 2013/0062958 A1 | 3/2013 | Erickson, Jr. et al. |
| 2013/0063119 A1 | 3/2013 | Lubomirsky |
| 2013/0069438 A1 | 3/2013 | Liu et al. |
| 2013/0082724 A1 | 4/2013 | Noda et al. |
| 2013/0094112 A1 | 4/2013 | Burghardt et al. |
| 2013/0094262 A1 | 4/2013 | Avrutsky |
| 2013/0134790 A1 | 5/2013 | Amaratunga et al. |
| 2013/0175971 A1 | 7/2013 | Har-Shai et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0194706 A1 | 8/2013 | Har-Shai et al. |
| 2013/0200709 A1 | 8/2013 | Kirchner et al. |
| 2013/0200710 A1 | 8/2013 | Robbins |
| 2013/0214607 A1 | 8/2013 | Harrison |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1 | 10/2013 | McBride et al. |
| 2013/0271096 A1 | 10/2013 | Inagaki |
| 2013/0279210 A1 | 10/2013 | Chisenga et al. |
| 2013/0285459 A1 | 10/2013 | Jaoui et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1 | 12/2013 | Hopf et al. |
| 2013/0321013 A1 | 12/2013 | Pisklak et al. |
| 2013/0328541 A1 | 12/2013 | Euler et al. |
| 2013/0332093 A1 | 12/2013 | Adest et al. |
| 2013/0335861 A1 | 12/2013 | Laschinski et al. |
| 2014/0062206 A1 | 3/2014 | Bryson |
| 2014/0077756 A1 | 3/2014 | Kataoka et al. |
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0169053 A1 | 6/2014 | Ilic et al. |
| 2014/0191583 A1 | 7/2014 | Chisenga et al. |
| 2014/0210485 A1 | 7/2014 | Lang et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0268913 A1 | 9/2014 | Zheng et al. |
| 2014/0293491 A1 | 10/2014 | Robbins |
| 2014/0306543 A1 | 10/2014 | Garrity et al. |
| 2014/0327313 A1 | 11/2014 | Arditi et al. |
| 2014/0327995 A1 | 11/2014 | Panjwani et al. |
| 2014/0354245 A1 | 12/2014 | Batikoff et al. |
| 2015/0022006 A1 | 1/2015 | Garrity et al. |

(56) References Cited

U.S. PATENT DOCUMENTS

| | | |
|---|---|---|
| 2015/0028683 A1 | 1/2015 | Hadar et al. |
| 2015/0028692 A1 | 1/2015 | Makhota et al. |
| 2015/0061409 A1 | 3/2015 | Dunton et al. |
| 2015/0069844 A1 | 3/2015 | Wu et al. |
| 2015/0131187 A1 | 5/2015 | Krein et al. |
| 2015/0161872 A1* | 6/2015 | Beaulieu .................. B66C 13/40 340/686.6 |
| 2015/0188415 A1 | 7/2015 | Abido et al. |
| 2015/0214889 A1* | 7/2015 | Nam ........................ H02S 30/10 136/251 |
| 2015/0236589 A1 | 8/2015 | Baba |
| 2015/0263609 A1 | 9/2015 | Weida et al. |
| 2015/0318410 A1 | 11/2015 | Higuma |
| 2015/0351264 A1* | 12/2015 | Linderman .............. H02M 7/44 361/752 |
| 2015/0364918 A1 | 12/2015 | Singh et al. |
| 2015/0372490 A1 | 12/2015 | Bakas et al. |
| 2015/0381108 A1 | 12/2015 | Hoft et al. |
| 2015/0381111 A1 | 12/2015 | Nicolescu et al. |
| 2016/0006392 A1 | 1/2016 | Hoft |
| 2016/0036235 A1 | 2/2016 | Getsla |
| 2016/0126367 A1 | 5/2016 | Dunton et al. |
| 2016/0172900 A1 | 6/2016 | Welch, Jr. |
| 2016/0181802 A1 | 6/2016 | Jacobson et al. |
| 2016/0190931 A1 | 6/2016 | Zhang |
| 2016/0211841 A1 | 7/2016 | Harrison |
| 2016/0226252 A1 | 8/2016 | Kravtiz et al. |
| 2016/0226257 A1 | 8/2016 | Porter et al. |
| 2016/0241039 A1 | 8/2016 | Cheng et al. |
| 2016/0268809 A1 | 9/2016 | Ledenev et al. |
| 2016/0270245 A1 | 9/2016 | Linderman |
| 2016/0276820 A1 | 9/2016 | Olivas et al. |
| 2016/0293115 A1 | 10/2016 | Yamashita et al. |
| 2016/0329715 A1 | 11/2016 | Orr et al. |
| 2016/0336899 A1 | 11/2016 | Ledenev et al. |
| 2016/0380436 A1 | 12/2016 | Porter et al. |
| 2017/0104413 A1 | 4/2017 | Busch et al. |
| 2017/0179876 A1* | 6/2017 | Freeman .................. H02S 50/00 |
| 2017/0179886 A1* | 6/2017 | Oishi ...................... H03F 1/0277 |
| 2017/0184343 A1 | 6/2017 | Freer et al. |
| 2017/0207746 A1 | 7/2017 | Yoscovich et al. |
| 2017/0211190 A1 | 7/2017 | Glasscock et al. |
| 2017/0222542 A1 | 8/2017 | Adest et al. |
| 2017/0271879 A1 | 9/2017 | Ledenev et al. |
| 2017/0278375 A1 | 9/2017 | Galin et al. |
| 2017/0288384 A1 | 10/2017 | Loewenstern et al. |
| 2017/0331325 A1 | 11/2017 | Ristau |
| 2018/0145593 A1 | 5/2018 | Xi et al. |
| 2018/0191292 A1 | 7/2018 | Ehlmann |
| 2018/0248513 A1* | 8/2018 | Höft ....................... H01L 31/042 |
| 2019/0379279 A1 | 12/2019 | Adest et al. |
| 2020/0176937 A1* | 6/2020 | Azad ..................... H01R 13/748 |
| 2020/0279963 A1 | 9/2020 | Yoscovich et al. |
| 2020/0373841 A1 | 11/2020 | Xie et al. |
| 2021/0036557 A1* | 2/2021 | Haug ...................... H01F 27/22 |

FOREIGN PATENT DOCUMENTS

| | | |
|---|---|---|
| AU | 2009202125 A1 | 12/2009 |
| AU | 2012225199 A1 | 10/2013 |
| CA | 1183574 A | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CA | 2702392 C | 9/2015 |
| CN | 2071396 U | 2/1991 |
| CN | 1106523 A | 8/1995 |
| CN | 2284479 Y | 6/1998 |
| CN | 1188453 A | 7/1998 |
| CN | 2305016 Y | 1/1999 |
| CN | 1236213 A | 11/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 2579063 Y | 10/2003 |
| CN | 1474492 A | 2/2004 |
| CN | 1523726 A | 8/2004 |
| CN | 1551377 A | 12/2004 |
| CN | 1185782 C | 1/2005 |
| CN | 2672668 Y | 1/2005 |
| CN | 2672938 Y | 1/2005 |
| CN | 1588773 A | 3/2005 |
| CN | 1201157 C | 5/2005 |
| CN | 1614854 A | 5/2005 |
| CN | 2706955 Y | 6/2005 |
| CN | 1245795 C | 3/2006 |
| CN | 1787717 A | 6/2006 |
| CN | 1794537 A | 6/2006 |
| CN | 1838191 A | 9/2006 |
| CN | 1841254 A | 10/2006 |
| CN | 1841823 A | 10/2006 |
| CN | 1848588 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 1933315 A | 3/2007 |
| CN | 2891438 Y | 4/2007 |
| CN | 101030752 A | 9/2007 |
| CN | 101050770 A | 10/2007 |
| CN | 101107712 A | 1/2008 |
| CN | 100371843 C | 2/2008 |
| CN | 101128974 A | 2/2008 |
| CN | 101136129 A | 3/2008 |
| CN | 101180781 A | 5/2008 |
| CN | 101257221 A | 9/2008 |
| CN | 100426175 C | 10/2008 |
| CN | 201167381 Y | 12/2008 |
| CN | 201203438 Y | 3/2009 |
| CN | 100487970 C | 5/2009 |
| CN | 101488271 A | 7/2009 |
| CN | 101521459 A | 9/2009 |
| CN | 101523230 A | 9/2009 |
| CN | 101647172 A | 2/2010 |
| CN | 101672252 A | 3/2010 |
| CN | 101697462 A | 4/2010 |
| CN | 101779291 A | 7/2010 |
| CN | 101847939 A | 9/2010 |
| CN | 201601477 U | 10/2010 |
| CN | 201623478 U | 11/2010 |
| CN | 201623651 U | 11/2010 |
| CN | 101902051 A | 12/2010 |
| CN | 101904015 A | 12/2010 |
| CN | 201663167 U | 12/2010 |
| CN | 101939660 A | 1/2011 |
| CN | 101951011 A | 1/2011 |
| CN | 101951190 A | 1/2011 |
| CN | 101953051 A | 1/2011 |
| CN | 101953060 A | 1/2011 |
| CN | 101976855 A | 2/2011 |
| CN | 101976952 A | 2/2011 |
| CN | 101980409 A | 2/2011 |
| CN | 102084584 A | 6/2011 |
| CN | 102089883 A | 6/2011 |
| CN | 102117815 A | 7/2011 |
| CN | 102148584 A | 8/2011 |
| CN | 201926948 U | 8/2011 |
| CN | 201956938 U | 8/2011 |
| CN | 202034903 U | 11/2011 |
| CN | 102273039 A | 12/2011 |
| CN | 202103601 U | 1/2012 |
| CN | 102362550 A | 2/2012 |
| CN | 102386259 A | 3/2012 |
| CN | 202178274 U | 3/2012 |

(56) References Cited

FOREIGN PATENT DOCUMENTS

| | | |
|---|---|---|
| CN | 102474112 A | 5/2012 |
| CN | 102565635 A | 7/2012 |
| CN | 102771017 A | 11/2012 |
| CN | 202871823 U | 4/2013 |
| CN | 103227475 A | 7/2013 |
| CN | 103280768 A | 9/2013 |
| CN | 103299501 A | 9/2013 |
| CN | 203367304 U | 12/2013 |
| CN | 103548226 A | 1/2014 |
| CN | 103875144 A | 6/2014 |
| CN | 104143916 A | 11/2014 |
| CN | 104158482 A | 11/2014 |
| CN | 104253585 A | 12/2014 |
| CN | 104488155 A | 4/2015 |
| CN | 104685785 A | 6/2015 |
| CN | 104779636 A | 7/2015 |
| CN | 105075046 A | 11/2015 |
| CN | 105164915 A | 12/2015 |
| CN | 105490298 A | 4/2016 |
| CN | 105553422 A | 5/2016 |
| CN | 205609261 U | 9/2016 |
| CN | 106093721 A | 11/2016 |
| DE | 1161639 B | 1/1964 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 9312710 U1 | 10/1993 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19614861 A1 | 7/1997 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19859732 A1 | 6/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 102004037446 A1 | 6/2006 |
| DE | 69734495 T2 | 7/2006 |
| DE | 69735169 T2 | 8/2006 |
| DE | 102005012213 A1 | 8/2006 |
| DE | 102005018173 A1 | 10/2006 |
| DE | 20 2005 020161 U1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 202007002077 U1 | 4/2008 |
| DE | 102006060815 A1 | 6/2008 |
| DE | 602004011201 T2 | 12/2008 |
| DE | 102007051134 A1 | 3/2009 |
| DE | 202008012345 U1 | 3/2009 |
| DE | 102007037130 B3 | 4/2009 |
| DE | 102007050031 B3 | 4/2009 |
| DE | 202009007318 U1 | 8/2009 |
| DE | 102008042199 A1 | 4/2010 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| DE | 102013101314 A1 | 8/2014 |
| DE | 102013106255 A1 | 12/2014 |
| DE | 102013106808 A1 | 12/2014 |
| DE | 102016117229 A1 | 3/2018 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 0418612 A1 | 3/1991 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 653692 A2 | 5/1995 |
| EP | 0670915 A1 | 9/1995 |
| EP | 677749 A2 | 10/1995 |
| EP | 0677749 A3 | 1/1996 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 824273 A2 | 2/1998 |
| EP | 827254 A2 | 3/1998 |
| EP | 0895146 A1 | 2/1999 |
| EP | 0906660 A1 | 4/1999 |
| EP | 0947904 A2 | 10/1999 |
| EP | 0947905 A2 | 10/1999 |
| EP | 964415 A1 | 12/1999 |
| EP | 964457 A2 | 12/1999 |
| EP | 0978884 A3 | 3/2000 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1291997 A2 | 3/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1120895 A3 | 5/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |

(56) References Cited

FOREIGN PATENT DOCUMENTS

| | | |
|---|---|---|
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1642355 A2 | 4/2006 |
| EP | 0964457 A3 | 5/2006 |
| EP | 1657557 A1 | 5/2006 |
| EP | 1657797 A1 | 5/2006 |
| EP | 1684397 A2 | 7/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1734373 A2 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1837985 A2 | 9/2007 |
| EP | 1842121 A2 | 10/2007 |
| EP | 1609250 B1 | 1/2008 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 1914857 A1 | 4/2008 |
| EP | 2048679 A1 | 4/2009 |
| EP | 2054944 A2 | 5/2009 |
| EP | 2061088 A2 | 5/2009 |
| EP | 2092625 A2 | 8/2009 |
| EP | 2092631 A2 | 8/2009 |
| EP | 2130286 A1 | 12/2009 |
| EP | 2135296 A2 | 12/2009 |
| EP | 2135348 A2 | 12/2009 |
| EP | 2144133 A1 | 1/2010 |
| EP | 2179451 A1 | 4/2010 |
| EP | 2206159 A2 | 7/2010 |
| EP | 2232690 A1 | 9/2010 |
| EP | 2234237 A1 | 9/2010 |
| EP | 2249457 A1 | 11/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2386122 A2 | 11/2011 |
| EP | 2393178 A2 | 12/2011 |
| EP | 2395648 A2 | 12/2011 |
| EP | 2495766 A1 | 9/2012 |
| EP | 2515424 A2 | 10/2012 |
| EP | 2533299 A1 | 12/2012 |
| EP | 2549635 A1 | 1/2013 |
| EP | 2561596 A2 | 2/2013 |
| EP | 2581941 A2 | 4/2013 |
| EP | 2615644 A2 | 7/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| EP | 3176933 A1 | 6/2017 |
| EP | 2139104 B1 | 10/2017 |
| EP | 3252909 A1 | 12/2017 |
| ES | 2249147 A1 | 3/2006 |
| ES | 2249149 A1 | 3/2006 |
| FR | 2796216 A1 | 1/2001 |
| FR | 2819653 A1 | 7/2002 |
| FR | 2894401 A1 | 6/2007 |
| GB | 310362 A | 9/1929 |
| GB | 612859 A | 11/1948 |
| GB | 1211885 A | 11/1970 |
| GB | 1231961 A | 5/1971 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2434490 A | 7/2007 |
| GB | 2476508 A | 6/2011 |
| GB | 2480015 A | 11/2011 |
| GB | 2480015 B | 12/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | S56042365 A | 4/1981 |
| JP | S60027964 A | 2/1985 |
| JP | S60148172 A | 8/1985 |
| JP | 61065320 A | 4/1986 |
| JP | S62154121 A | 7/1987 |
| JP | S62154122 A | 7/1987 |
| JP | H01311874 | 12/1989 |
| JP | H04219982 A | 8/1992 |
| JP | H04364378 A | 12/1992 |
| JP | H05003678 A | 1/1993 |
| JP | H06035555 A | 2/1994 |
| JP | H06141261 A | 5/1994 |
| JP | H07026849 A | 1/1995 |
| JP | H07058843 A | 3/1995 |
| JP | H07-222436 A | 8/1995 |
| JP | 8009557 A | 1/1996 |
| JP | H08033347 A | 2/1996 |
| JP | H08066050 A | 3/1996 |
| JP | H0897460 A | 4/1996 |
| JP | 08138754 A | 5/1996 |
| JP | H08116628 A | 5/1996 |
| JP | H08181343 A | 7/1996 |
| JP | H08185235 A | 7/1996 |
| JP | H08204220 A | 8/1996 |
| JP | H08227324 A | 9/1996 |
| JP | H08316517 A | 11/1996 |
| JP | H08317664 A | 11/1996 |
| JP | 097644 A | 1/1997 |
| JP | H094692 A | 1/1997 |
| JP | H09097918 A | 4/1997 |
| JP | H09148611 A | 6/1997 |
| JP | H09148613 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086 A | 7/1998 |
| JP | H10201105 A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | H11332088 A | 11/1999 |
| JP | 2000020150 A | 1/2000 |
| JP | 2000051074 A | 2/2000 |
| JP | 3015512 B2 | 3/2000 |

(56) References Cited

FOREIGN PATENT DOCUMENTS

| | | |
|---|---|---|
| JP | 2000-112545 A | 4/2000 |
| JP | 2000-116010 A | 4/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 200185716 A | 3/2001 |
| JP | 2001060120 A | 3/2001 |
| JP | 2001075662 A | 3/2001 |
| JP | 2001086765 A | 3/2001 |
| JP | 2001178145 A | 6/2001 |
| JP | 2001189476 A | 7/2001 |
| JP | 2001224142 A | 8/2001 |
| JP | 2001238466 A | 8/2001 |
| JP | 2001250964 A | 9/2001 |
| JP | 2001-320827 A | 11/2001 |
| JP | 2002073184 A | 3/2002 |
| JP | 2002231578 A | 8/2002 |
| JP | 2002238246 A | 8/2002 |
| JP | 2002-262461 A | 9/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003068312 A | 3/2003 |
| JP | 2003102134 A | 4/2003 |
| JP | 2003124492 A | 4/2003 |
| JP | 2003132959 A | 5/2003 |
| JP | 2003132960 A | 5/2003 |
| JP | 2003134661 A | 5/2003 |
| JP | 2003134667 A | 5/2003 |
| JP | 2003168487 A | 6/2003 |
| JP | 2003282916 A | 10/2003 |
| JP | 2003289674 A | 10/2003 |
| JP | 3499941 B2 | 2/2004 |
| JP | 2004047279 A | 2/2004 |
| JP | 2004055603 A | 2/2004 |
| JP | 2004-096090 A | 3/2004 |
| JP | 2004111754 A | 4/2004 |
| JP | 2004-147465 A | 5/2004 |
| JP | 2004194500 A | 7/2004 |
| JP | 2004260944 A | 9/2004 |
| JP | 2004-334704 A | 11/2004 |
| JP | 2004312994 A | 11/2004 |
| JP | 2005-151662 A | 6/2005 |
| JP | 3656531 B2 | 6/2005 |
| JP | 2005192314 A | 7/2005 |
| JP | 2005-235082 A | 9/2005 |
| JP | 2005251039 A | 9/2005 |
| JP | 2005-276942 A | 10/2005 |
| JP | 2005283516 A | 10/2005 |
| JP | 2005-312287 A | 11/2005 |
| JP | 2006041440 A | 2/2006 |
| JP | 2006262619 A | 9/2006 |
| JP | 2006271083 A | 10/2006 |
| JP | 2006278755 A | 10/2006 |
| JP | 2007058845 A | 3/2007 |
| JP | 2007104872 A | 4/2007 |
| JP | 2007225625 A | 9/2007 |
| JP | 4174227 B2 | 10/2008 |
| JP | 2010-146047 A | 7/2010 |
| JP | 2010245532 A | 10/2010 |
| JP | 2011-055634 A | 3/2011 |
| JP | 2011-249790 A | 12/2011 |
| JP | 2012-60714 A | 3/2012 |
| JP | 2012511299 A | 5/2012 |
| JP | 2012178535 A | 9/2012 |
| JP | 2015-233386 A | 12/2015 |
| KR | 20010044490 A | 6/2001 |
| KR | 20030050390 A | 6/2003 |
| KR | 20040086088 A | 10/2004 |
| KR | 100468127 B1 | 1/2005 |
| KR | 200402282 Y1 | 11/2005 |
| KR | 20060060825 A | 6/2006 |
| KR | 20070036528 A | 4/2007 |
| KR | 100725755 B1 | 5/2007 |
| KR | 20080092747 A | 10/2008 |
| KR | 100912892 B1 | 8/2009 |
| KR | 101073143 B1 | 10/2011 |
| NL | 1011483 C2 | 9/2000 |
| TW | 497326 B | 8/2002 |
| TW | 200913291 A | 3/2009 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 9003680 A1 | 4/1990 |
| WO | 1992007418 A1 | 4/1992 |
| WO | 1993013587 A1 | 7/1993 |
| WO | 95/25374 A1 | 9/1995 |
| WO | 95/34121 A1 | 12/1995 |
| WO | 1996007130 A1 | 3/1996 |
| WO | 1996013093 A1 | 5/1996 |
| WO | 1998023021 A2 | 5/1998 |
| WO | 1999028801 A1 | 6/1999 |
| WO | 00/00839 A1 | 1/2000 |
| WO | 00/21178 A1 | 4/2000 |
| WO | 0042689 A1 | 7/2000 |
| WO | 0075947 A1 | 12/2000 |
| WO | 0077522 A1 | 12/2000 |
| WO | 01/13502 A1 | 2/2001 |
| WO | 01047095 A2 | 6/2001 |
| WO | 02/17469 A1 | 2/2002 |
| WO | 0231517 | 4/2002 |
| WO | 02056126 A1 | 7/2002 |
| WO | 2002073785 A1 | 9/2002 |
| WO | 0278164 | 10/2002 |
| WO | 02078164 A1 | 10/2002 |
| WO | 02093655 A1 | 11/2002 |
| WO | 03012569 A1 | 2/2003 |
| WO | 2003012569 A1 | 2/2003 |
| WO | 03/026114 A2 | 3/2003 |
| WO | 2003036688 A2 | 5/2003 |
| WO | 2003050938 A2 | 6/2003 |
| WO | 2003071655 A1 | 8/2003 |
| WO | 03084041 A1 | 10/2003 |
| WO | 2003098703 | 11/2003 |
| WO | 2004001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005036725 A1 | 4/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A1 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006033143 A1 | 3/2006 |
| WO | 2006045016 A2 | 4/2006 |

(56) References Cited

FOREIGN PATENT DOCUMENTS

| | | |
|---|---|---|
| WO | 2006/013600 A3 | 5/2006 |
| WO | 2006048688 A1 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006/125664 A1 | 11/2006 |
| WO | 2006117551 A2 | 11/2006 |
| WO | 2006130520 A2 | 12/2006 |
| WO | 2006137948 A2 | 12/2006 |
| WO | 2007006564 A2 | 1/2007 |
| WO | 2007007360 A2 | 1/2007 |
| WO | 2007010326 A1 | 1/2007 |
| WO | 2007/020419 A1 | 2/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2006124130 A9 | 10/2007 |
| WO | 2007113358 A1 | 10/2007 |
| WO | 2007124518 A1 | 11/2007 |
| WO | 2007129808 A1 | 11/2007 |
| WO | 2007142693 A2 | 12/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008069926 A3 | 8/2008 |
| WO | 2008097591 A2 | 8/2008 |
| WO | 2008119034 A1 | 10/2008 |
| WO | 2008121266 A2 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009003680 A1 | 1/2009 |
| WO | 2009006879 A2 | 1/2009 |
| WO | 2009007782 A2 | 1/2009 |
| WO | 2009011780 A2 | 1/2009 |
| WO | 2009020917 A2 | 2/2009 |
| WO | 2009/026602 A1 | 3/2009 |
| WO | 2009007782 A3 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051854 A1 | 4/2009 |
| WO | 2009051870 A1 | 4/2009 |
| WO | 2009055474 A1 | 4/2009 |
| WO | 2009/059877 A1 | 5/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072076 A2 | 6/2009 |
| WO | 2009072077 A1 | 6/2009 |
| WO | 2009073868 A1 | 6/2009 |
| WO | 2009073995 A1 | 6/2009 |
| WO | 2009075985 A2 | 6/2009 |
| WO | 2009/075985 A3 | 7/2009 |
| WO | 2009098729 A1 | 8/2009 |
| WO | 2009114341 A1 | 9/2009 |
| WO | 2009118682 A2 | 10/2009 |
| WO | 2009118683 A2 | 10/2009 |
| WO | 2009118683 A3 | 11/2009 |
| WO | 2009136358 A1 | 11/2009 |
| WO | 2009140536 A2 | 11/2009 |
| WO | 2009140539 A2 | 11/2009 |
| WO | 2009140543 A2 | 11/2009 |
| WO | 2009140551 A2 | 11/2009 |
| WO | 2009118682 A3 | 12/2009 |
| WO | 2009155392 A1 | 12/2009 |
| WO | 2010/002960 A1 | 1/2010 |
| WO | 2010/003941 A2 | 1/2010 |
| WO | 2009136358 A4 | 1/2010 |
| WO | 2009/140536 A3 | 2/2010 |
| WO | 2009/140543 A3 | 2/2010 |
| WO | 2009/140551 A3 | 2/2010 |
| WO | 2010014116 A1 | 2/2010 |
| WO | 2010020385 A2 | 2/2010 |
| WO | 2010/042124 A1 | 4/2010 |
| WO | 2010037393 A1 | 4/2010 |
| WO | 2010056777 A1 | 5/2010 |
| WO | 2010/071855 A2 | 6/2010 |
| WO | 2010062410 A1 | 6/2010 |
| WO | 2010062662 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010118503 A1 | 10/2010 |
| WO | 2010120315 A1 | 10/2010 |
| WO | 2010/132369 A1 | 11/2010 |
| WO | 2010134057 A1 | 11/2010 |
| WO | 20100134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011019936 A1 | 2/2011 |
| WO | 2011023732 A2 | 3/2011 |
| WO | 2011028456 A2 | 3/2011 |
| WO | 2011028457 A2 | 3/2011 |
| WO | 2011044641 A1 | 4/2011 |
| WO | 2011049985 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011109746 A2 | 9/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2012024538 A3 | 5/2012 |
| WO | 2012100263 A2 | 7/2012 |
| WO | 2013015921 A1 | 1/2013 |
| WO | 2013019899 A2 | 2/2013 |
| WO | 2013130563 A1 | 9/2013 |
| WO | 2014143021 A1 | 9/2014 |
| WO | 2017/125375 A1 | 7/2017 |
| WO | 2018122835 A1 | 7/2018 |

OTHER PUBLICATIONS

QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. Oh Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

(56) References Cited

OTHER PUBLICATIONS

Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), dated Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximum Power Point Enabling Converters", School of Information Technology and Electrical Engineering the University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Illic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1 pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International the Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—dated Nov. 8, 2012.
Gwon-Jong Yu et al: "Maximum power point tracking with temperature compensation of photovoltaic for air conditioning system with fuzzy controller", May 13, 1996; May 13, 1996-May 17, 1996, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", Jose Rodriguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.
"Micropower Synchronous Buck-Boost DC/DC Converter"—Linear Technology Corporation—www.linear.com/LTC3440—2001.
Mar. 5-9, 1995—Caricchi, F. et al.—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIt Bombay, Apr. 2006.
Jun. 20-25, 2004—Viswanathan, K. et al—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation—www.linear.com/LTC3780—2005.
May 19-24, 2002—Chomsuwan, Komkrit et al. "Photovoltaic Grid-Connected Inverter Using Two-Switch Buck-Boost Converter"—Department of Electrical Engineering, King Mongkut's Institute of

(56) References Cited

OTHER PUBLICATIONS

Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.
Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—dated Nov. 29, 2016.
Mar. 8, 2003—Vishay Siliconix "Si 7884DP—n-Channel 40-V (D-S) MOSFET" (2003).
Chinese Office Action—CN 201510423458.2—dated Jan. 3, 2017 (english translation provided).
Chinese Office Action—CN 201410098154.9—dated Mar. 3, 2017 (english translation provided).
European Search Report—EP Appl. 13150911.9—dated Apr. 7, 2017.
Howard et al, "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et al—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP 2374190—EP App No. 08878650.4.
Sep. 28, 2017—European Office Action—EP 08857835.6.
Nov. 2, 2017—EP Search Report App No. 13157876.7.
Nov. 11, 2017—EP Search Report—App No. 17171489.2.
Dec. 14, 2017—EP Search Report App No. 17188362.2.
Dec. 15, 2017—EP Search Report App No. 17188365.5.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Electrical Engineering and Computer Science Dissertation; 8 pages.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
2006; Esmaili, Gholamreza; "Application of Advanced Power Electomics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.
May 1, 2000; Kroposki, H. Thomas and Witt, B & C; "Progress in Photovoltaic Components and Systems," National Renewable Energy Laboratory; NREL-CP-520-27460; 7 pages.

Jan. 22-23, 1998 Oldenkamp, H. et al; "AC Modules: Past, Present and Future" Workshop Installing the Solar Solution; Hatfield, UK; 6 pages.
Linear Technology Specification Sheet, LTC3443—"High Current Micropower 600kHz Synchronous Buck-Boost DC/DC Converter"—2004.
Linear Technology Specification Sheet, LTC3780—"High Efficiency Synchronous, 4-Switch Buck-Boost Controller"—2005.
Apr. 22, 2004—MICREL—MIC2182 High Efficiency Synchronous Buck Controller.
Apr. 1972—Methods for Utilizing Maximum Power From a Solar Array—Decker, DK.
2000—Evaluating MPPT converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu; "A Novel Power Converter for PHotovoltaic Applications," Journal of Power Sources; vol. 135, No. 1-2, pp. 327-331.
Jun. 1998—Stem M., et al., "Development of a Low-Cost Integrated 20-kW-AC Solar Tracking Subarray for Grid-Connected PV Power System Applications—Final Technical Report"—National Renewable Energy Laboratory; 41 pages.
1997; Verhoeve, C.W.G., et al., "Recent Test Results of AC_Module inverters," Netherlands Energy Research Foundation ECN, 1997; 3 pages.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques"—Applied Power Electronics Conference and Exposition, 1992. APEC '92. Conference Proceedings 1992., Seventh Annual.
Mar. 3, 2021—EP Office Action—EP 17188365.5.
International Search Report for corresponding PCT/GB2004/001965, completed Aug. 16, 2004 by A. Roider.
Mar. 5-9, 1995—Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filing date May 27, 2004.

(56) References Cited

OTHER PUBLICATIONS

Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filing date May 27, 2004—dated Jan. 19, 2005.
Written Opinion of the International Searching Authority—PCT/US2004/016668, form PCT/ISA/220—filing date May 27, 2004—dated Jan. 19, 2005.
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. No. 13/785,857—dated Jun. 6, 2013.
European Office Action—EP Appl. 09725443.7—dated Aug. 18, 2015.
Definition of Isomorphism by Merriam-Webster, <http://www.merriaum-webster.com/dictionary/isomorphism, dated Oct. 20,2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Nov. 2, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009,. In counteprart PCT/US2008/008451, 13 pages.
European Search Report: dated Jan. 10, 2013 in corresponding EP application No. 09838022.3, 7 pages.
D. Ton and W. Bower; Summary Report of the DOE High-Tech InverterWorkshop; Jan. 2005.
First Action Interview Pre-Interview Communication from U.S. Appl. No. 13/174,495 dated Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Aug. 6, 2007—Philippe Welter, et al. "Electricity at 32 kHz," Photon International, The Photovoltaic Magazine, Http://www.photon-magazine.com/archiv/articles.aspx?criteria=4&HeftNr=0807&Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al., "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.

European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"—"Let there be Darkness: Quality control of Solar Modules in Case of Fire"; PHOTON, May 2005, 75-77, ISSN 1430-5348, English translation provided.
Chinese Office Action—CN Appl. 201380029450.7—dated Jul. 28, 2016.
Jan. 1, 2005; Linear Technology Specification Sheet, LTC3780—"High Efficiency Synchronous, 4-Switch Buck-Boost Controller".
Dec. 19, 2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
Jan. 29, 2019—European Search Report for EP App No. 18199117.5.
Jul. 12, 2019—European Search Report—EP 19170538.3.
Sep. 4, 2019—Extended European Search Report—EP 19181247.8.
Aug. 6, 2019—Notice of Opposition of European Patent 2232663—Fronius International GmbH.
Sep. 5, 2019—Notice of Opposition of European Patent 2549635—Huawei Technologies Co.
Sep. 5, 2019—Notice of Opposition of European Patent 2549635—Fronius International GmbH.
Solide Arbeit, Heinz Neuenstein, Dec. 2007.
Spitzenwirkungsgrad mit drei Spitzen, Heinz Neuenstien and Andreas Schlumberger, Jan. 2007.
Technical Information, Temperature Derating for Sunny Boy, Sunny Mini Central, Sunny Tripower, Aug. 9, 2019.
Prinout from Energy Matters online Forum, Jul. 2011.
Wayback Machine Query for Energy Matters Online Forum Jul. 2011.
Nov. 27, 2019—European Search Report—3567562.
Baocheng, DC to AC Inverter with Improved One Cycle Control, 2003.
Brekken, Utility-Connected Power Converter for Maximizing Power Transfer From a Photovoltaic Source While Drawing Ripple-Free Current, 2002.
Cramer, Modulorientierter Stromrichter Geht In Serienfertigung, SPVSE, 1994.
Cramer, Modulorientierter Stromrichter, Juelich, Dec. 31, 1995.
Cramer, String-Wechselrichter Machen Solarstrom Billiger, Elektronik, Sep. 1996.
Dehbonei, A Combined Voltage Controlled and Current Controlled "Dual Converter" for a Weak Grid Connected Photovoltaic System with Battery Energy Storage, 2002.
Engler, Begleitende Untersuchungen zur Entwicklung eines Multi-String-Wechselrichters, SPVSE, Mar. 2002.
Geipel, Untersuchungen zur Entwicklung modulorientierter Stromrichter Modulorientierter Stromrichter für netzgekoppelte Photovoltaik-Anlagen, SPVSE, 1995.
Hoor, DSP-Based Stable Control Loops Design for a Single Stage Inverter, 2006.
Isoda, Battery Charging Characteristics in Small Scaled Photovoltaic System Using Resonant DC-DC Converter With Electric Isolation, 1990.
Jones, Communication Over Aircraft Power lines, Dec. 2006/ Jan. 2007.
Kalaivani, A Novel Control Strategy for the Boost DC-AC Inverter, 2006.
Lee, Powering The Dream, IET Computing & Control Engineering, Dec. 2006/ Jan. 2007.
Lee, A Novel Topology for Photovoltaic Series Connected DC/DC Converter with High Efficiency Under Wide Load Range, Jun. 2007.
Lin, LLC DC/DC Resonant Converter with PLL Control Scheme, 2007.
Niebauer, Solarenergie Optimal Nutzen, Stromversorgung, Elektronik, 1996.
Rodrigues, Experimental Study of Switched Modular Series Connected DC-DC Converters, 2001.

(56) References Cited

OTHER PUBLICATIONS

Sanchis, Buck-Boost DC-AC Inverter: Proposal for a New Control Strategy, 2004.
Sen, A New DC-to-AC Inverter With Dynamic Robust Performance, 1998.
Shaojun, Research on a Novel Inverter Based on DC/DC Converter Topology, 2003.
Siri, Sequentially Controlled Distributed Solar-Array Power System with Maximum Power Tracking, 2004.
Walko, Poised for Power, IEE Power Engineer, Feb./ Mar. 2005.
White, Electrical Isolation Requirements in Power-Over-Ethernet (PoE) Power Sourcing Equipment (PSE), 2006.
Yu, Power Conversion and Control Methods for Renewable Energy Sources, May 2005.
Zacharias, Modularisierung in der PV-Systemtechnik-Schnittstellen zur Standardisierung der Komponenten, Institut für Solare Energieversorgungstechnik (ISET), 1996.
Dec. 24, 2019—CN Office Action—CN Application 201610946835.5.
Jan. 30, 2020—EP Office Action—EP 18204177.2.
Feb. 3, 2020—Chinese Office Action—201710749388.9.
Mar. 24, 2020—Non-Final Rejection—U.S. Appl. No. 15/593,761.
Apr. 20, 2020—European Search Report—EP 20151729.9.
Apr. 23, 2020—European Search Report—EP 19217486.0.
May 12, 2020—Extended European Search Report—EP 20161381.7.
Jul. 8, 2020—CN Office Action—CN 201710362679.2.
Sep. 17, 2020—Extended European Search Report—EP Application 20176744.9.
Oct. 12, 2020—CN Office Action—CN 201610946835.5.
Nov. 12, 2020—Preliminary Opinion by EPO—EP 12188944.8.
Mar. 4-8, 2001—Andersen Gert, et al.,—Aalborg University, Institute of Energy Technology, Denmark—"Currect Programmed Control of a Single Phase Two-Switch Buck-Boost Power Factor Correction Circut"—Applied Power Electronics Conference and Exposition, 2001. APEC 2001. Sixteenth Annual IEEE.
Feb. 22-26, 2004—Andersen, Gert et al.,—"Utilizing the free running Current Programmed Control as a Power Factor Correction Technique for the two switch Buck-Boost converter"—Applied Power Electronic Conference and Exposition, 2004. APEC '04. Nineteenth Annual IEEE.
Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.
Feb. 15-19, 1998—Caricchi, F et al.,—"Study of Bi-Directional Buck-Boost Converter Topologies for Application in Electrical Vehicle Motor Drives"—Applied Power Electronics Conference and Exposition, 1998, APEC '98. COnference Proeedings 1998., Thirteenth Annual IEEE.
Nov. 27-30, 1990—Ensling, JHR—"Maximum Power Point Tracking: A Cost Saving Necessity in Solar Energy Systems"—Industrial Electomics Society, 1990. IECON '90., 16th Annual Conference of IEEE.
Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.
Feb. 15-19, 1998—Hua, et al., - "Comparative Study of Peak Power Tracking Techniques for Solar Storage System"—Applied POwer Electronics Conference and Exposition, 1998. APEC'98. Conferenced Proceedings 1998., Thirteenth Annual IEEE.
Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1993. PESC '93 Record., 24th Annual IEEE.

May 19-24, 2002—Bower et at.,—"Certification of Photovoltaic Inverters: The Initial Step Toward PV System Certification"—Photovoltaic Specialists Conferences, 2002 Conference Record of the Twenty-Ninth IEEE.
Jun. 17-21, 2001—Tse et al., "A Novel Maximum Power Point Tracking Technique for PV Panels"—Power Electronics Specialists Conferences, 2001. PESC. 2001 IEEE 32nd Annual.
May 12-18, 2008—Cuadras et al., "Smart Interfaces for Low Power Energy Harvesting Systems"—Instrumentation and Measurement Technology Conferences Proceedings, 2008. IMTC 2008. IEEE.
Dec. 5-9, 1994—Haan, et al.," Test Results of a 130 W AC Module; a modular solar as power station"—Photovoltaic Energy Conversion 1994. Conference Record of the Twenty Fourth. IEEE Phtovoltaic Specialists Conference—1994.
Sep. 1-3, 2008—Jung, et al., "Soft Switching Boost Converter for Photovoltaic Power Generation System"—Power Electronics and Motion Control Conference, 2008. EPE-PEMC 2008.
Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).
Oct. 8-12, 2000 Hashimoto, et al., "A Novel High Peforamance Utility Interactive Photovoltain Inverter System"—Industry Applications Conference, 2000. Conference Record of the 2000 IEEE.
Feb. 22-26, 2004—Ho, et al., "An Integrated Inverter with Maximum Power Tracking for Grid-Connected PV Systems"—Applied Power Electronics Conference and Exposition, 2004. APEC '04. Nineteenth Annual IEEE.
Nov. 14, 1997, Hua et al., "Control of DC/DC Converters for Solar Energy System with Maximum Power Tracking"—Industrial Electronics, Control and Instrumentation, 1997. IECON 97. 23rd International Conference on Industrial Electronics, Control and Instrumentation vol. 4 of 4.
Sep. 1-3, 2008, Lee et al., "Soft Switching Mutli-Phase Boost Converter for Photovoltaic System"—Power Electronics and Motnion Control Conference, 2008. EPE-PEMC 2008.
Jul. 5, 2005, Yao et al., "Tapped-Inductor Buck Converter for High-Step-Down DC-DC Conversion" IEEE Transactions on Power Electronics (vol. 20, Issue 4, Jul. 2005).
Sep. 21-23, 1998, Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).
May 25, 2000—Hong Lim, et al., "Simple Maximum Power Point Tracker for Photovoltaic Arrays"—Electronics Letters (vol. 36, Issue 11, May 25, 2000).
Aug. 14-16, 2004, Nishida et al., "A Novel Type of Utility-Interactive Inverter for Phtovoltaic System"—Power Electronics and Mtion Control Conference, 2004. IPEMC 2004.
May 30-Jun. 3, 2011, Jung, et al., "DC-Link Ripple Reduction of Series-connected Module Integrated Converter for Photovoltaic Systems"—Power Electronics and ECCE Asia (ICPE & ECCE).
Jan. 8, 2007, Li et al., "An Analysis of ZVS Two-Inductor Boost Converter under Variable Frequency Operation"—IEEE Transactions on Power Electronics (vol. 22, Issue 1, Jan. 2007).
Sep. 17, 2007, Rodriguez et al., "Analytic Solution to the Photovoltaic Maximum Power Point Problem"—IEEE Transactions on Circuits and Systems I: Regular Papers (vol. 54, Issue 9, Sep. 2007).
Jun. 27, 1997, Reimann et al., "A Novel Control Principle of Bi-Directional DC-DC Power Conversion"—Powre Electronics Specialists Conference 1997. PESC '97 Record.
Sep. 15-22, 2000, Russell et al., "The Massachusetts Electric Solar Project a Pilot Project to Commercialize Residential PV Systems"—Photovoltaic Specialists Conference, 2000, Conference Record of the Twenty-Eighth IEEE Photovoltaic Specialists Conference—2000.
May 2001, Shimizu et al., "Generation Control Circuit for Photvoltaic Modules"—IEEE Transactions of Power Electronics (vol. 16, Issue 3, May 2001).
Feb. 6-10, 2000, Siri, Kasemsan "Study of System Instability in Current-Mode Converter Power Systems Operating in Solar Array

(56) References Cited

OTHER PUBLICATIONS

Voltage Regulation Mode"—Applied Power Electronics Conference and Exposition, 2000. APEC 2000. Fiftheenth Annual IEEE.
Aug. 13-16, 1990—Rajan, Anita "A Maximum Power Point Tracker Optimized for Solar Powered Cars"—Future Transportation Technology Conference and Expostion.
Jul. 10, 1995—"Battery I.D. chip from Dallas Semiconductor monitors and reports battery pack temperature"—Business Nire.
Nov. 3, 1999—Takahashi et al., "Development of a Long-Life Three-Phase Flywheel UPS Using an Electrolytic Capacitorless Converter/Inverter"—Electrical Engineering in Japan, vol. 127.
Jan. 2001—Walker, Geoffrey "Evaluating MPPT Converter Topologies Using a Matlab PV Model"—"Journal of Electrical and Electronics Engineering, Australia".
Feb. 13, 2007—Roman et al., "Experimental Results of Controlled PV Module for Building Integrated PV Systems"—Solar Energy 82 (2008) 471-480.
2006—Bower et al., "Innovative PV Micro-Inverter Topology Eliminates Electrolytic Capacitors for Longer Lifetime"—IEEE 1-4244-0016-3/06/ pp. 2038-2041.
Aug. 23-27, 1993—Case et al., "A Minimum Component Photovoltaic Array Maximum Power Point Tracker"—European Space Power Conference vol. 1. Power Systems, Power Electronics.
Jun. 4, 1997—Maranda et al., "Optimization of the Master-Slave Inverter System for Grid-Connected Photovoltaic Plants"—Energy Convers Mgmt. vol. 39, No. 12 pp. 1239-1246.
2005—Kang et al., "Photovoltaic Power Interface Circuit Incorporated with a Buck-Boost Converter and a Full-Bridge Inverter"—Applied Energy 82, pp. 266-283.
Nov. 21, 1997—Feuermann et al., "Reversable Low Soalr Heat Gain Windows for Energy Savings"—Solar Energy vol. 32, No. 3 pp. 169-175.
May 16, 2005—Enrique et al., "Theoretical assessment of the maximum power point tracking efficiency of photovoltaic facilities with different converter topologies"—Solar Energy 81 (2007) p. 31-38.
Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3wVXuAAACAAJ.
Korean Patent Application No. 102005-7008700, filed May 13, 2015. Applicant: Exar Corporation.
Jan. 23, 2018—EP Search Report, EP App No. 17187230.2.
Apr. 16, 2018—EP Examination Report 12707899.6.
Aug. 9, 2010, Hong, Wei, et al., "Charge Equalization of Battery POwer Modules in Series" The 2010 International Power Electronics Conference, IEEE, p. 1568-1572.
Jun. 6, 2018—EP Search Report EP App No. 18151594.1.
Jun. 29, 2018—EP Search Report—EP App No. 18175980.4.
Jun. 29, 2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Oct. 3-7, 2004; Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
PV Balancers: Concept, Architectures, and Realization—Huimmin Zhou—IEEE Transactions on Power Electronics vol. 30 No. 7—Jul. 7, 2015.
Zhao Junjian & al.: "Analysis of high efficiency DC/DC converter processing partial input/output power", 14th Workshop on Control and Modeling for Power Electronics, Jun. 23, 2013 (Jun. 23, 2013), DOI: 10.1109/COMPEL.2013.6626440.
Apr. 14, 2021—European Summons to Oral Proceedings—EP 17724234.4.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Facade with 100 W AC Photovoltaic Modules", 1996 IEEE, 25th PVSC, May 13-17, 1996, pp. 1235-1238, Washington, DC.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769 773.
Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.
Jun. 20-25, 2004—Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.

(56) References Cited

OTHER PUBLICATIONS

Jun. 17-21, 2007—Palma, "A Modular Fuel Cell, Modular DC-DC Converter Concept for High Performance and Enhanced Reliability", IEEE 2007, pp. 2633-2638.
Sep. 16-19, 1996—Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Oct. 3-7, 1999—Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Sep. 15-22, 2000—Stamenic, et al., "Maximum Power Point Tracking for Building Integrated Photovoltaic Ventilation Systems".
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and the National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
May 7, 2021—Chinese Office Action—CN 20181025083.8.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.

Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
May 22, 1998—Cheng K.W.E., "New Generation of Switched Capacitor Converters", Department of Electrical Engineering, The Hong Kong Polytechnic University, Hung Hom, Hong Kong, Power Electronics Conference, PESC 98.
1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Nov. 27-30, 2007—Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J .A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
May 22, 1998—Chihchiang Hua and Chihming Shen, "Study of Maximum Power Tracking Techniques and Control of DC/DC Converters for Photovoltaic Power System", IEEE.
Tore Skjellnes et al., "Load sharing for parallel inverters without communication", Nordic Workshop in Power and Industrial Electronics, Aug. 12-14, 2002.
Jun. 23, 2000—Giorgio Spiazzi at el., "A New Family of Zero-Current-Switching Variable Frequency dc-dc Converters", IEEE.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Jul. 16-20, 2000—Nayar, C.V., abstract, Power Engineering Society Summer Meeting, 2000. IEEE, 2000, pp. 1280-1282 vol. 2.
Mar. 15, 2004—D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automatica /12 a Sep. 16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Yomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http: jscholar.lib.vt.edu/theses/available/etd-012299-165108/unrestricted/THESIS. PDF, [retrieved on Mar. 5, 2013].

(56) References Cited

OTHER PUBLICATIONS

Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller for Medium to Large Scale Photovoltaic Generating Plant"8<SUP>th </SUP> European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Multiple-input DC-DC Converter" 20<SUP>th</SUP> International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON 22<SUP>nd</SUP> International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,Uk cited in the application.
Basso, Tim, "IEEE Standard for Interconnecting Distributed Resources With the Electric Power System," IEEE PES Meeting, Jun. 9, 2004.
Feb. 11, 2003—Boostbuck.com, "The Four Boostbuck Topologies," located at http://www.boostbuck.com/TheFourTopologies.html.
Apr. 2002—Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Jan. 1, 1993—Definition of "remove" from Webster's Third New International Dictionary, Unabridged, 1993.
Jan. 1, 1993—Definition of "removable" from Webster's Third New International Dictionary, Unabridged, 1993.

Advanced Energy Group, "The Basics of Solar Power Systems," located at http://web.archive.org/web/2001 0331044156/http://www.solar4power.com/solar-power-basics.html, Mar. 31, 2001.
International Patent Application No. PCT/AU2005/001017, International Search Report and Written Opinion, dated Aug. 18, 2005.
Jaek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Dec. 31, 2020—CN Invalidation Decision—CN 200780045351.2.
Dec. 31, 2020—CN Invalidation Decision—CN 201210253614.1.
Storfer, Lior, "Enhancing Cable Modem TCP Performance," Texas Instruments Inc. white paper, Jul. 2003.
Philips Semiconductors, Data Sheet PSMN005-55B; PSMN005-55P N-channel logic trenchMOS transistor, Oct. 1999, Product specification, pp. 1-11.
International Preliminary Report on Patentability Issued in corresponding international application No. PCT/US04/16668, filed May 27, 2004.
International Application No. PCT/US13/27965, International Preliminary Examination Report, dated Sep. 2, 2014.
International Patent Application PCT/US13/027965, International Search Report and Written Opinion, dated Jun. 2, 2013.
International Application No. PCT/US12/44045, International Preliminary Examination Report, dated Jan. 28, 2014.
International Patent Application No. PCT/US2012/044045, International Search Report and Written Opinion, dated Jan. 2, 2013.
International Patent Application No. PCT/US2009/047734, International Search Report and Written Opinion, dated May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, dated Oct. 27, 2010.
Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.
International Patent Application No. PCT/US2011/020591, International Search Report and Written Opinion, dated Aug. 8, 2011.
International Patent Application No. PCT/US2011/033544, International Search Report and Written Opinion, dated Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, dated Jun. 24, 2009.
International Patent Application No. PCT/US2010/046274 International Search Report and Written Opinion, dated Apr. 22, 2011.
International Patent Application No. PCT/US2011/033658, International Search Report and Written Opinion, dated Jan. 13, 2012.
International Patent Application No. PCT/US2011/029392, International Search Report and Written Opinion, dated Oct. 24, 2011.
European Patent Application No. 09829487.9, Extended Search Report, dated Apr. 21, 2011.
International Patent Application No. PCT/US2009/062536, International Search Report and Written Opinion, dated Jun. 17, 2010.
International Patent Application No. PCT/US2010/022915, International Search Report and Written Opinion, dated Aug. 23, 2010.
International Patent Application No. PCT/US2010/046272, International Search Report and Written Opinion, dated Mar. 31, 2011.

(56) References Cited

OTHER PUBLICATIONS

Exell et al., "The Design and Development of a Solar Powered Refrigerator", [retrieved on Feb. 13, 2013], Retrieved from the Internet <URL: http://www.appropedia.org/The_Design_and_Development_of_a_Solar_Powered_Refrigerator>, pp. 1-64.

"Development of Water-Lithium Bromide Low-Temperature Absorption Refridgerating Machine", 2002 Energy & Environment on Database on Noteworthy contributions for Science and Technology (Japan), Research Data (No. 1748) [online], [retrieved on Aug. 29, 2012]. Retrieved from the Internet: <URL: http://dbnstl.nii.ac.jp/english/detail/1748>, pp. 1-4.

Dictionary.com, "air conditioning" [online], [retrieved on Aug. 28, 2012], Retrieved from the Internet: <URL: http://dictionary.reference.com/browse/air+conditioning?s=t>, pp. 1-3.

International Patent Application No. PCT/US2010/029936, International Search Report and Written Opinion, dated Nov. 12, 2010.

International Patent Application No. PCT/US08/75127, International Search Report and Written Opinion, dated Apr. 28, 2009.

International Patent Application No. PCT/US09/35890, International Search Report and Written Opinion, dated Oct. 1, 2009.

European Patent Application No. 08845104.2, Extended Search Report, dated Jul. 31, 2014.

European Patent Application No. 11772811.3, Extended Search Report, dated Dec. 15, 2014.

International Patent Application No. PCT/US2008/082935, International Search Report and Written Opinion, dated Jun. 25, 2009.

Bhatnagar et al., Silicon Carbide High Voltage (400 V) Shottky Barrier Diodes, IEEE Electron Device Letters, vol. 13 (10) p. 501-503 Oct. 10, 1992.

Jun. 6-10, 2004—Rodriguez, C., and G. A. J. Amaratunga. "Dynamic stability of grid-connected photovoltaic systems." Power Engineering Society General Meeting, 2004. IEEE, pp. 2194-2200.

Nov. 3-Dec. 29, 1999—Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.

Oct. 7-12, 1990—Nonaka, Sakutaro, et al. "Interconnection system with single phase IGBT PWM CSI between photovoltaic arrays and the utility line." Industry Applications Society Annual Meeting, 1990., Conference Record of the 1990 IEEE.

Jun. 23-27, 2002—Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.

Jul. 1999—Marra, Enes Goncalves, and Jose Antenor Pomilio. "Self-excited induction generator controlled by a VS-PWM bidirectional converter for rural applications" Industry Applications, IEEE Transactions on 35.4 (1999): 877-883.

Apr. 2-5, 2002—Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No 02TH8579) IEEE-Piscataway, NJ, USA, ISBN 0-7803-7156-9, vol. 2, p. 822-826, XP010590259: the whole document.

International Search Report for corresponding PCT/GB2005/050198 completed Jun. 28, 2006 by C. Wirner of the EPO.

Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.

Cordonnier, Charles-Edouard, et al., "Application Considerations for Sensefet Power Devices," PCI Proceedings, May 11, 1987, pp. 47-65.

Jun. 9-11, 2003—Kotsopoulos, Andrew, et al., "Predictive DC Voltage Control of Single-Phase PV Inverters with Small DC Link Capacitance," IEEE International Symposium, Month Unknown, 2003, pp. 793-797.

Meinhardt, Mike, et al., "Multi-String-Converter with Reduced Specific Costs and Enhanced Functionality," Solar Energy, May 21, 2001, pp. 217-227, vol. 69, Elsevier Science Ltd.

Mar. 6-10, 2005—Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.

Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.

International Search Report for corresponding PCT/GB2005/050197, completed Dec. 20, 2005 by K-R Zettler of the EPO.

Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.

Jun. 23-27, 2002—Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference 2002, pp. 1483-1488, vol. 3, IEEE.

Written Opinion of PCT/GB2005/050197, dated Feb. 14, 2006 (dated), Enecsys Limited.

Jun. 17-21, 2001—Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.

Jun. 21, 2021—Japanese Office Action—JP 2017-158887.

Dec. 16, 2021—EP Office Action—EP App. No. 19178054.3.

Noguchi, Short-Current Pulse-Based Maximum-Power-Point Tracking Method for Multiple Photovoltaic-and-Converter Module System, IECON, Feb. 2002.

Siri, Maximum Power Tracking in Parallel Connected Converters, IEEE, Jul. 1993.

Solero, Performance of a 10 kW Power Electronic Interface for Combined Wind/PV Isolated Generating Systems, PESC, 1996.

Wu, An Improved Dynamic Power Distribution Control Scheme for Pwm Controlled Converter Modules, IEFF, 1992.

Jun. 30, 2022—Extended EP Search Report—EP App. No. 22150308.9.

Oct. 5, 2023—European Search Report—EP App. No. 23180721.5.

Dec. 12, 2023—Japanese Office Action—JP App. No. 2020-004452.

* cited by examiner

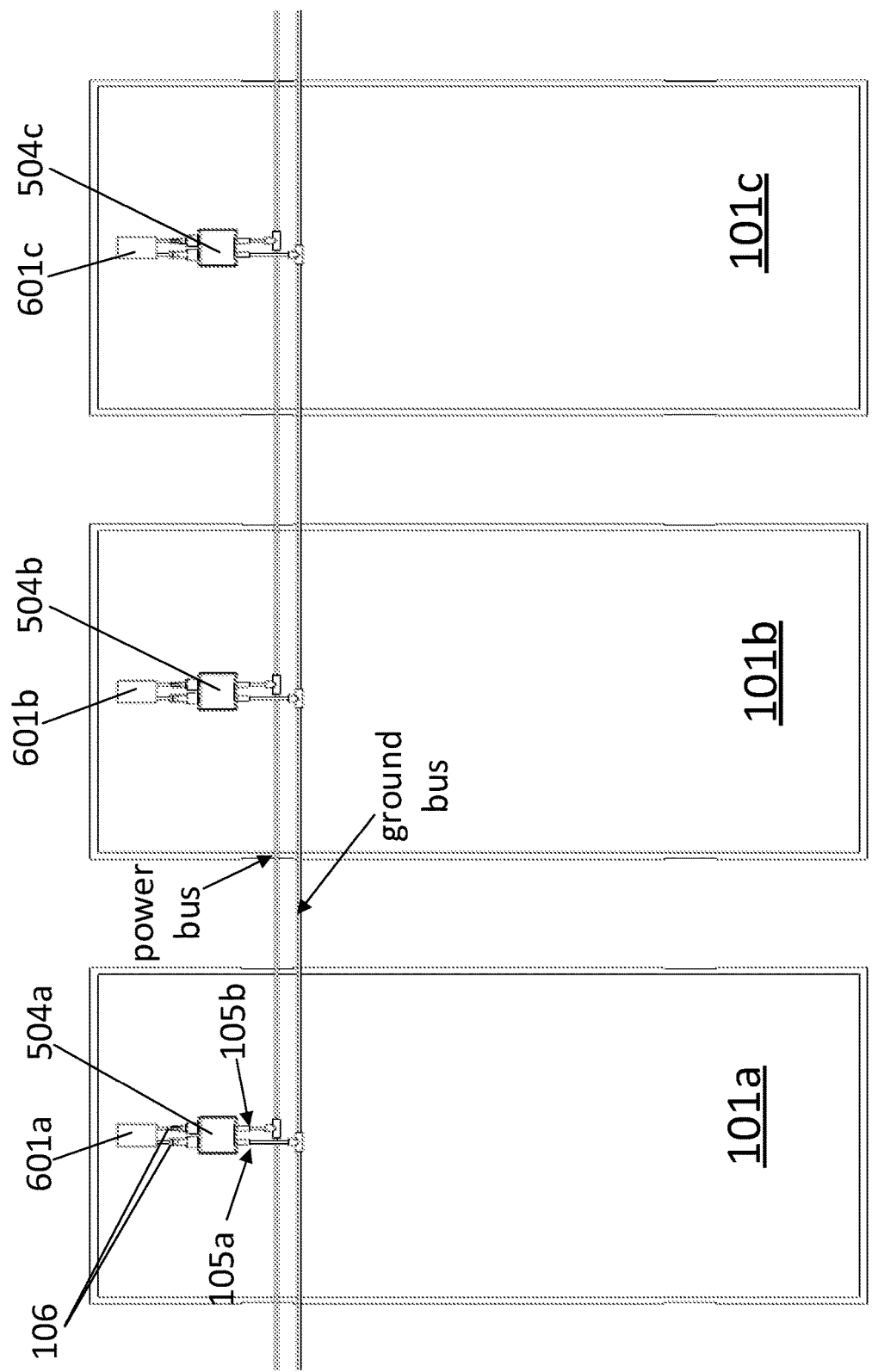

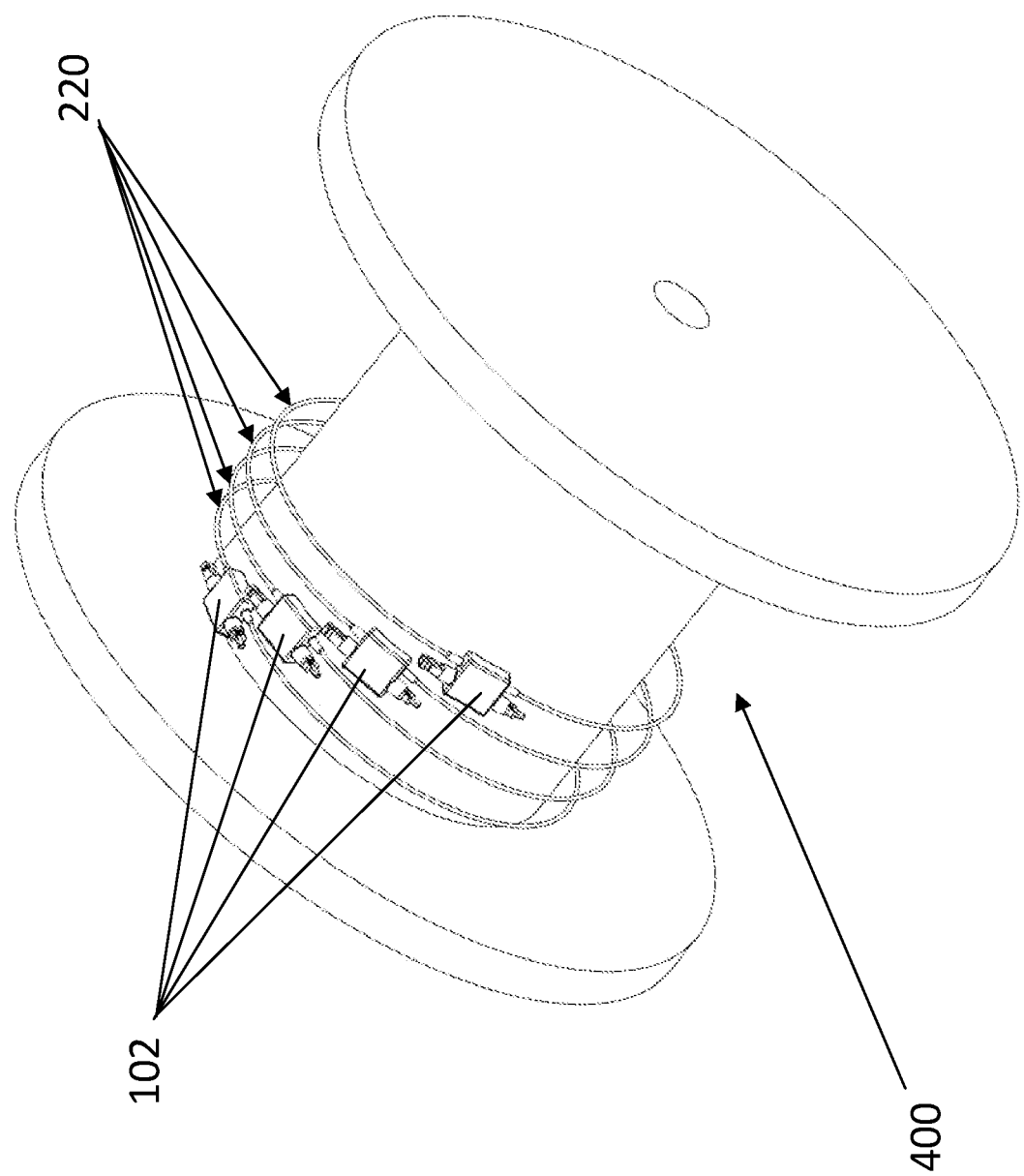

CHAIN OF POWER DEVICES

CROSS REFERENCE TO RELATED APPLICATIONS

This application claims the benefit and is a continuation-in-part of U.S. application Ser. No. 15/593,761 filed May 12, 2017. This application further claims benefit and is a continuation-in-part of U.S. application Ser. No. 15/478,526 filed Apr. 4, 2017, and claims benefit to U.S. Provisional Patent Application No. 62/318,303 filed Apr. 5, 2016, U.S. Provisional Patent Application No. 62/341,147 filed May 25, 2016, and U.S. Provisional Patent Application No. 62/395,461 filed Sep. 16, 2016. The contents of the above identified applications are incorporated herein by reference in their entireties.

BACKGROUND

Power devices may be electrically coupled or electrically connected to photovoltaic (PV) generators and configured to set the operating point of the generators to generate maximum power. They may also be coupled to power production and/or storage units such as batteries, wind or hydroelectric turbines and the like.

Power devices are often manufactured, packaged and sold as single units, leading to deployment which requires that each device be individually coupled to its power unit and the devices themselves coupled by connecting electric cables between them.

Accordingly, there is a need for power device systems in which costs, time and complexity in deploying the power devices are reduced.

SUMMARY

The following summary is a short summary of some of the inventive concepts for illustrative purposes only, and is not intended to limit or constrain the inventions and examples in the detailed description. One skilled in the art will recognize other novel combinations and features from the detailed description.

Variations herein may employ a string of photovoltaic power devices (e.g. DC/DC converters, DC/AC inverters, measuring and monitoring devices) which may be deployed in photovoltaic installations. In some variations discussed herein, conductors may be used to couple power devices to one another during manufacturing to form a chain of power devices, with the chain packaged and sold as a single unit. A single chain or string of power devices may have power devices alternating with conductors so that each pair of adjacent power devices are permanently connected (e.g., prefabricated, designed to not be disconnected in the field during installation of the system, bonded by soldering or crimping, etc.) with a different one of the conductors. The chain may be deployed by coupling the power devices in the chain to photovoltaic (PV) generators (e.g. one or more photovoltaic cells, substrings, PV panels, strings of PV panels and/or PV shingles). The coupling of power devices at the time of manufacturing may reduce costs and enable compact storage of the devices, and the easy deployment may reduce installation time. Connecting power devices at the time of manufacturing may include directly connecting conductors (e.g. by soldering or screwing the conductors into place within a power device enclosure) between adjacent power devices. Furthermore, preconnecting power devices with cables permanently connected may reduce the number of connectors (e.g. MC4™ connectors) featured in each power device from four connectors to two connectors (retaining the two connectors for connecting to a PV generator at the power device input terminal but removing the two connectors for connecting between power devices at the power device output). As connectors may be costly components, substantial savings may be realized. Additionally, preconnecting power devices during manufacturing may increase system safety. For example, if improperly connected, connection points between power devices may be susceptible to overheating, arcing and/or other unsafe event which may result in fire. Preconnecting power devices during manufacturing without use of connectors may increase system safety by reducing the number of connection points from four per power device to two per power device.

Certain variations of power-circuit chains may be wound around a storage spool similar to spools used for storing electrical cables, and deployed in photovoltaic installations by unrolling the spool and coupling the power devices to photovoltaic generators as the power devices are unwound from the spool.

In some variations of power-circuit chains, a distance between adjacent power devices may correspond to an estimated distance between photovoltaic generator junction boxes in a photovoltaic installation, to enable adjacent power devices in the power-circuit chain to be coupled to adjacent photovoltaic generators. In some variations, more than one photovoltaic generator may be coupled to each power device. For example, in some solar installations, two PV generators may be coupled in series and the two generators may then be coupled to one power device, in which case the length between adjacent power devices may be about double the distance between adjacent generators.

The photovoltaic power devices may include, but are not limited to, DC/DC converters, DC/AC inverters, devices configured to measure and monitor photovoltaic parameters, communication devices, safety devices (e.g., fuses, circuit breakers and Residual Current Detectors) and/or Maximum Power Point Tracking (MPPT) devices. The power generation units may include, but are not limited to, photovoltaic modules (e.g. photovoltaic cells, photovoltaic panels), batteries, wind turbines, hydroelectric turbines and fuel cells.

As noted above, this Summary is merely a summary of some of the features described herein and is provided to introduce a selection of concepts in a simplified form that are further described below in the Detailed Description. The Summary is not exhaustive, is not intended to identify key features or essential features of the claimed subject matter and is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures. A more complete understanding of the present disclosure and the advantages thereof may be acquired by referring to the following description in consideration of the accompanying drawings, in which like reference numbers indicate like features, and wherein:

FIGS. 5A-5C depict portions of photovoltaic strings, with a plurality of photovoltaic power devices coupled to each other by conductors and coupled to photovoltaic generators.

FIG. 6 depicts a string of photovoltaic power devices coupled by conductors, stored on a storage device.

DETAILED DESCRIPTION

In the following description reference is made to the accompanying drawings, which form a part hereof.

Since power devices may often be used in bulk (e.g., one power device per photovoltaic generator may be used in a solar installation including multiple photovoltaic strings, each string including ten, twenty or more photovoltaic generators), costs may be reduced and deployment may be easier by packaging power devices in a form which enables multiple devices to be strung out and deployed at one time, along a photovoltaic string. Furthermore, use of a storage device such as a spool to wind multiple cable-connected devices around can make storage and deployment easier and cheaper.

The following non-limiting examples figures illustrate two types of aspects that may be used together: aspects of systems with different electrical configurations (for example, as in FIGS. 1A thru 1E), and aspects of power devices with different connector configurations (for example, as in FIGS. 2A thru 2C, 4B, and 4C). These two types of aspects (system electrical and device connectors) are determined by the power generation system electrical design (also referred to as installation design) and the placement choice of the power devices relative to the panels. For example, each specific installation may have an electrical design, which in turn may determine a power device electrical configuration to match. This may ensure that all power devices will behave electrically in the same string or installation as determined by the electrical configuration of the system. The power device electrical configuration may include specifications of input and output voltage/current ranges, operational parameters (such as timings and control loops), or the like.

Figure 1A:
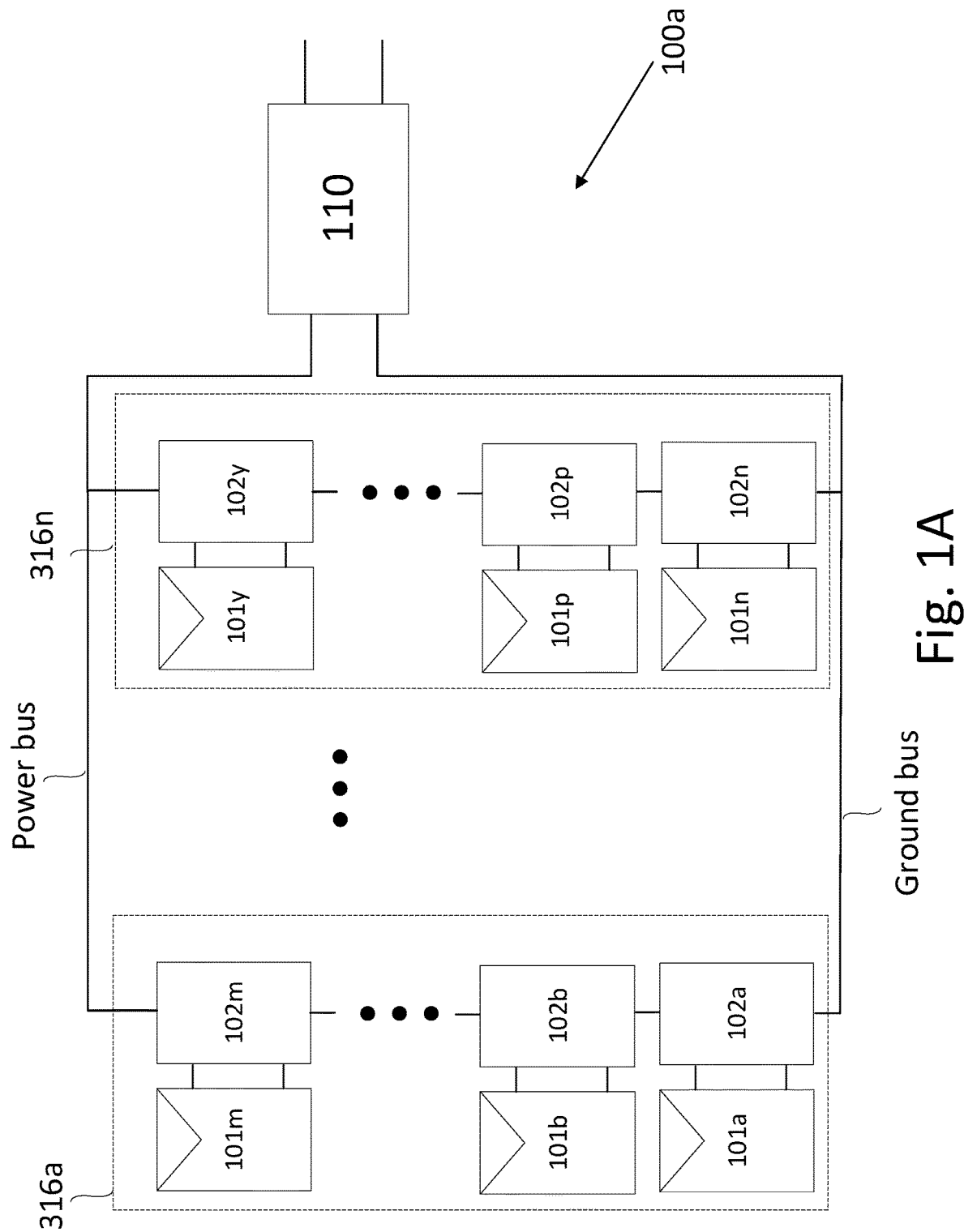
FIGS. 1A-1E are part schematic, part block diagrams of different power devices configured for different photovoltaic systems.

Referring to FIG. 1A, illustrative photovoltaic installation 100a may include a plurality of photovoltaic (PV) modules 101a-y. Photovoltaic generators may also be referred to as "photovoltaic modules". Each PV generator 101a-y may be coupled to a photovoltaic power device 102a-y and electrically configured for installation 100a. The devices 101a-y may collectively, individually and interchangeably be referred to herein as devices 101, and the devices 102a-y may collectively, individually and interchangeably be referred to herein as devices 102. Devices 102 may be electrically configured to match the configuration of installation 100a. Although each device 102 may be configured for a similar system electrical configuration, the other aspects of the devices may be different, such as different mechanical configurations, different connector configurations, different physical configurations, different software configurations, and other different aspects.

In some variations, one or more PV power device 102a-y (and all other power devices described herein) may comprise a power conversion circuit such as a direct current-direct current (DC/DC) converter such as a buck, boost, buckboost, flyback and/or forward converter. In some variations, one or more PV power device 102a-y may comprise a direct current-alternating current (DC/AC) converter, also known as an inverter or a microinverter. In some variations, one or more PV power device 102a-y may include a Maximum Power Point Tracking (MPPT) and/or Impedance Matching circuit with a controller, configured to extract regulated (e.g. increased) power from the PV generator the power device is coupled to. One or more PV power device 102a-y may further comprise a control device such as a microprocessor, Digital Signal Processor (DSP) and/or a field-programmable gate array (FPGA). In some variations, one or more PV power device 102a-y may comprise circuitry and/or sensors configured to measure parameters on or near the photovoltaic generator, such as the voltage and/or current output by the generator, the power output by the generator, the irradiance received by the generator and/or the temperature on or near the generator.

As depicted in FIG. 1A, a plurality of PV power devices 102a-m are coupled in series to form a first photovoltaic string 316a, and a second plurality of PV power devices 102n-y are coupled in series to form a second photovoltaic string 316b. One terminal of each photovoltaic string (e.g., 316a-316n) may be coupled to a power bus, and the other terminal of each photovoltaic string (e.g., 316a-316n) may be coupled to a ground bus. As used herein, a "ground" bus refers to a return bus that may be isolated from other ground buses, connected to other ground buses, or connected to earth ground. In some variations, the power and ground buses may be input to system power device 110. System power device 110 may comprise a DC/AC converter, and the DC/AC converter may output AC power to the grid, home or other loads and/or power distribution systems.

While PV generators and PV power devices in each photovoltaic string, are identified with a limited range of reference designators (e.g., 101a-101m, 101n-101y, 102a-102m, and 102n-y), each photovoltaic string (in all variations disclosed herein) may include any number of PV power devices and/or PV generators. Similarly, while the photovoltaic strings are identified with a limited range of reference designators (e.g., 316a-316n) each system 100a (and in all systems disclosed herein) may include any number of photovoltaic strings.

In some variations, the photovoltaic power devices may comprise microinverters, and an additional inverter (e.g. part of system power device 110 connected between the power devices and the load or power distribution system) may not be included. In some variations, the power devices may output a time-varying DC signal which emulates a rectified sine wave, in which case system power device 110 may comprise a full-bridge circuit configured to convert the rectified sine wave to a standard, alternating sine wave. In some variations, system power device 110 may include a combiner box for combining power from a plurality of photovoltaic strings (e.g. 316a-316n). In some variations, system power device 110 may comprise sensors/sensor interfaces for measuring or receiving measurements of one or more parameters (e.g. current, voltage, power, temperature etc.) associated with PV strings 316a-316n. In some variations, system power device 110 may include one or more safety switches for disconnecting and/or short circuiting PV strings 316a-316n (e.g., in case of a potentially unsafe condition or in response to a manual trigger such as a rapid-shutdown switch or button being activated).

Since PV power devices of known systems may be generally manufactured, packaged and sold separately, PV installations which include a plurality of PV generators, e.g., installation 100a, may require unpacking a large number of devices, individually coupling each device to its corresponding photovoltaic generator, and then coupling the power devices to one another using cables which may be sold separately as well. In some variations introduced herein, a power device chain is provided. The power device chain may include a plurality of power devices each coupled to at least one other power device using conductors of appropriate length at the time of manufacturing. Accordingly, power device chains as described herein may be packaged and sold as a single unit, and deployed as a single unit when installing installation 100a. For example, power devices 102a-m may comprise a string of power devices or part of a string of power devices, and may be coupled to one another during manufacturing. During installation, the string may simply be strung out alongside photovoltaic modules 101a-m and each device may be coupled to its corresponding module quickly and easily, forming photovoltaic string 316a.

As shown in FIG. 1A, installation 100a may include a plurality of photovoltaic strings 316a-n, with a terminal of each photovoltaic string 316a-n being coupled to the power bus and the other terminal being coupled to the ground bus.

Figure 1B:
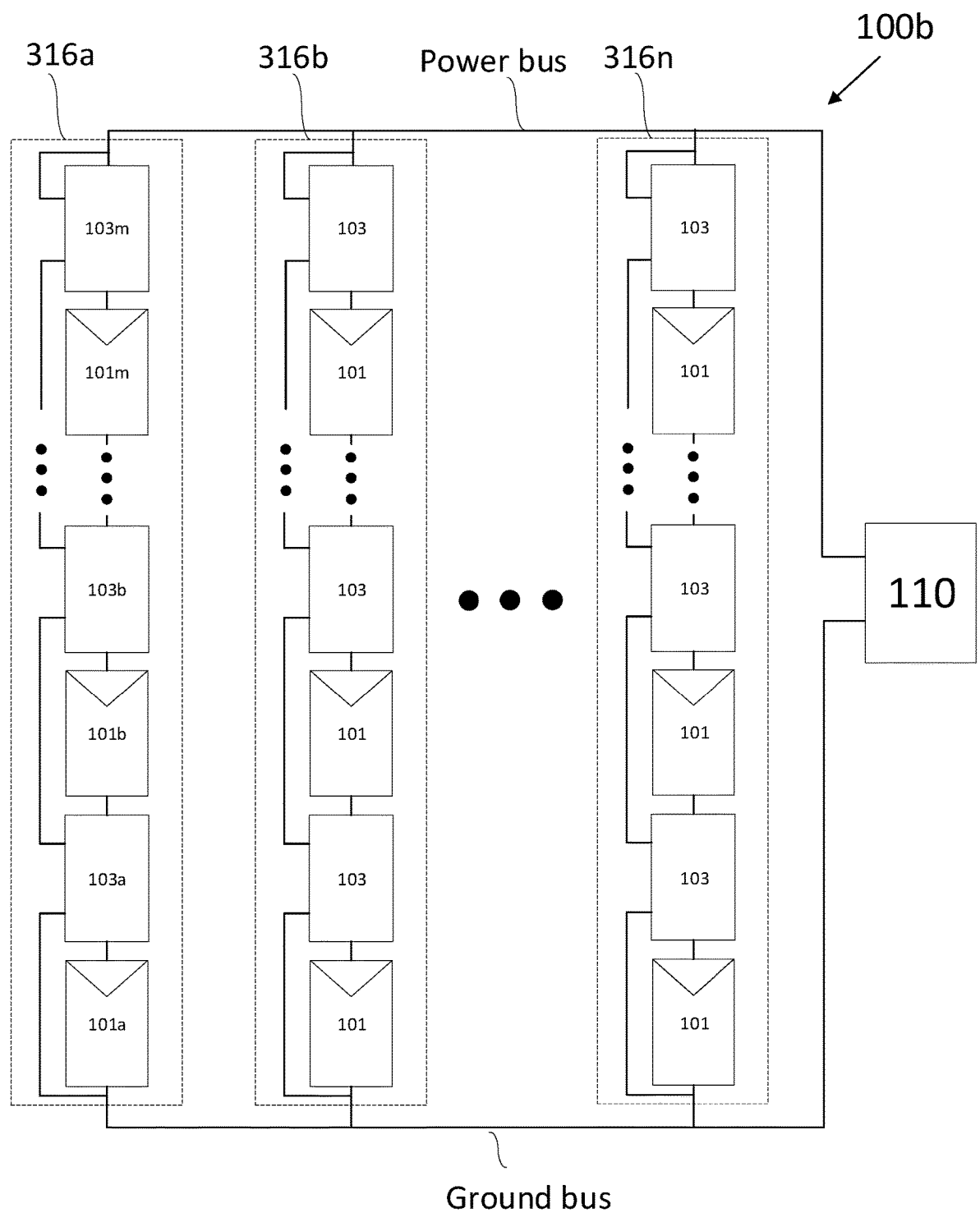

Referring now to FIG. 1B, illustrative system 100b may share many of the same characteristics as illustrative installation 100a of FIG. 1A, but the wiring of photovoltaic strings may differ in some respects. For example, in illustrative system 100b, each photovoltaic power device 103a-m may be coupled to two photovoltaic generators and electrically configured for installation 100b. For example, photovoltaic power device 103a may be coupled to generators 101a and 101b, power device 103b may be coupled to generators 101b and 101c (not shown), and so on. Wiring each photovoltaic string (e.g. 316a) in this manner may save money by requiring thinner and fewer cables to couple the power devices to the generators and to one another. The devices 103a-m may collectively, individually and interchangeably be referred to herein as devices 103, and similarly, other electrical configurations of power devices may be referred to collectively be using the reference number and omitting the reference letter associated with individual instances of a similar device.

As shown in FIG. 1B, the power devices may be pre-coupled to one another during manufacturing, packaged and/or sold together, and deployed easily, similar to as described with reference to installation 100a shown in FIG. 1A. For effective system operation and for easy and fast coupling of the power devices to the photovoltaic generator (s) the power devices may be arranged to be coupled to PV panels, and the electrical and/or mechanical design of the power devices used for systems such as 100a (such as 102) may differ from the design used for such as systems 100b (such as 103). The pre-coupling, packaging and easy deployment described herein may be applied to different kinds of power devices used in different kinds of photovoltaic systems, regardless of mechanical design and electrical topology details which may be specific to certain power devices.

Figure 1C:
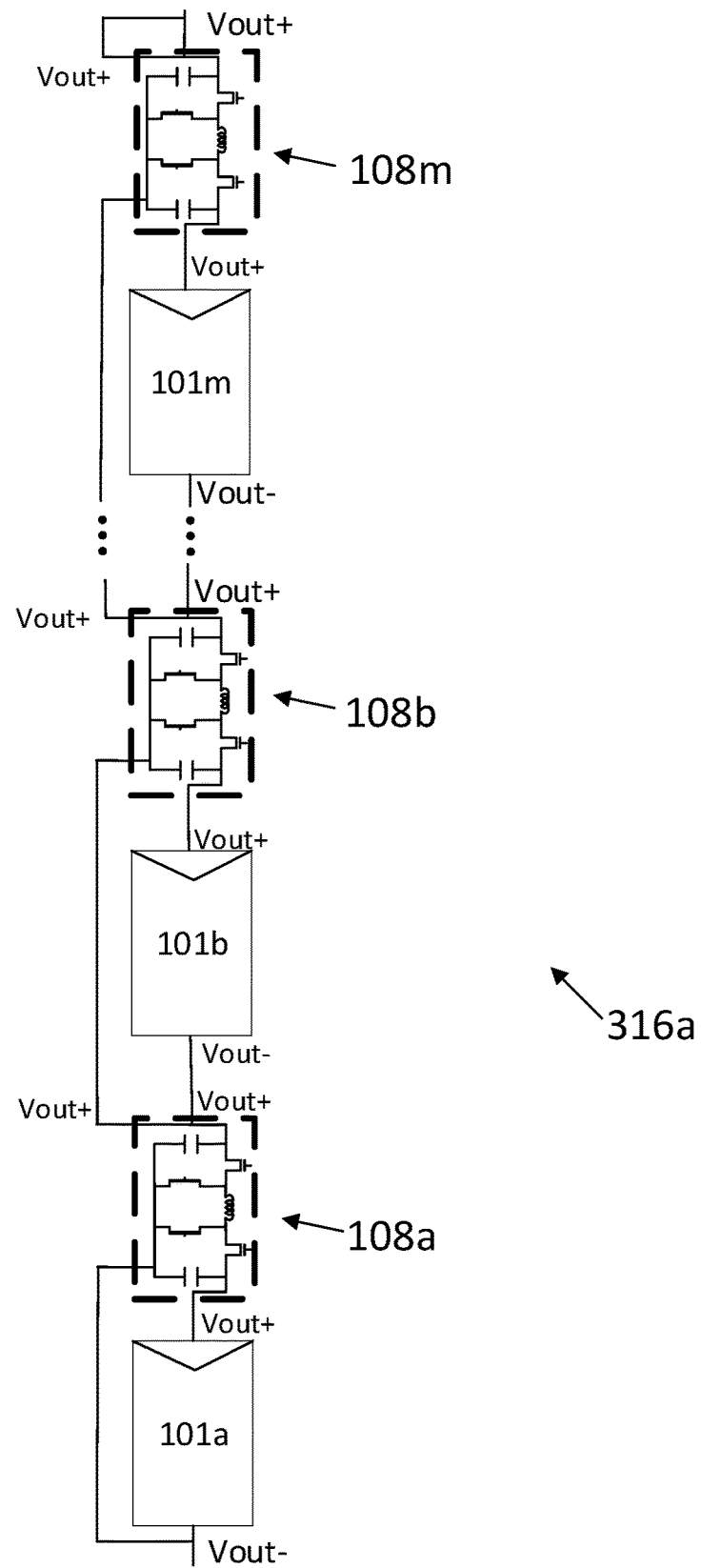

Reference is now made to FIG. 1C, which shows a photovoltaic string (e.g., 316a) in which each photovoltaic power device is coupled to two photovoltaic modules. In this variation, PV power devices 108a-m (which may be an example of PV power device 103 in FIG. 1C) comprise Buck-Boost DC/DC converters. Additional circuitry (e.g., a controller, voltage and current sensors, control logic, etc.) may be included in power devices 108a-m, but is not explicitly depicted in FIG. 1C. Additional circuitry and/or wiring configurations may be used to couple power devices to photovoltaic generators according to various aspects of the present disclosure.

Figure 1D:
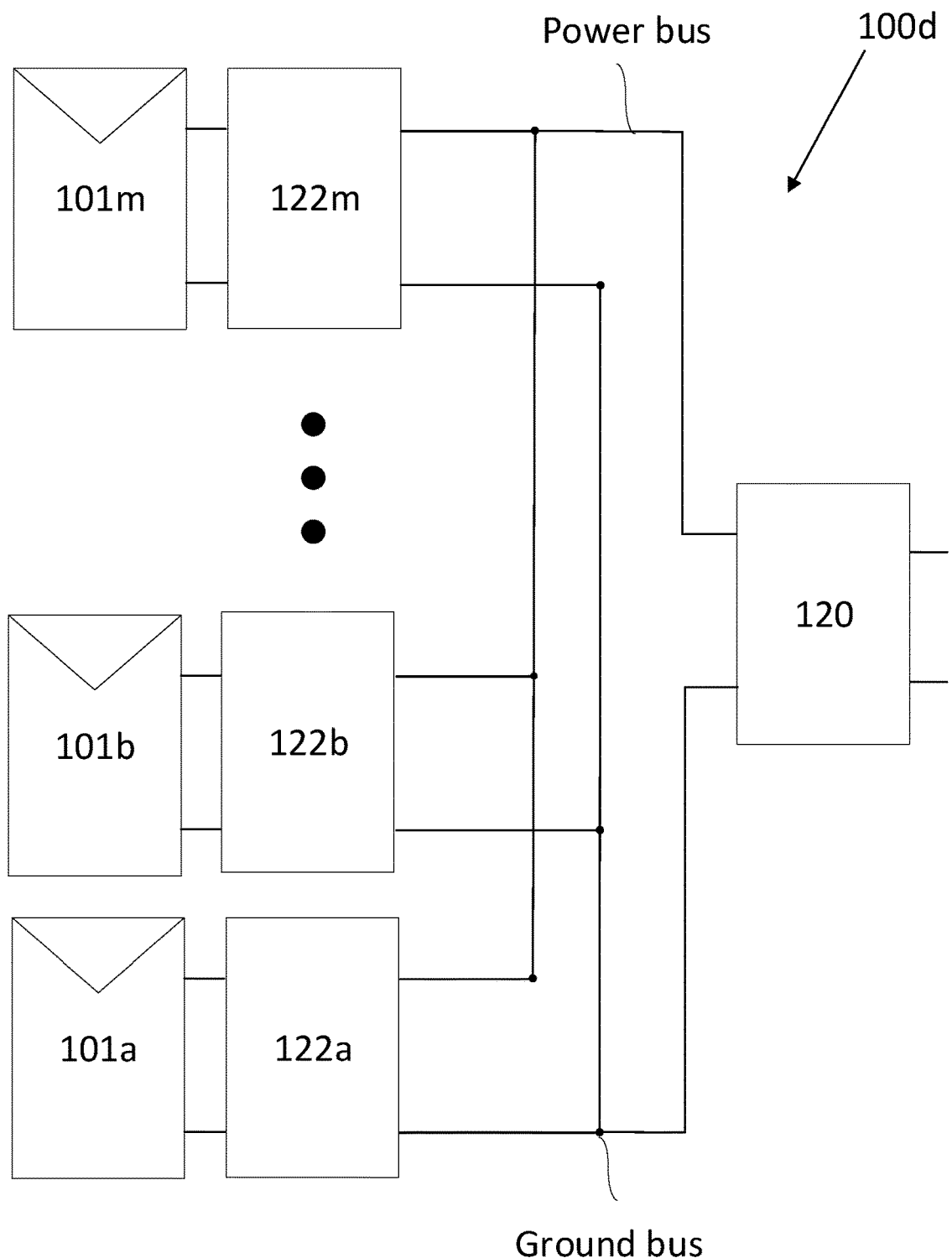

Referring to FIG. 1D, illustrative variations may include photovoltaic installation 100d, comprising a plurality of photovoltaic generators 101a-m each coupled to a power device 122a-m. Power device 122a-m may be electrically configured for installation 100d. Each power device 122a-m may have two outputs, one coupled to a mutual power bus, and one coupled to a mutual ground bus, coupling all the power devices in parallel. In some variations, one or more of the power devices 122a-m may comprise a DC/DC converter, with each converter's positive output coupled to the power bus, and the negative terminal coupled to the ground bus. In some variations, one or more of the power devices 122a-m may comprise a DC/AC converter, with the AC outputs synchronized to allow parallel coupling. In some variations including an AC output by the power devices, the AC output may be a single phase coupled to the power and ground buses, and in some variations three or more phases may be output to more than two buses. The system may further include the power bus and ground bus being input to grid-coupling device 120. In variations including a DC output by the power devices, grid coupling device 120 may include a DC/AC inverter. In variations including an AC output by the power devices, grid coupling device 120 may include a transformer. Grid coupling device 120 may be similar to or the same as system power device 110 of FIG. 1A, and may comprise safety devices (e.g. sensors, circuit breakers, fuses, etc.) and/or control and/or monitoring devices.

Figure 1E:
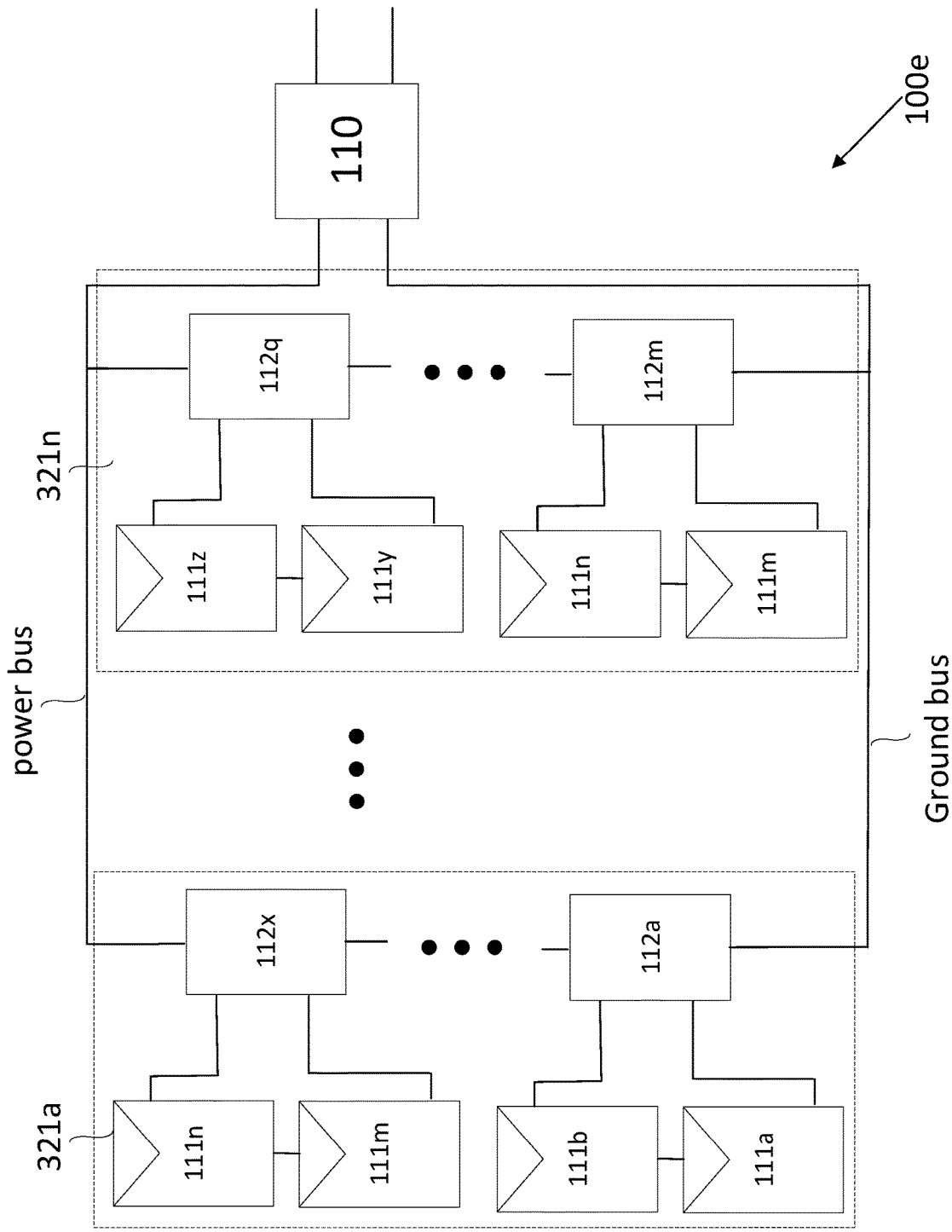

Referring to FIG. 1E, more than one photovoltaic module may be coupled to each photovoltaic power device. System 100e includes two photovoltaic modules (e.g. photovoltaic panels or a different type of photovoltaic generator) 111a, 111b coupled to each other in series, with the series coupled modules 111a and 111b coupled across an input terminal of a photovoltaic power device 112a. Photovoltaic power device 112a may be electrically configured for installation 100e. Similar to other variations disclosed herein, outputs of a plurality of power devices 112a-x may be coupled in series to form a photovoltaic string 321a, with multiple strings 321a-n coupled in parallel between the ground and power buses. In some variations, inverter 110 may receive a DC input from the ground and power buses and output AC power to the grid or home. In similar variations, the power devices may be precoupled to one another at the time of manufacturing, with the conductors coupling the power devices being sized (in length and/or gauge) to allow the desired number of photovoltaic generators to be coupled to each power device. For example, if each two PV generators are to be coupled to one another and to a single power device, the length of each conductor between power devices being around double the width or length of each photovoltaic module.

Devices 102, 103, 108, 122, and 112 represent power devices with different electrical specifications (such as input and output voltage and current limits, timings, control loops, impedances, or the like) configured for respective different installation electrical configurations 100a, 100b, 100d, and 100e.

Figure 2A:
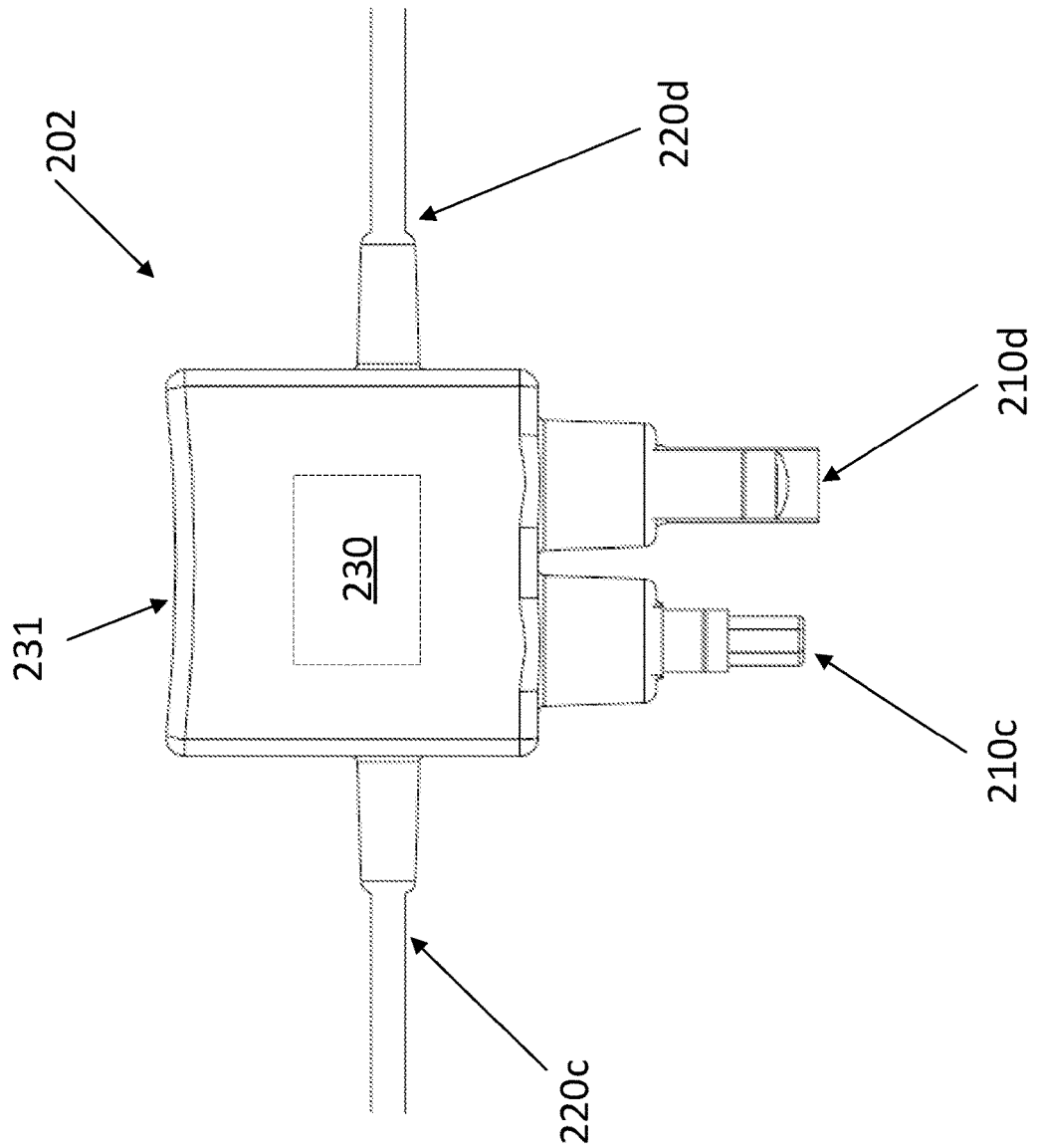
FIGS. 2A-2C depict photovoltaic power devices with different connector configurations.
Figure 2B:
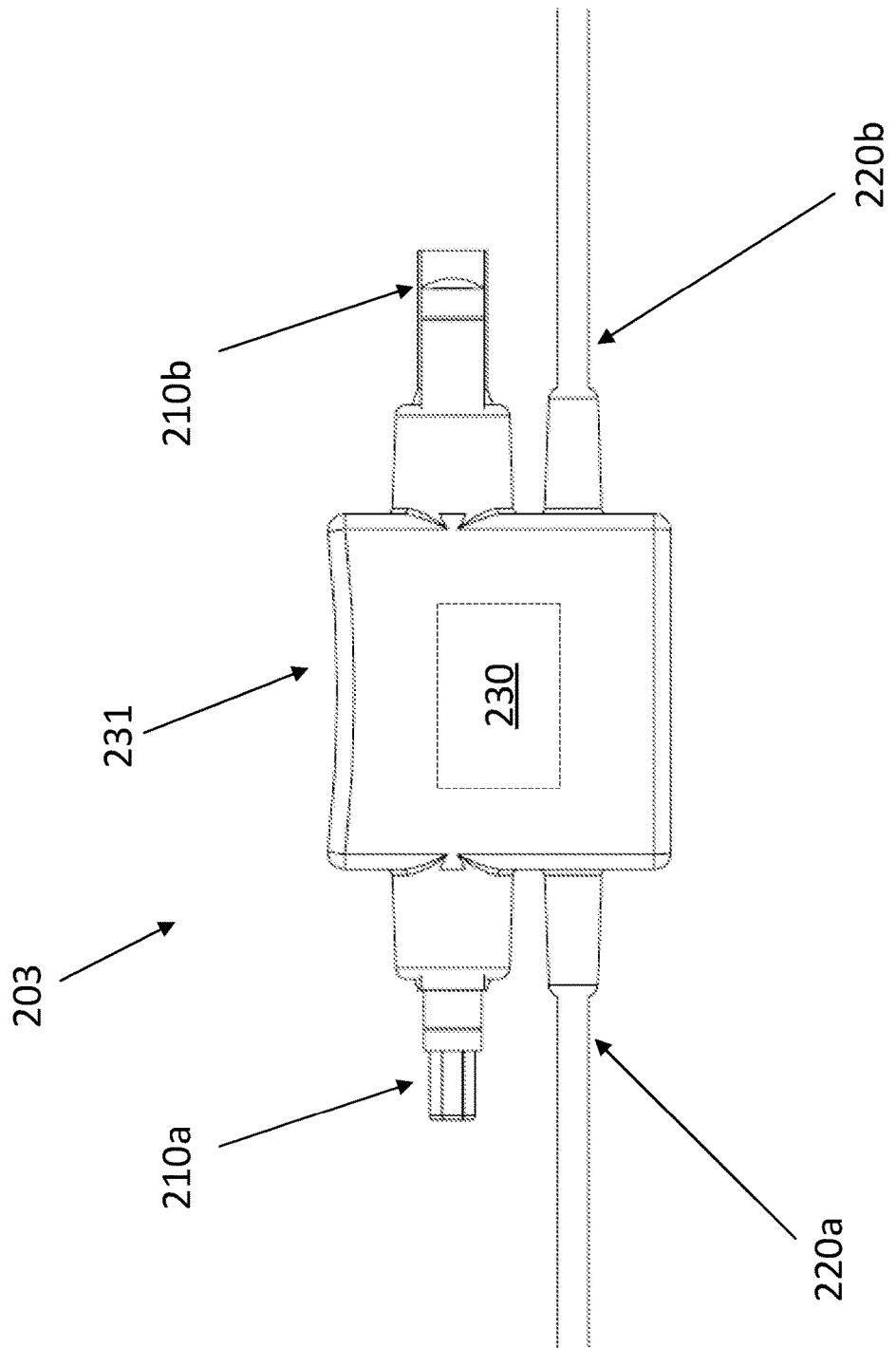
Figure 2C:
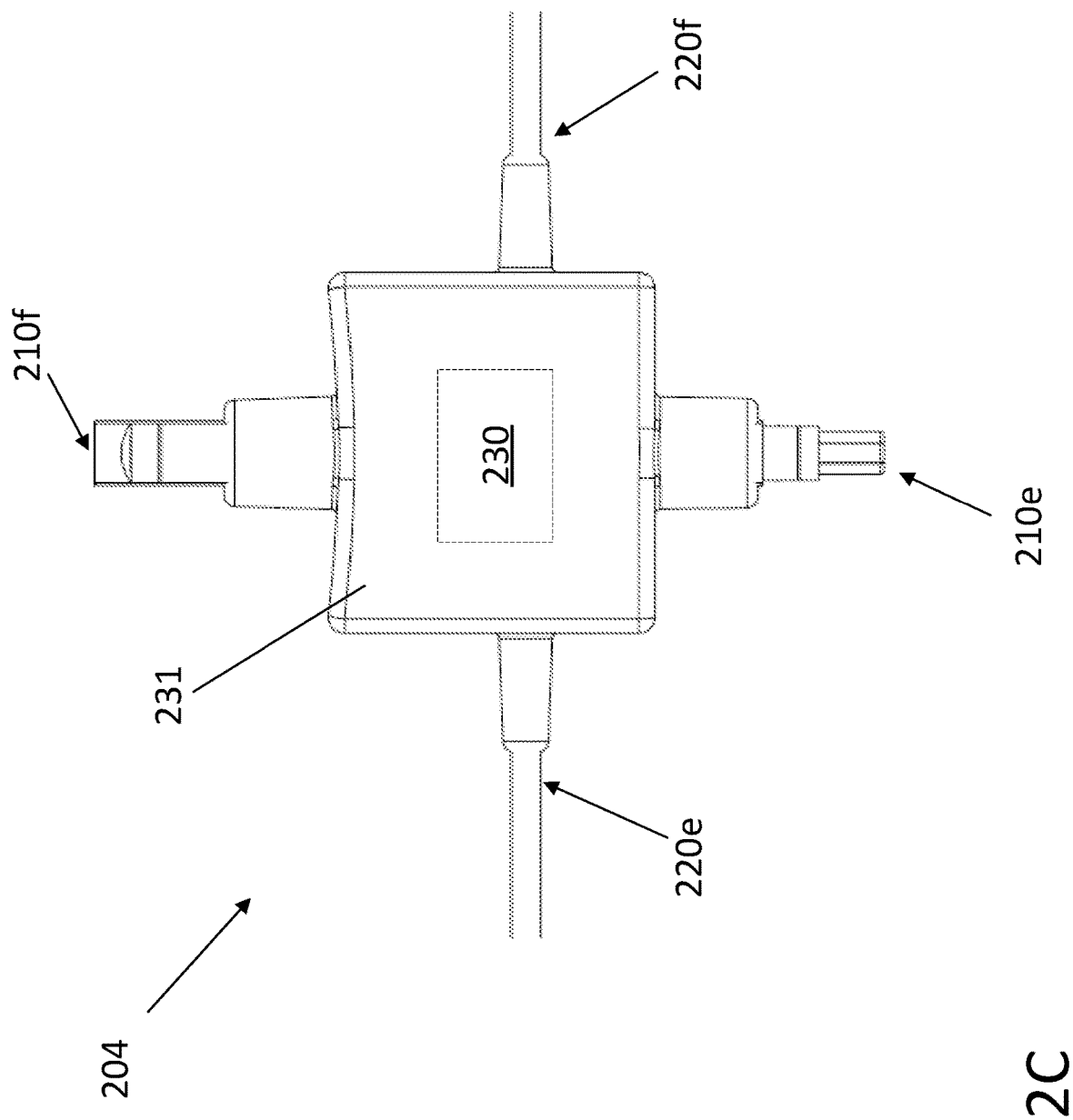
Figure 4A:
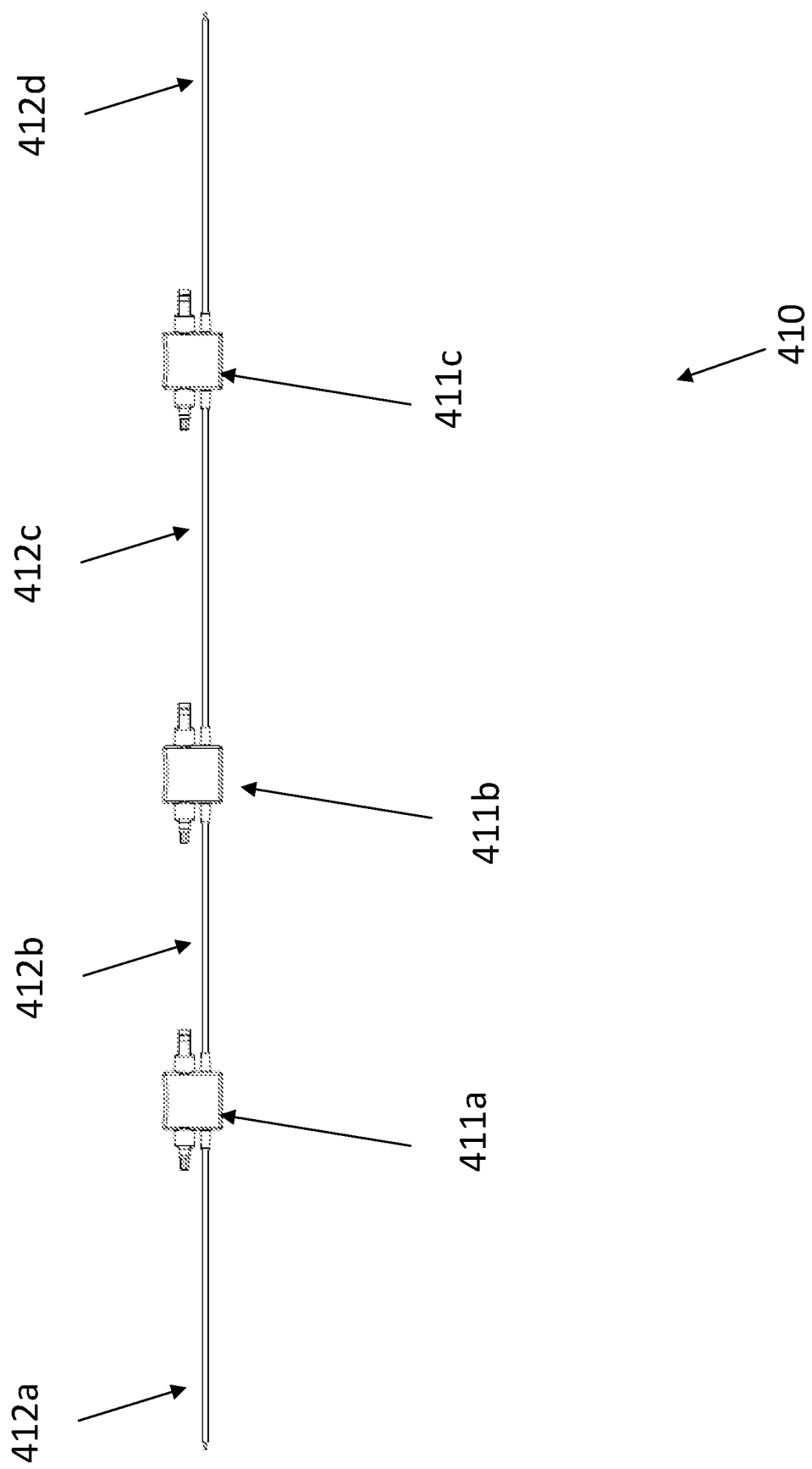
FIGS. 4A-4C depict strings of photovoltaic power devices coupled by conductors.
Figure 4B:
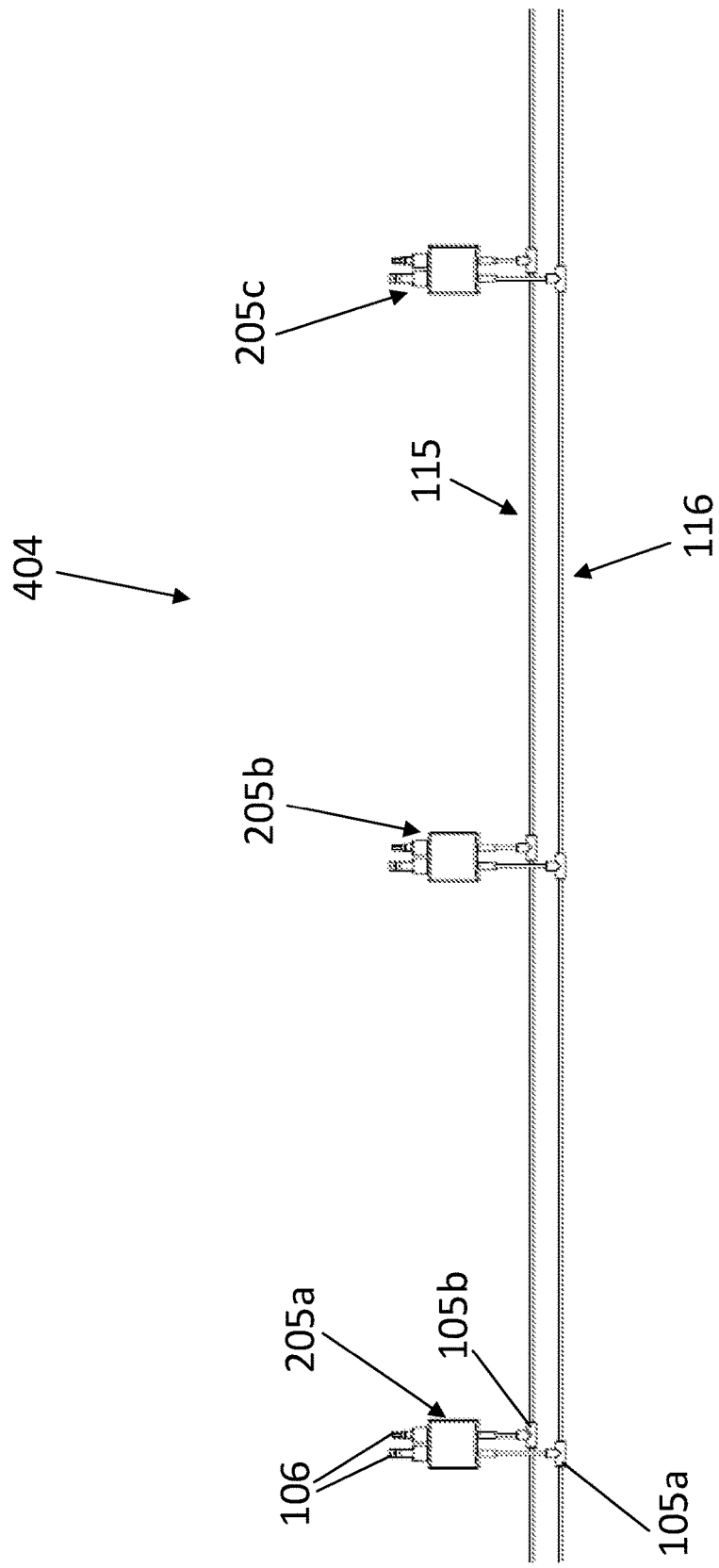
Figure 4C:
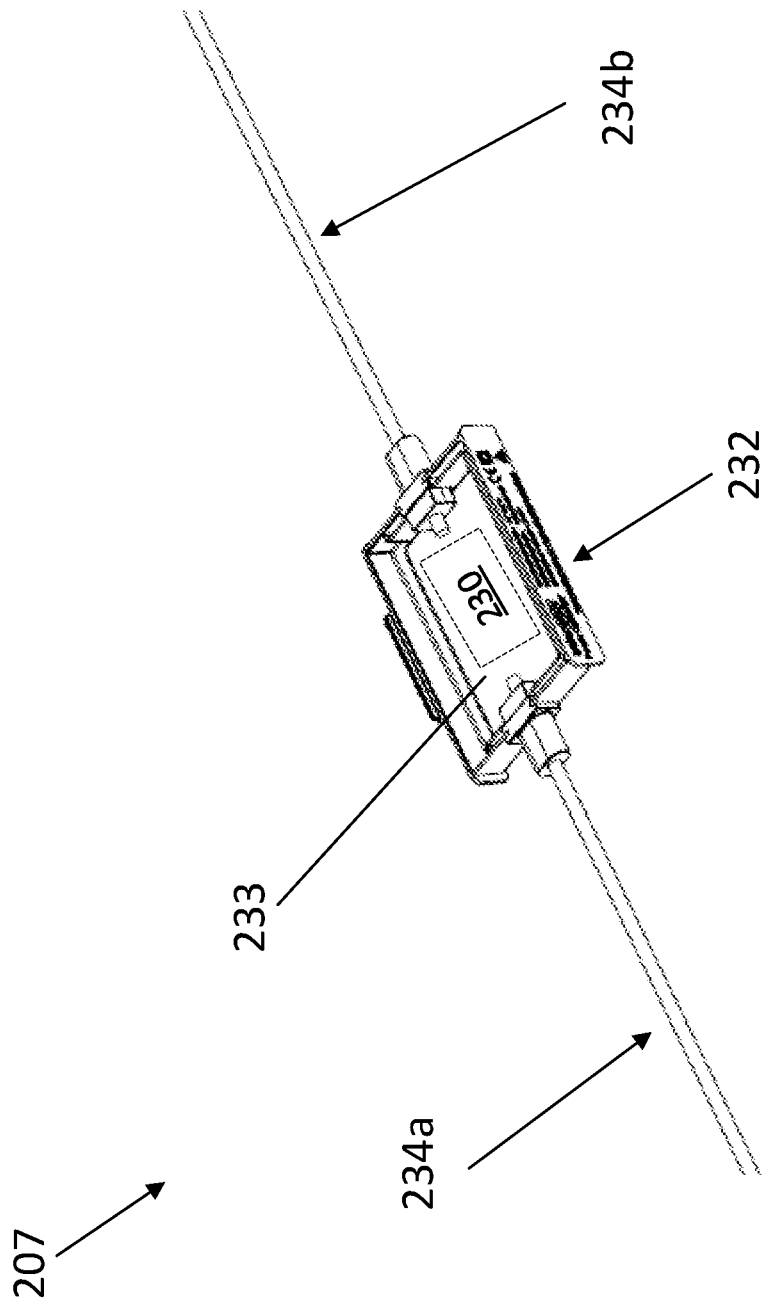

Following FIGS. 2A, 2B, and 2C as well as FIGS. 4B and 4C illustrate different mechanical configurations of input and output terminals as at 202, 203, 204, 205, and 207. These electrical and mechanical configurations may be selected in any combination. Following examples may illustrate several of these combinations, but these should not be seen as limiting examples.

Referring to FIG. 2A, photovoltaic power device 202 may be configured in various ways. In one illustrative variation, photovoltaic power device 202 may comprise a casing 231 containing circuitry 230, input terminals 210c and 210d, and output conductors 220c and 220d. In other variations, casing 231 may be replaced by a surface on which circuitry 230 is mounted, the surface being snapped to a different part of a photovoltaic apparatus such as a junction box. In some variations, there may be more than two input terminals. For example, some variations may include four input terminals for coupling the power device to two photovoltaic modules, the power device processing power input from both modules. Photovoltaic device 202 may be electrically configured for installations 100a, 100b, 100d, or 100e (e.g., as device 102, 103, 108, 112, or 122).

In some variations, circuitry 230 may include a power conversion circuit such as a direct current-direct current (DC/DC) converter such as a buck, boost, buck-boost, Cuk, charge pump, flyback and/or forward converter. In some variations, circuitry 230 may include a direct current-alternating current (DC/AC) converter, also known as an inverter or a microinverter. In some variations, circuitry 230 may include a Maximum Power Point Tracking (MPPT) circuit with a controller configured to extract increased power from the PV generator the power device is coupled to. Circuitry 230 may further comprise a control device such as a microprocessor, Digital Signal Processor (DSP), Application Specific Integrated Circuit (ASIC) and/or a Field Programmable Gate Array (FPGA). In some variations, circuitry 230 may include circuitry and/or sensors configured to measure parameters on or near the photovoltaic generator, such as the voltage and/or current output by the generator, the power output by the generator, the irradiance received by the generator and/or the temperature on or near the generator and/or power device. Input terminals 210c and 210d may be coupled to outputs of one or more photovoltaic modules, and may also be coupled to circuitry 230 for processing and/or measuring the power output by the corresponding one or more photovoltaic modules. Output conductors 220c and/or 220d may couple the photovoltaic power device to adjacent devices, to form a serial or parallel photovoltaic string. The input terminals and output conductors may be physically connected to different parts of casing 231. For example, the input terminals 210c and 210d may be physically located next to one another along one side of casing 231, with output conductors 220c and 220d occupying opposite sides of casing 231, on either side of input terminals 210c and 210d. In other variations, the input terminals and output conductors may be configured differently, as will be shown herein FIGS. 2B, 2C, 4B, and 4C. The location of the input terminals and output conductors may be chosen considering the layout and wiring design of the system at hand, as well as the installation electrical configuration such as for installations 100a-e. Mechanical considerations, such as enabling optimal storing of the entire chain of power devices, may also factor into designing the location of the input terminals and output conductors. The photovoltaic power device 202 shown in FIG. 2A may be particularly suited for coupling to a single photovoltaic generator (in systems such as those shown in FIGS. 1A, 1D, and 5A), since the input terminals are next to each other, though photovoltaic power device 202 may also be deployed in a way that couples it to two generators (such as 103 shown in FIG. 1B, 108 shown in FIG. 1C, 112 of FIG. 1D, or 503 of FIG. 5B).

Referring now to FIG. 2B, the input terminals and output conductors may be configured such that input terminal 210a is adjacent to output conductor 220a, both connected to a side of casing 231, and on the opposite side of casing 231 input terminal 210b is adjacent to output conductor 220b. This illustrative variation may be suited for coupling photovoltaic power device 203 to two photovoltaic generators (such as 103 of shown in FIG. 1B, 108 shown in FIG. 1C, 112 of FIG. 1D, 503 of FIG. 5B, or 109 of FIG. 7A), since the two input terminals may be coupled to two generators on either side of the power device. Photovoltaic power device 203 may also be deployed in a way that couples it to a single generator (such as 102 of FIG. 1A, 122 of FIG. 1D, 502 of FIG. 5A, 504 of FIG. 5C, or 109a-j of FIG. 7A). Photovoltaic device 203 may be configured for installations 100a, 100b, 100d, or 100e.

Referring now to FIG. 2C, the input terminals and output conductors may be configured such that input terminals 210e and 210f are located on opposing sides of casing 231, while output conductors 220e and 220f are located on the other pair of opposite sides of casing of photovoltaic power device 204. Thus, four sides of the casing contain either an input terminal or an output conductor. This illustrative variation may, in some configurations, enable optimal packaging of the chain of power devices and enable it to be stored in a compact convenient way. The chain according this variation can be deployed in a way that couples each power device to either one (for example, such as 102 of FIG. 1A, 122 of FIG.

Figure 5A:
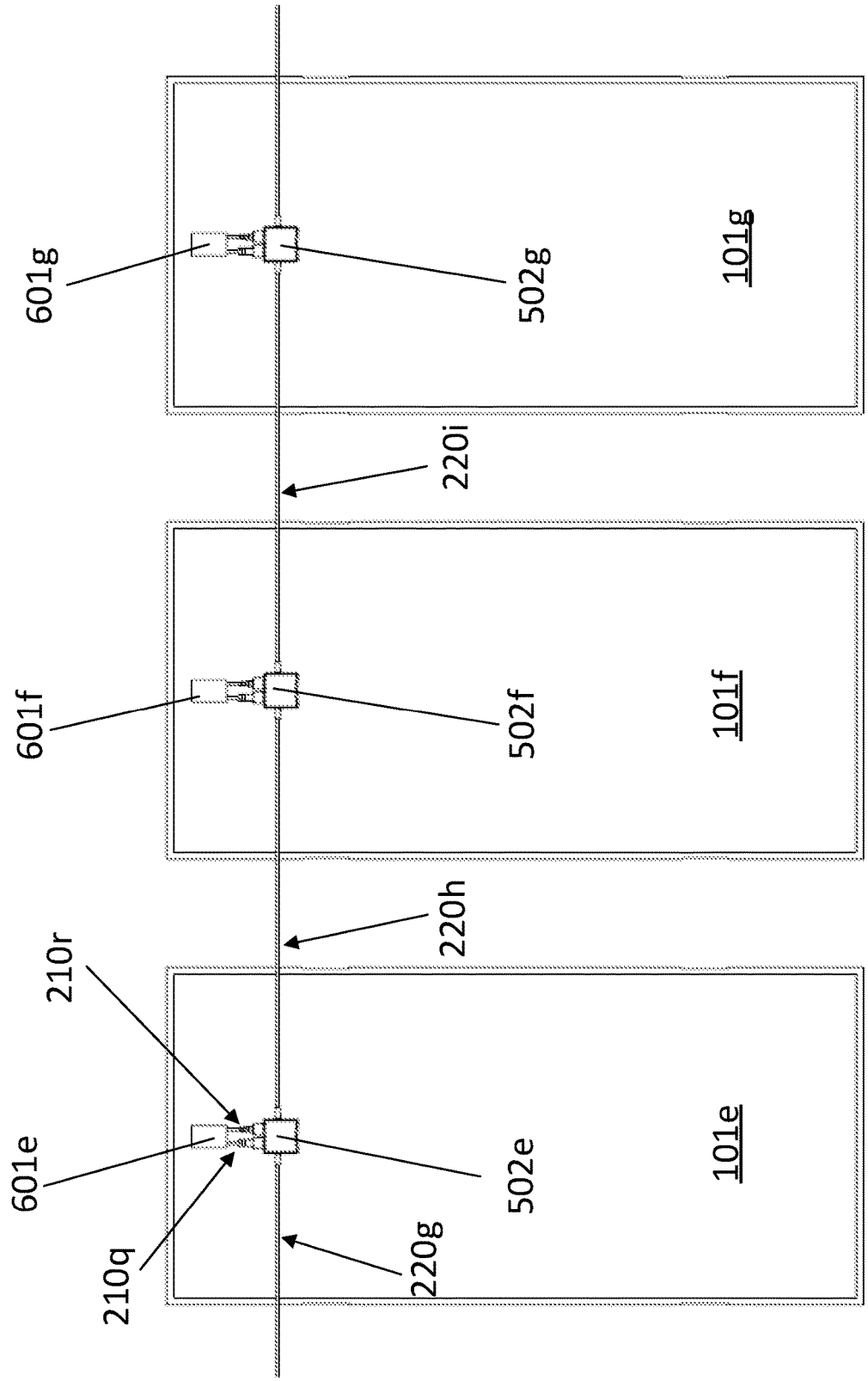
Figure 7A:
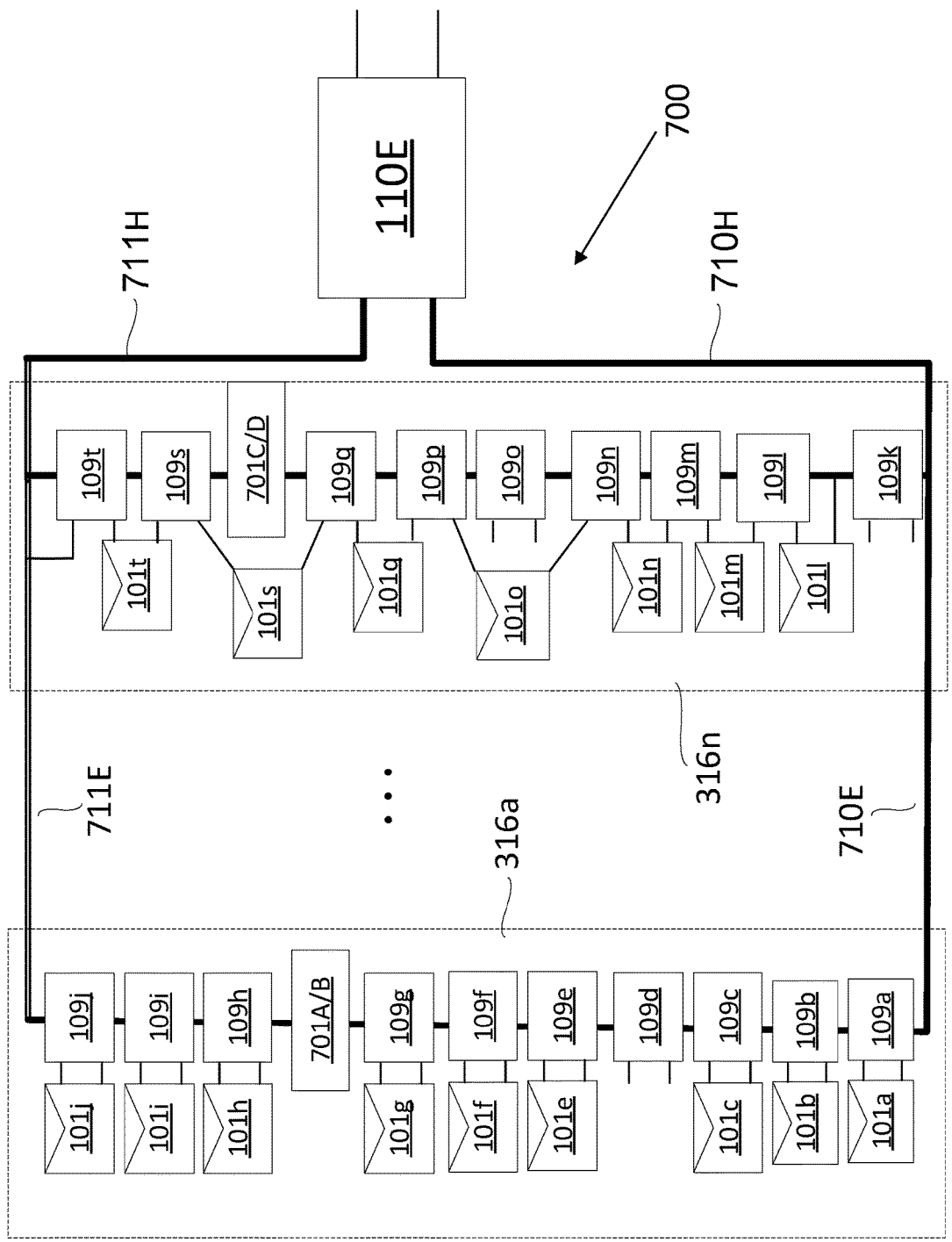
FIG. 7A depicts a string of power devices coupled by conductors.

1D, 502 of FIG. 5A, 504 of FIG. 5C, or 109a-j of FIG. 7A) or two (for example, such as 103 of shown in FIG. 1B, 108 shown in FIG. 1C, 112 of FIG. 1E, 503 of FIG. 5B, or 109 of FIG. 7A) photovoltaic modules. Photovoltaic device 204 may be configured for installations 100a, 100b, 100d, or 100e.

Figure 3:
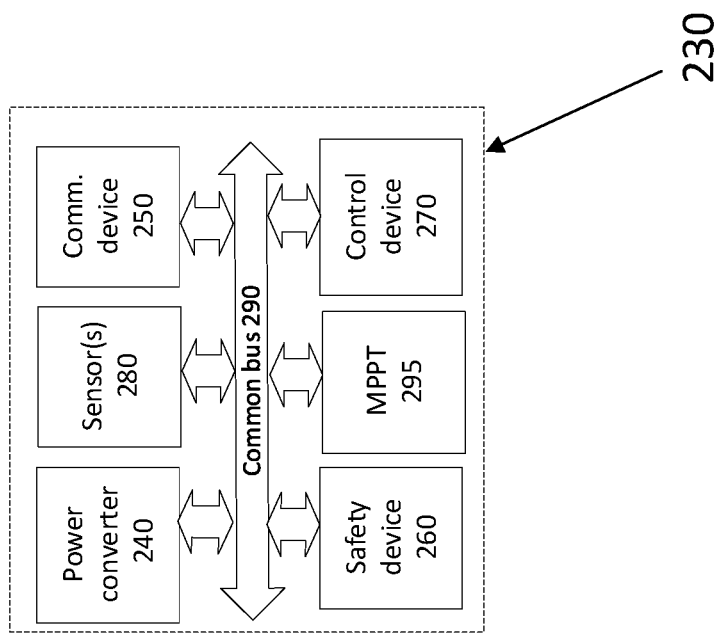
FIG. 3 is part schematic, part block diagram depicting a photovoltaic power device.

Referring now to FIG. 3, photovoltaic power devices may house circuitry 230. Any of the photovoltaic power devices referred to herein, may include circuitry 230, including for example, 102 of FIG. 1A, 103 of FIG. 1B, 108 of FIG. 1C, 122 of FIG. 1D, 112 of FIG. 1E, 202 of FIG. 2A, 203 of FIG. 2B, 204 of FIG. 2C, 411 of FIG. 4A, 205 of FIG. 4B, 207 of FIG. 4C, 502 of FIG. 5A, 503 of FIG. 5B, 504 of FIG. 5C, and 109 of FIGS. 7A, 7B, and 7C. In some variations, circuitry 230 may include power converter 240. Power converter 240 may include a direct current-direct current (DC/DC) converter such as a buck, boost, buck-boost, flyback and/or forward converter. In some variations, power converter 240 may include a direct current-alternating current (DC/AC) converter, also known as an inverter or a microinverter.

In some variations, circuitry 230 may include Maximum Power Point Tracking (MPPT) circuit 295, configured to extract increased power from the PV generator the power device is coupled to. In some variations, power converter 240 may include MPPT functionality, and MPPT circuit 295 may not be included. Circuitry 230 may further comprise control device 270 such as a microprocessor, Digital Signal Processor (DSP), ASIC and/or an FPGA. Control device 270 may control and/or communicate with other elements of circuitry 230 over common bus 290.

In some variations, circuitry 230 may include circuitry and/or sensors 280 configured to measure parameters on or near the photovoltaic generator, such as the voltage and/or current output by the generator, the power output by the generator, the irradiance received by the generator and/or the temperature on or near the generator. In some variations, circuitry 230 may include communication device 250, configured to transmit and/or receive data and/or commands from other devices. Communication device 250 may communicate using Power Line Communication (PLC) technology, or wireless technologies such as ZigBee®, Wi-Fi™, cellular communication or other wireless methods. In some variations, PLC signals may be transmitted and/or received over output conductors (such as 220a, 220b, 220c, 220d, 220e and/or 220f of FIGS. 2A, 2B, and 2C, herein collectively, individually and interchangeably referred to as output conductors 220). In some variations, a communications link (e.g. an optical fiber) may be integrated with output conductors 220 and may be communicatively coupled to communication device 250.

In some variations, a thermal sensor device (e.g. a thermocouple device or a Linear Heat Detector) may be integrated with output conductors 220 and may provide temperature measurements (e.g. measurements obtained at various locations along output conductors 220) to control device 270. Input terminals (such as 210a, 210b, 210c, 210d, 210e, and/or 210f of FIGS. 2A, 2B, and 2C, collectively, individually and interchangeably referred to as input terminals 210) may be coupled to outputs of one or more photovoltaic modules, and may also be coupled to circuitry 230 for processing and/or measuring the power output by the corresponding photovoltaic module. In some variations, circuitry 230 may include safety devices 260 (e.g. fuses, circuit breakers and Residual Current Detectors). The various components of circuitry 230 may communicate and/or share data over common bus 290.

FIG. 4A depicts chain 410. Chain 410 may comprise plurality of photovoltaic power devices 411a-c coupled by plurality of conductors 412a-d. In some variations, a chain of photovoltaic power devices similar to chain 410 may comprise ten, twenty or even a hundred photovoltaic power devices. In some variations, chain 410 may be manufactured and/or sold as a single unit. Photovoltaic power devices 411a-c may be similar to or the same as photovoltaic power devices described herein, for example, photovoltaic power device 102 of FIG. 1A (connected to one PV panel), or photovoltaic power device 103 of FIG. 1B (connected to two PV panels). Conductors 412a-d may be directly coupled (e.g. connected) to the output terminals of a DC/DC converter or DC/AC inverter included in a photovoltaic power device (e.g. 411a-c). The length of each output conductor 412a-d may be appropriate to enable each PV power device to be coupled to photovoltaic generators in a photovoltaic string. Since different PV generators may have different dimensions, and since the PV generators may be oriented differently during deployment, the distance between power devices (i.e., the length of each output conductor) may vary in different chains. However, many PV generators (e.g. PV panels) are of similar dimensions, and PV panels are generally oriented in one of two ways (vertically, aka "portrait", or horizontally, aka "landscape"), so a chain of photovoltaic power devices (e.g. chain 410) featuring a standard distance between power devices may be deployed many photovoltaic systems. For example, photovoltaic panels are generally manufactured in standard sizes, such as around 65 by around 39 inches for residential installations or around 77 by around 39 inches for commercial installations. Therefore, chains of power devices configured to be deployed with panels of dimensions similar to those cited above may include conductors which are sized in proportion to the panel dimensions, for example, around 39, around 65 or around 77 inches long. While the input terminals and output conductors 412a-d of illustrative power devices 411a-c denoted in FIG. 4A are located similarly to what is shown in FIG. 2B, variations may have input terminals and output conductors located similarly to what is shown in FIG. 2A, or various other configurations without departing from the scope of the present disclosure.

Conductors 412a-412d may be (e.g. during manufacturing or chain 410) internally connected to circuitry (e.g. circuitry 230 of FIG. 3) inside photovoltaic power devices 411a-411c at the time of manufacturing. For example, conductor 412b may be at a first end, for example, soldered, crimped, or connected via a screw to a power converter or monitoring device in photovoltaic power device 411a, and may be at a second end, for example, soldered, crimped, or connected via a screw, to a power converter or monitoring device in photovoltaic power device 411b. Preconnecting conductors between power devices may reduce the number of connectors (e.g. MC4™ connectors) featured in each power device from four (two connectors for connecting to a PV generator at the power device input and two connectors for connecting between power devices at the power device output). As connectors may be costly components, substantial savings may be realized. Additionally, preconnecting power devices during manufacturing may increase system safety. For example, if improperly connected, connection points between power devices may be susceptible to overheating, arcing and/or other unsafe event which may result in fire. Preconnecting conductors between power devices during manufacturing without use of connectors may increase system safety by reducing the number of connection points from four per power device to two per power device.

Referring now to FIG. 4B, a chain of photovoltaic power devices 404 may comprise output conductors which double as ground and power buses of a parallel-connected photovoltaic installation similar to the system shown in FIG. 1D. Input terminals 106 may be coupled to the outputs of a photovoltaic system. Output conductor 105*a* may be coupled to the power bus using a T-connector, and output conductor 105*b* may be coupled to the ground bus using a T-connector. The input terminals 106 and output conductors 105*a*, 105*b* are denoted explicitly in FIG. 4B only for power device 205*a*, but are similarly included on each power device 205 (such as, 205*b*, 205*c*). One or more power device 205*a*-*c* may comprise a DC/DC converter or DC/AC inverter configured to output a DC or AC voltage common to all parallel-connected devices. In some variations, one or more power device 205*a*-*c* may comprise a Maximum Power Point Tracking (MPPT) circuit with a controller, configured to extract maximum power from the PV generator the power device is coupled to. One or more power device 205*a*-*c* may further comprise a control device such as a microprocessor, Digital Signal Processor (DSP), ASIC and/or an FPGA. In some variations, one or more power device 205*a*-*c* may comprise circuitry and/or sensors configured to measure parameters on or near the photovoltaic generator, such as the voltage and/or current output by the generator power output by the generator, the irradiance received by the generator and/or the temperature on or near the generator and/or power device. The power device chain 404 in the variation shown in FIG. 4B may include two long conductors, ground bus 116 and power bus 115, with PV power devices coupled to the two conductors, with the distance between adjacent power devices enabling them to be coupled to adjacent PV generators in a photovoltaic installation. The power devices may be coupled to the conductors at the time of manufacturing, and may be compactly stored along with the conductors, enabling fast and easy deployment.

Referring now to FIG. 4C, illustrative variations of photovoltaic power device 207 may feature an open casing or lid 232 instead of a closed casing such as casing 231 depicted in FIG. 2A. Lid 232 may include circuit-mounting surface 233 which may be used to mount circuitry 230. Circuitry 230 may comprise any and/or all of the components described herein with reference to other figures. For example, circuitry 230 may comprise a power converter such as a DC/DC or a DC/AC converter. As another example, circuitry 230 may comprise a monitoring device in addition to or instead of a power converter. In some variations, power device 207 may be designed to be connectable to a portion of a photovoltaic panel junction box, enabling circuitry 230 to be coupled directly to the electronics located in the panel's junction box.

In some variations, direct coupling of the lid to a photovoltaic generator junction box may render external input terminals unnecessary, for example input conductors are connected directly to the PV panel conductors behind the junction box, or to conductors within the junction box, and the device 207 is attached to the panel as an open cover or the junction box as a lid respectively. Output conductors 234*a*-*b* may be located on opposite sides of lid 232, and may be coupled to additional power devices (not depicted explicitly in the figure), forming a chain of serially connected devices. Similar to other illustrative variations, the distance (i.e. the length of the coupling conductor) between adjacent power devices 207 may be of appropriate length enabling coupling of adjacent power devices to adjacent photovoltaic modules in a photovoltaic installation. The power devices may be coupled to the conductors at the time of manufacturing, and may be compactly stored along with the conductors, enabling fast and easy deployment.

Reference is now made to FIG. 5A, which depicts a portion of a chain of power devices coupled to photovoltaic generators in a variation of the system. PV generator 101*e* may include junction box 601*e*, featuring two outputs which may be coupled to input terminals 210*q* and 210*r* of power device 502*e*. Power generated by the PV generator may be transferred via the junction box to the power device via the input terminals 210*q* and 210*r*, which may be coupled directly to the junction box. Power device 502*e* may further include circuitry 230 (not explicitly depicted in the figure) which may comprise various elements as described herein. Output conductor 220*g* may couple power device 502*e* to an adjacent power device on one side (not shown explicitly), while output conductor 220*h* may couple power device 502*e* to an adjacent power device 502*f* on the other side, with output conductor 220*i* coupling power device 502*f* to power device 502*g*. The input terminals and output conductors of power devices 502*f*, 502*g* are similarly configured, but are not labeled explicitly in the figure. Conductors 220*g*, 220*h* and 220*i* may be of appropriate length to enable fast and easy coupling of each of the power devices to their respective generators, without overuse of conductive cables. For example, if PV modules 101*e*, 101*f* and 101*g* are of standard width (e.g., 39 inches) and are placed next to one another while oriented vertically, each output conductor may be sized in proportion to the standard width (e.g., 40-45 inches long). Power devices 502 may, in some examples, be configured electrically similar to device 102 as in installation 100*a* and mechanically similar to device 202.

Figure 5B:
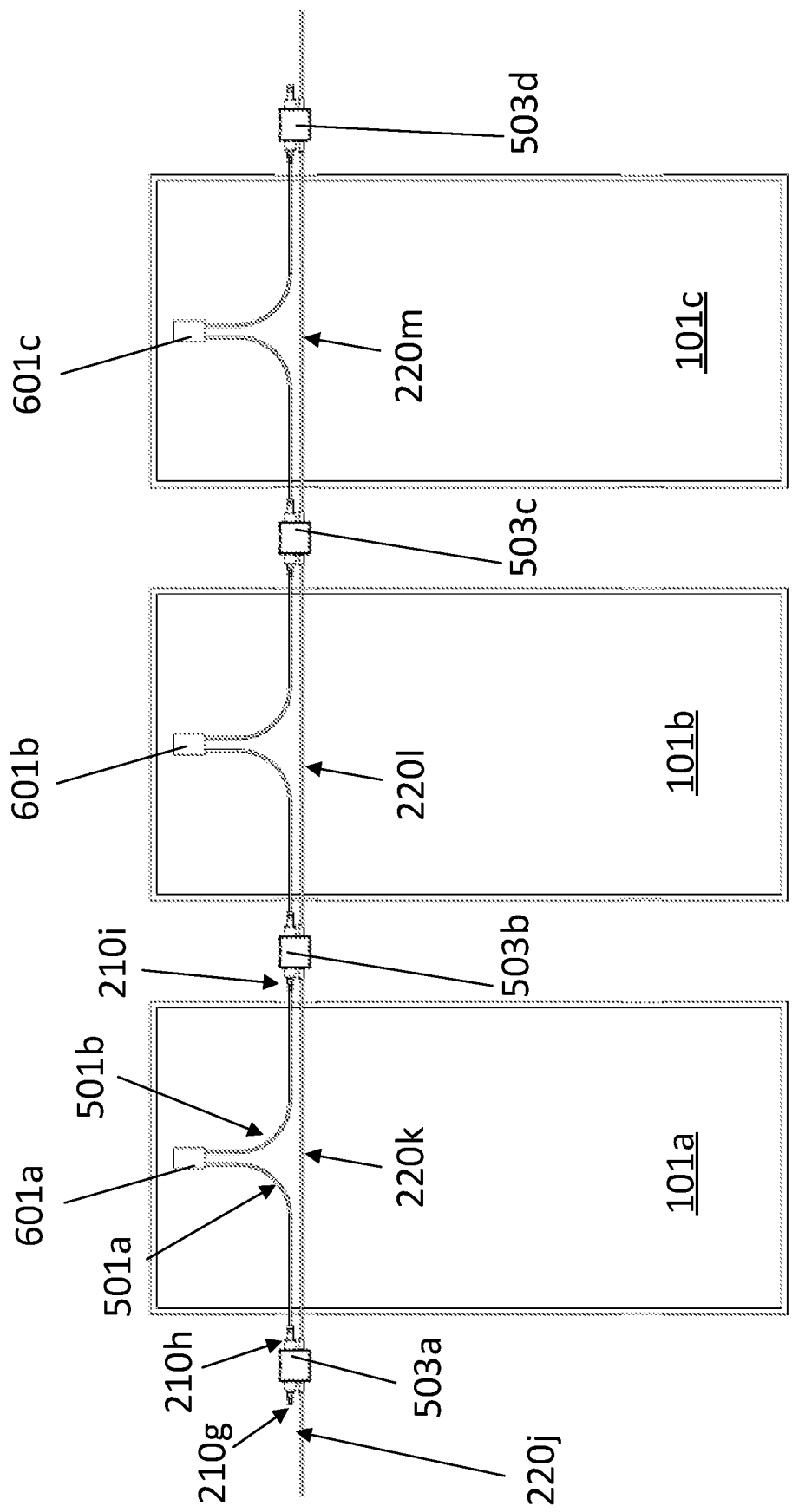

Reference is now made to FIG. 5B, which depicts a portion of a chain of power devices coupled to photovoltaic generators in a variation of the system. PV generator 101*a* may include junction box 601*a*, to which generator cables 501*a* and 501*b* are coupled. Power generated by the PV generator (e.g., 101*a*) is transferred via the junction box (e.g., 601*a*) to the generator cables, with one cable (e.g., 501*a*) coupled to input terminal (e.g., 210*h*) of a power device (e.g., 503*a*), and another cable (e.g., 501*b*) coupled to input terminal (e.g., 210*i*) of an adjacent power device (e.g., 503*b*). Adjacent power devices (e.g., 503*a* and 503*b*) may be coupled to one another by output conductor (e.g., 220*k*). Power devices 503 may each include circuitry 230 (not explicitly depicted in the figure) which may comprise various elements as described herein. Output conductor 220*j* may couple power device 503*a* to an adjacent power device on one side (not shown explicitly), with input terminal 210*g* being coupled to an adjacent power cable (also not shown explicitly). The input terminals and output conductors of adjacent power devices (e.g., 503*b*, 503*c*, 503*d*) are not illustrated explicitly in the figure. Conductors 220*a*, 220*b* and 220*c* may be of appropriate length to enable fast and easy coupling of each of the power devices to two adjacent photovoltaic modules, without overuse of conductive cables. For example, if PV generators 101*a* 101*b* and 101*c* are of standard width (e.g., 39 inches) and are placed next to one another while oriented vertically, each output conductor may be of a size proportional to the standard width (e.g., 40-45 inches long). Power devices 503 may be configured electrically similar to device 103 as in installation 100*b* of FIG. 1B and mechanically similar to device 203.

Referring to FIG. 5C, illustrative variations may include a plurality of PV power devices 504a-c, each featuring two input terminals 106 (only labeled explicitly for power device 504a) coupled to a photovoltaic generator's junction box (e.g., 601a). The photovoltaic power may flow via the junction box and input terminals to the PV power device. The power device may include output conductor 105a, which is coupled via a T-connector to a ground bus, and output conductor 105b, which is coupled via a T-connector to a power bus. The ground bus and power bus may be coupled to the output conductors of each power device in the chain, thus coupling all the photovoltaic modules in the string in parallel. The distance between adjacent PV power devices may enable them to be coupled to adjacent PV generators in a photovoltaic installation. The power devices may be coupled to the two conductors (the ground and power buses) at the time of manufacturing, and may be compactly stored along with the conductors, enabling fast and easy deployment. Power devices 504 may be configured electrically similar to device 122 as in installation 100d and mechanically similar to device 205.

String Products

Following are further details of an integrated string of power devices. The integrated string of power devices may comprise a plurality of power devices connected together with a plurality of cables configured to electrically connect the power devices, thereby forming a string (also referred to as a chain) of power devices. The power devices at either end of the string may further be connected to an additional length of cable, e.g., having the same length or longer as the cables connected between adjacent power devices in the string. The additional lengths of cables may be unterminated at the distal end from the power converters and used for connecting the string of power devices to a central power device (e.g., a combiner box, power inverter, etc.). For example, multiple power devices are connected by repeatedly connecting (e.g., via soldering, crimping, etc.) an electrical cable between a terminal of one power device to a terminal of an adjacent power device in the string (e.g., for implementing a string illustrated in FIGS. 1A-1C, 1E, 2A-2C, 3, 4A, 4C, 5A, and 5B). In some variations, one or more additional cables may be connected between adjacent power device (e.g. for implementing a string as illustrated in FIGS. 1D, 4B and 5C). Thus, the string of power devices will comprise a plurality of power devices arranged spatially in an order along the string with adjacent power devices in the order being permanently connected (e.g., prefabricated, designed to not be disconnected in the field during installation of the system and/or bonded by soldering or crimping) by one or more of the plurality of cables, and optionally, power devices at the ends of the order being connected to one or more unterminated cables. By combining the cables and power devices into a single apparatus, the cost of the system may decrease due to lower number of components, and the reliability of the system may increase due to few moving parts and mechanical connections. An order of power devices on a string of power devices may include a physical order of the devices, or an order of power device identification numbers or codes. The physical order is the order of the power devices as they are physically connected along a string of power devices. For example, the first power device on the string is first along the physical order.

Referring now to FIG. 6, some illustrative variations include a storage device used to store a string of power devices in a way that enables convenient storing and fast and easy deployment of the chain of power devices. A chain of photovoltaic power devices may comprise PV power devices 102 coupled to one another by output conductors 220. The chain may be stored by being wound around storage device 400. In the variation depicted in FIG. 6, storage device 400 is a cylindrical reel, though other shapes may be using for winding. A cylindrical shape may make deployment easier, as a cylindrical reel may be rolled along the ground (or rotated about a spindle) in a photovoltaic installation. The storage device may be designed to allow the chain of power devices to be packaged efficiently. For example, if the storage device is similar to the cylindrical reel depicted in FIG. 6, the diameter of the reel may be chosen considering the length of the conductors coupling the power devices, so that when the chain is wound around the reel, the power devices may be located next to one another on the reel, pressed tightly together for compact storing. While FIG. 6 illustrates PV power device 102 and conductors 220, any arrangement of a string of power devices described above (e.g., as in FIGS. 1A-1E, 2A-2C, 3, 4A-4C, and 5A-5C) may be packaged with storage device 400.

As noted above, a chain of power devices may further incorporate extra lengths of cable connected to the first and last power devices in the order of power devices in the chain. The extra lengths of cable may be used to connect the chain of power devices to a central power device, such as a combiner box or an inverter. The extra lengths may be connected to the inverter, for example, by soldering, crimping, welding, screw terminal, push terminal, MC4 connector, etc. For example, extra length end cables of a chain may be soldered or crimped to the input terminals of an inverter to prevent arcing, lower terminal resistance and cable losses, lower maintenance of terminals (such as regular tightening of screw terminals), and lowering the cost of the system components.

The unterminated end cables of a string of power devices may come in a variety of standard lengths, or may be customized for a particular installation. For example, strings of power devices may be manufactured having an extra 30 feet, 50 feet, 100 feet or 500 feet of unterminated end cables. As another example, a solar site design plan may be submitted to a manufacturing facility, and the manufacturing facility may manufacture prewired strings of power devices having customized wire lengths between each power device and customized end cables at each end of each string of power devices. The unterminated end cables may optionally include a connector (e.g., MC4 connector) or other connection device at the distal end from the power device.

Mapping

An aspect of a chain of power devices may be a predetermined order of the devices. For example, a device (e.g., load, junction box, inverter) connected to a string of power devices may query device identification codes of the power devices (deviceIDs) of the string.

The device IDs may be set according to a physical order in the order of the devices along the string. For example, a physical order may be determined (e.g., during manufacturing of a string of power devices when each power device is connected to the string, or after manufacturing of the string) the identifier of the power device is recorded and associated with the particular order of that power device in the string. The recording is repeated respectively for all the power devices on a string including the first power device. From the recordings, a list is generated and stored (e.g., in a digital repository) of the identifiers and associated physical locations in the order of the power devices. The identifiers of the power devices connected to the string may be arranged to be in a sorted order according to the numerical value or alphanumerical code. For example, the identifiers may be numbers and the identifier of each added power devices is greater than the identifier of the power device previously-added power device. Similarly, the identifiers may be alphanumeric codes and the list of identifiers may be arranged according to the physical order and are also in a sorted order. For example, as the power devices are added to the string, each power device is assigned a unique identifier and that unique identifier is stored on the device, such as stored on a computer-readable, non-volatile memory. For example, when a string of power devices is electrically connected to a central power device (for example an inverter), a processor may command the inverter to collect the identifiers of all power devices. By sorting the collected identifiers, the processor may determine the physical order of the power devices. In some examples, a look up table may be used to arrange a list of collected identifiers in the physical order along the string. For example, a look up table may convert a unique identifier to a position or location on the string, such as the distance (e.g., physical or logical) from the power device to the end of the string. For example, a look up table may convert a unique identifier to a number indicating the position on the string.

One or more of the power devices, based on the query may transmit a response that includes that power device's identification code, and optionally, additional information associated with the power device. For example, an inverter (or other connected device) may transmit a query to a plurality of power devices in a string, and one of the power devices may respond with a message including information associated the power device or power generator connected to the power device. Based on the message, the inverter (or other connected device) may transmit a notification to a technician (via a technician's device such as a smart phone) of the physical location of the power device that may need attention, such as maintenance, cleaning, replacement, etc.

Figure 8A:
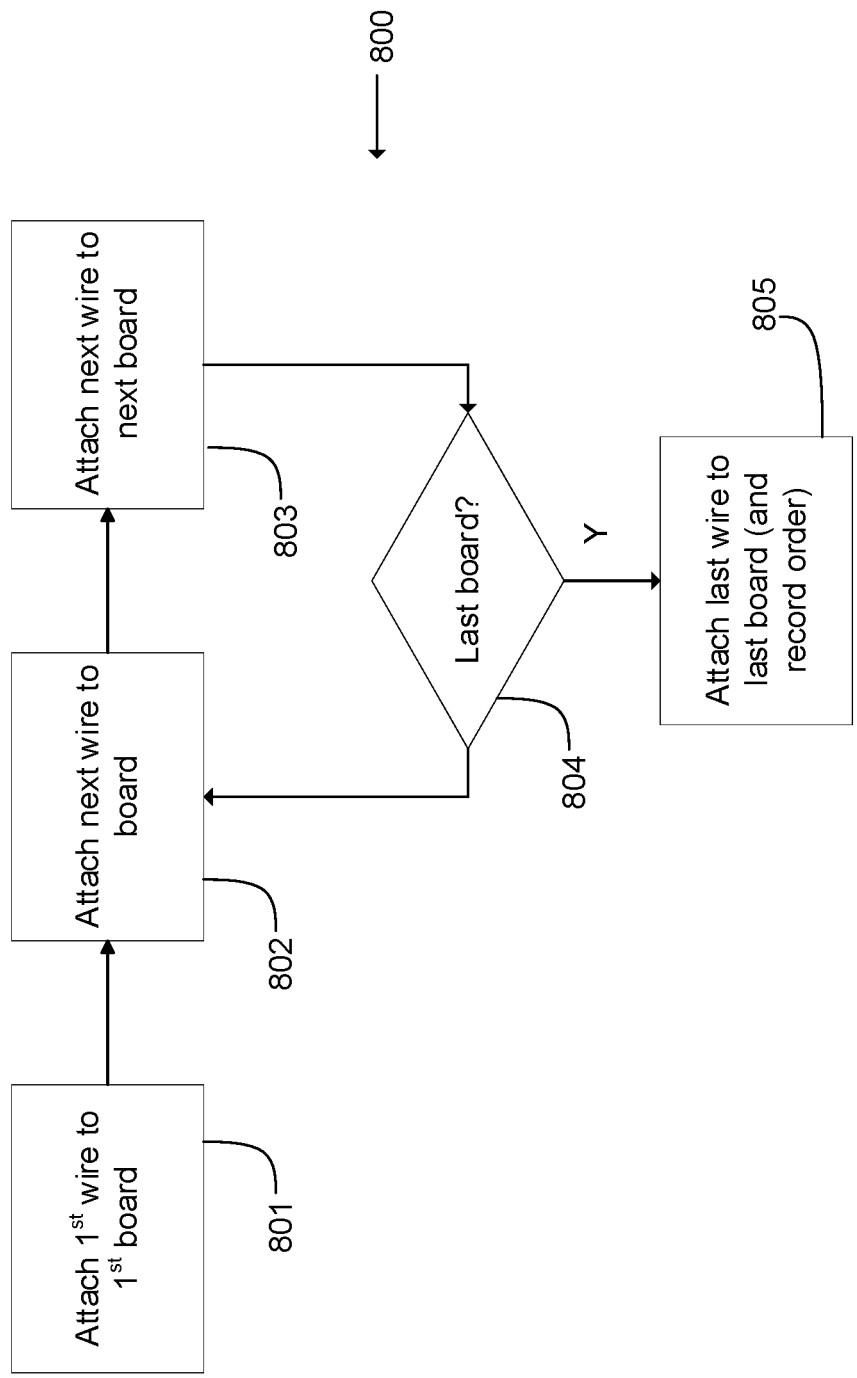
FIGS. 8A-8C depict flowcharts of methods for manufacturing and using a string of power devices.

Regarding FIG. 8A, when the device string is manufactured according to flowchart 800, a first length of wire is attached to a first device board at step 801, one end of a next length of wire is attached to the first device board at step 802, and the other end of the next length of wire is attached to a next device board at step 803. When it is determined that the next device board is not the last board at step 804, the next wire is attached to the board as at step 802, and so on. When it is determined that the next device board is the last board as at step 804, a last length of wire is attached to the last device board as at step 805.

The power devices may be tested during manufacturing. The power devices may include computer logic (e.g., a microprocessor with computer-readable storage), and have a deviceID stored in the computer logic, such as in a computer non-volatile memory, disk, repository, etc. The deviceID may be written to the device during manufacturing. The order of the deviceIDs of the power devices attached during manufacturing along the string may be recorded, and stored on a repository as at step 805, such as for later use during a system installation as in FIG. 8B.

Figure 8B:
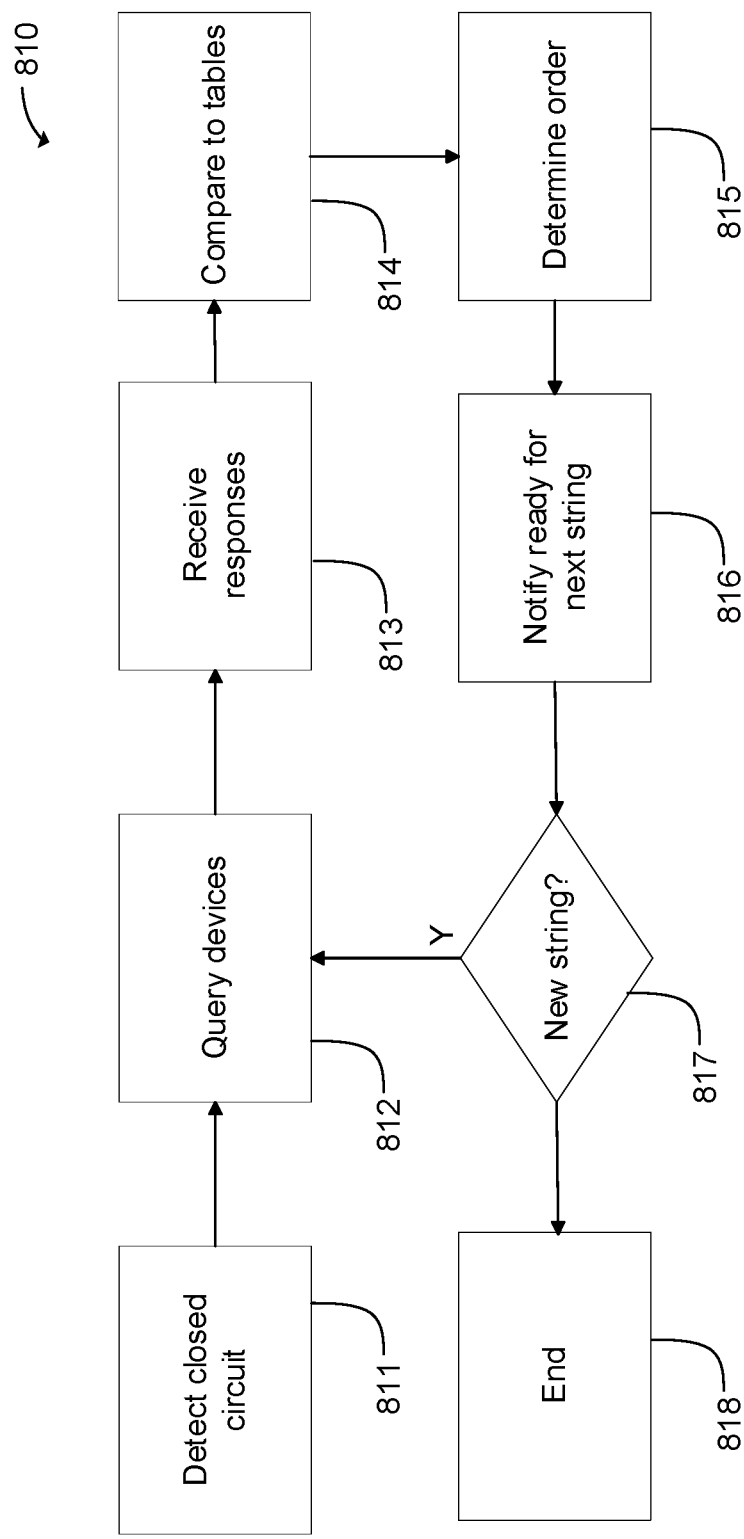

Regarding FIG. 8B, when multiple device strings are connected in parallel to an inverter (or other system power device) as at flowchart 810, the inverter may determine the association of each device to one of the multiple strings according, for example, to the flowchart 810. For example, during installation, a system power device (e.g., an inverter, a junction box) may include multiple sensors at input terminals, where the input terminals may be configured to electrically connect with the multiple strings. When the chain of power devices is electrically connected to the power generators, the first string of power devices (including generators) is connected to the input terminals of the system power device. When the system power device detects (at step 811) a closed circuit, such as by voltage, current, and/or impedance sensors across the input terminals, the system power device may query (at step 812) the devices on the first string across the electrical connections. For example, the system power device may query each power device of the string, record a response from each device including the deviceID, and compare the deviceIDs of the responses to a list of deviceIDs retrieved from an external repository. For example, the system power device may repeated query each power device of the string, record the time each took to respond (such as in millisecond or nanosecond time resolution), and determine the order based on the response times. The query is complete once the responses are received at step 813. When the query is complete, the deviceIDs may be extracted from the responses, and these may be compared at 814 with tables of other devices connected to the system power device, such as tables of other devices and/or strings of power devices connected to the system power device. The deviceID order on the first string may be determined at step 815, for example based on the reply times determine the distance to each power device and from the distance determine the deviceIDs order. Determining the deviceID order may be based on a look-up table retrieved from an internet-connecter, computer-readable, non-transitory repository. For example, when the string is manufactured, for example, according to the flowchart 800 of FIG. 8A, the order of the power device boards may be recorded as at step 805. When the queried devices respond to queries, the responses may contain DeviceIDs which in turn may be compared to a retrieved repository. The device order of the string may be determined from the order recorded in the repository. The system power device may notify at step 816 the installer or operator to install a second string, and the process repeated. When a new string is connected to the system power device, the responses received from the query may include the deviceIDs from both the previously connected and the new strings, and the previously connected deviceIDs may be subtracted to detect the new string deviceIDs. The new string deviceIDs may be used to subsequent determine the string ordering as with any of the techniques described for the first string. For each new string connected, the string order is determined in this same manner, until no new strings are connected and the process ends as at step 818.

Figure 8C:
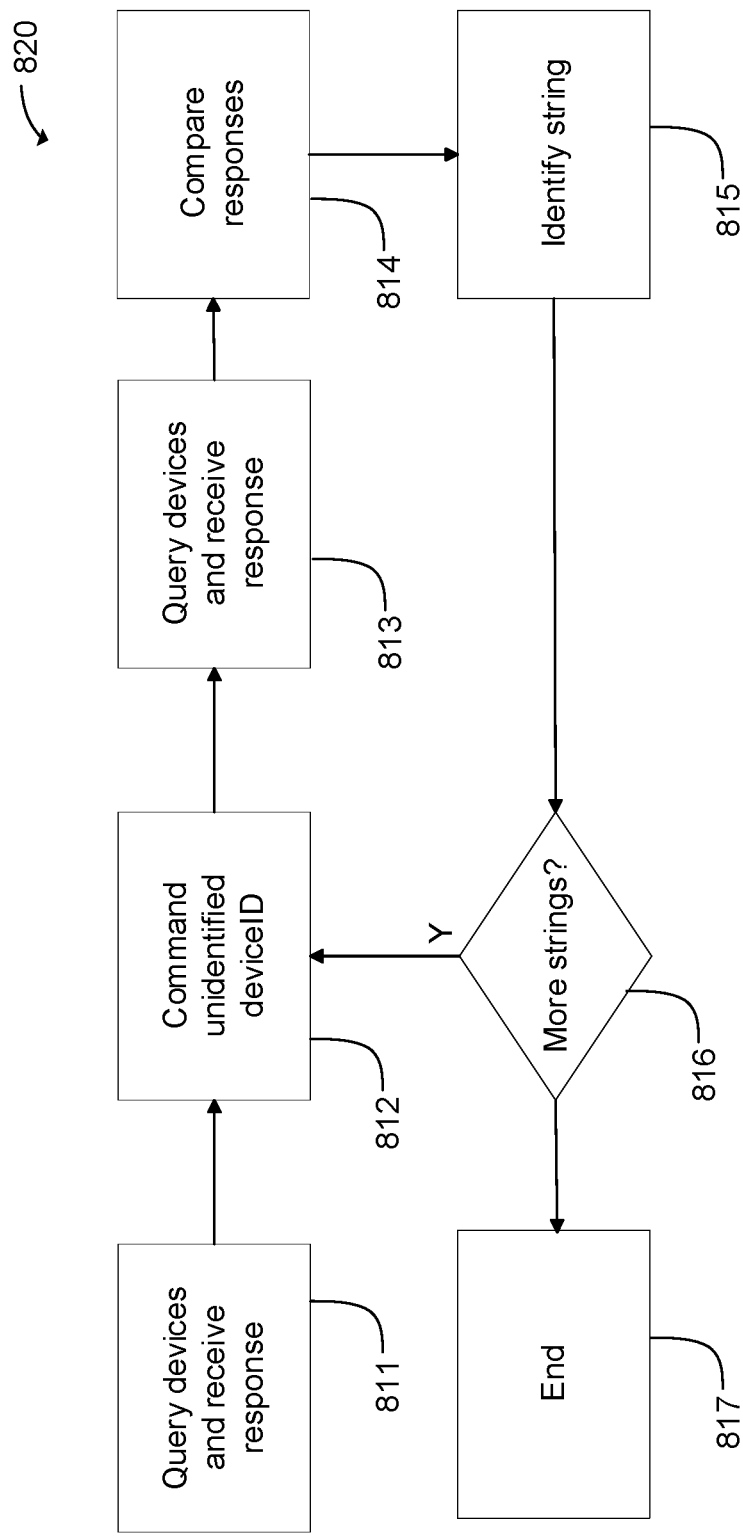

Regarding FIG. 8C, determining the association of multiple devices to one of several parallel connected strings may be performed using electrical behavior method 820 of the power devices in the strings. For example, when the complete power PV system (e.g., comprising multiple strings of power devices) is assembled, and connected to a system power device (e.g., inverter), the system power device may set a voltage or current across the parallel strings. The system power device may send a query (at step 821) to the power devices in the strings and receive (at step 821) a response from the queried devices including data, such as deviceID, device input and/or output electrical parameters, internal sensor data, external sensor data, or the like. The system power device may select a first one of the deviceIDs, and command (at step 822) that power device using the deviceID to change an electrical parameter, such as impedance, voltage, and/or current. In a response to the change of the electrical parameter, the other power devices on the same string may adjust a corresponding electrical parameter. The system power device may query (at step 823) the power devices in the strings, and receive (at step 823) new power device data, including new values for the corresponding electrical parameter from the power devices of the same string. By comparing (at step 824) the new data to the previous data (from before the electrical parameter change) the other devices on the same string as the device that was commanded may be identified (at step 825). When more unidentified deviceIDs exist (at step 826), the process may be repeated by commanding a new, unidentified deviceID, and thus the other strings may be determined using one of the methods described for the first string. When no more unidentified power devices are connected to the inverter the method ends (as at step 827).

For example, electrical determination of string association for power devices on parallel string may be performed using impedance changes to some of the devices, and injecting a voltage or current signal to the string. An electrical response to the signal may be detected based at the system power device or other power devices on the same and/or parallel strings. The electrical response in this example may be analyzed to indicate the string association and/or ordering of the devices on the parallel string, such as by a processes of elimination, measuring receipt and/or response time, etc.

EMI

An aspect of a chain of power devices may relate to electromagnetic interference (EMI), which may include radio-frequency interference (RFI) when in the radio frequency spectrum. A disturbance generated by an external source that affects an electrical circuit by electromagnetic induction, electrostatic coupling, or conduction, may be considered EMI. For example, a disturbance may degrade the performance of a circuit or may even stop a circuit from functioning. A common problem in some PV systems is EMI leakage through the connectors. A pre-manufactured string of power devices manufactured without these connectors may allow better EMI protection between the power devices and other devices. For example, a PV cable (e.g., 220) may be shielded, and extend the EMI shielding to one or more power device circuits, For example, conductively connecting the EMI shield of the cable to the EMI shield of the of the power device without gaps that EMI may pass through will EMI protect the circuits and cable. By continuing the EMI shield connections between cable EMI shields and power device EMI shields, the power device circuits of the string of power devices is EMI protected.

A string device may be configured with electrical connections (for example, soldered or crimped connections) between the cables and power device boards that reduce EMI leakage out from the cable or power device. For example, a shielded cable soldered to the printed circuit board (PCB) of the power device may better protect the cable and power devices from external EMI entering the power device interior cavity by making the continuity of the EMI shield extend as much as possible around the power conducting wires and circuits. Similar examples may use crimping, adhesion, clamping, or the like to form and EMI-leakage-preventing seal between the EMI cable shield and the EMI power device shield. For example, a shielded cable may connect electrically or connect conductively to power device to prevent EMI leakage between the two shields. For example, when the power device has an EMI shield (which may be incorporated into a housing for example) the cable shield may be electrically (conductively) connected to the device EMI shield. The EMI shield may be isolated or connected to ground, such as using a single point.

As disclosed herein, the shields of the cables and power deices of a string may be electrically or conductively connected together as much as feasible. For example, the cables and power device shields may be connected by soldering, crimping, coupling, connecting, clamping, etc. Optionally, one or more shields of the cables and/or power devices may be connected at one end or the other end to a ground reference, such as an earth ground, a return line, a power line, and/or ground of the system power device (e.g., the casing of the inverter, which is tied to, for example, earth ground.)

Extra Wire(s)

The cables between the power devices along the chain may comprise one or more additional conductors mechanically connected to the power electrical conductor, such as small gauge, low-current conductors. For example, EMI shielding may be used as a single wire conductor as it may form a continuous conductor across all power devices of the chain. The one or more additional conductors may be used to assist with sensing and/or mapping between the power devices. The one or more extra conductors may be used for communication between the power devices or between the power devices and a central power device. For example, a single wire may be used for communication using a single switch that sets the wire to a constant voltage when closed, and when the switch is open a zero or non-constant voltage is measured on the wire. For example, the additional conductor can be used as a voltage reference for measuring the voltage of the output terminals of the power devices along the string. For example, the additional conductor is connected to each power device using a switch, and each power device also has a voltage sensor to measure the voltage of the extra wire with reference to another of the power devices. For example, an 8-wire Ethernet cable may be embedded in the electrical cable between the power devices. For example, a series of sensors may be positioned along the wire and/or at each power device, and the sensors may measure electrical parameters of the power devices, cable, system, etc.

Spare Devices

An aspect of a chain of power devices may be utilization of one or more spare power devices either preplanned and incorporated into the string apparatus or integrated into the installation method using a special hardware connector. The hardware connector may be a shielded PV cable with connectors at the ends. The cable may be configured so that the input sides of the power device are physically covered and electrically disconnected. When one of the devices of the chain malfunctions, the power devices may be shifted so that the malfunctioning device is disconnected from the associated first panel, the power device from the next panel is shifted to the first panel, and so on, repeatedly, until the last panel, where the spare power device is used. In this way, spare power devices located at the ends of the chain may be used to replace malfunctioning power devices connected to the PV panels.

A spare power device incorporated into the string of power devices may be connected to a PV panel to replace a malfunction power device using electrical cables connecting the PV panel and the spare power device. For example, a malfunctioning power device may be disconnected from the associated PV panel, and extension cables connected to the PV panel cables so that the PV panel is electrically connected to a spare power device at an end of the chain of power devices. One or more spare power devices may be incorporated into the chain of power devices, so that there are spare power devices in the case of malfunction of one or more of the power devices. For example, shifting the power devices, or using extension cables from the spare power device to the PV panel, allows repair of the malfunctioning power device without replacing the chain of power devices.

One or more connectors may be incorporated along the chain of power devices, such as MC4 connectors, such that a connector is positioned along the chain every certain number of power devices, thereby forming a subset of power devices between connectors. For example, an MC4 connector is positioned along the cable between every $5^{th}$ power device. The number of power devices between connecter may be between 2 and 100, depending on the requirements and system capacity. The connectors may allow easy maintenance when one or more power devices malfunctions, by allowing to replace the subset of power devices, rather than replacing the complete chain or manually soldering one or more replacement power devices instead of the malfunctioning ones.

Reference is now made to FIG. 7A, which depicts illustrative aspects of a string of power devices coupled by conductors with prefabricated (e.g., permanent connections, such as soldered connections). A system for power generation 700 may comprise a central power device 110E. Central power device 110E may be electrically connected to a power network including shielded conductors between power devices, where each conductor includes an EMI shield incorporated into the casing of the conductor. End cables 710H and 711H, also including an EMI-shielded conductor, connect between central power device 110E and power busses 710E (low voltage or return bus) and 711E (high voltage bus). One or more chains of power devices 316a . . . 316n, comprising EMI-shielded conductors between the power devices, may be connected between low-voltage bus 710E and high-voltage bus 711E. By way of example, power device chain 316a may be configured as installation 100a of FIG. 1A and power device chain 316n may be configured as installation 100b of FIG. 1B, but the electrical configuration of other chains may conform to other installations, as 100d, 100e, or the like. Power device chains 316a . . . 316n may comprise a series of power devices, such as 109a, 109b, 109c, etc., up to 109t in the examples of FIG. 7A. Each of power devices 109a, 109b, 109c, etc., up to 109t may be connected to a PV panel 101a, 101b, 101c, . . . up to 101t. Each power device 109a, 109b, 109c, etc., up to 109t may comprise an identification number or code, and the identification number or code may be used to determine the order of the power devices along the chain of power devices, as described herein. While the devices, generators and strings are designated with specific ranges of lower case suffixes (e.g., a through n, a through j, k through t), the number of devices, generators, and strings are not limited to these ranges and may include any number of elements.

Power device chains 316a . . . 316n may include one or more connector pairs, such as interconnections, as at 701A/B and 701C/D. A chain of power devices, as at 316a . . . 316n, may comprise interconnections (e.g., connectors), such as 701A/B and 701C/D, to allow replacement of a portion of the power device chain. For example, connectors are located between power device 109 and each PV generator 101. When a specific device fails, the connecters are used to disengage the failed power device from the panel, and the power devices between the failed one and the spare one are shifted one panel over. After the shift of power devices the failed device is now a spare device and the spare device is connected to the closest panel.

Interconnections may be incorporated into selected conductors between the power devices along the chain, such as one interconnection every other conductor, every third conductor, every fourth conductor, every fifth conductor, etc. For example, an interconnection is incorporated into one conductor out of a group sequential power devices, such as a group of power devices that number between 2 and 20 power devices, allowing easy replacement of a portion of the chain containing the failed power device.

Power device chains 316a . . . 316n may include one or more spare power devices as at 109d, 109k, and 109o. A spare device in the middle or the end of a chain of power devices may be used to replace a malfunctioning power device. For example, by swapping positions of the power devices along the chain, a spare power device my replace the operation of a malfunctioning power device. For example, when power device 109l malfunctions, PV panel 101l may be connected to spare power device 109k. For example, separate cables may be used to connect the PV panel of the malfunctioning power device to the spare power device. For example, when power device 109m malfunctions, PV panel 101m may be connected to spare power device 109k using extra conductors the may run from the PV panel 101m to power device 109k.

Figure 7B:
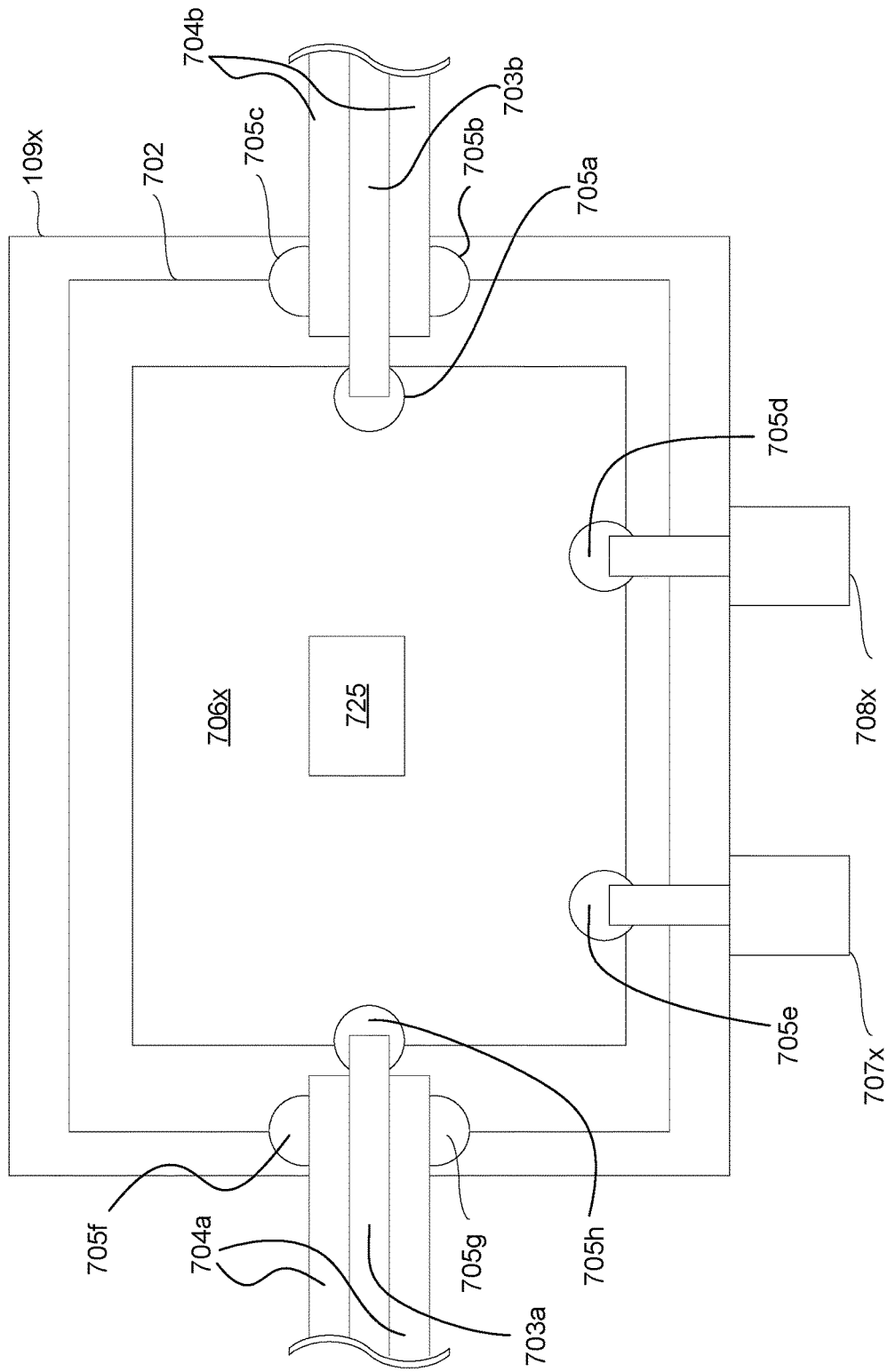
FIG. 7B depicts internal features of a power device from a string of power devices coupled by conductors.

Reference is now made to FIG. 7B, which depicts illustrative aspects of the internal features of a power device 109x from a string of power devices coupled by conductors with permanent connections. The power device of FIG. 7B is an example device comprising the common features of power devices 109a . . . 109t (or any of the power devices discussed herein), and as such is designated 109x where the x may be replaced by a . . . t to designate any of the power devices of FIG. 7A. PCB 706x comprises an identification code 725 (e.g., a unique identifier) which uniquely identifies the power device in the chain of power devices, and may be used to determine the order of the power devices in the chain. The unique identifiers may be based on a look-up table (LUT) stored on a computer-readable non-transitory repository. The unique identifiers and the LUT may be retrieved by a processor associated with the string of power devices. The processor may determine the order based on the plurality of unique identifiers and the LUT.

Power device 109x comprises an EMI shield 702 encompassing a printed circuit board 706x (PCB). EMI shield 702 may form a continuous or partial EMI barrier with EMI shields 704a and 704b of the conductors 703a and 703b. For example, EMI shield 702 may be joined to cable EMI shield 704b using a material or process that is configured to preserve the continuity of the EMI shields. For example, EMI shields 702 and 704b may be joined using an at least partially conducting joining material 705b and 705c, such as solder, a conducting adhesive, a conducting polymer, etc. Similarly, conductor 703b may be electrically connected to PCB 706x using solder 705a. Similarly, Connectors 707x and 708x may be electrically connected to PCB 706x using solder 705d and 705e respectively. Similarly to the connection between cable EMI shield 704b, EMI shield 704a may be connected to EMI shield 702 using a material or process 705f and 705g that is configured to preserve the continuity of the EMI shields, such as welding, solder, conducting adhesive, etc. Similar to conductor 703b, conductor 703a may be electrically connected to PCB 706x using solder 705h (or other connection device such a crimp, or screw).

Figure 7C:
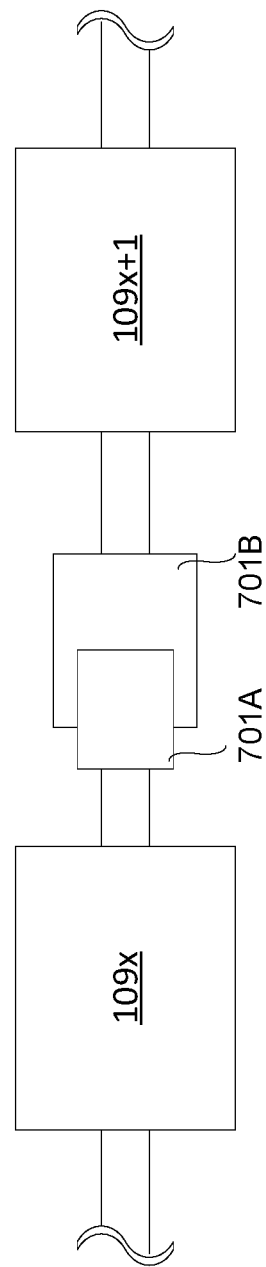
FIG. 7C depicts intermittent terminal connectors along a string of photovoltaic power devices coupled by conductors.

Reference is now made to FIG. 7C, which depicts illustrative aspects of intermittent terminal connectors along a string of photovoltaic power devices coupled by conductors with permanent connections. For example, a chain of power devices are coupled with interleaved permanently connected (e.g., soldered, crimped, etc.) conductors, and every 5 conductors along the chain comprises a terminal connector 701A and 701B between power devices 109$x$ and 109$x$+1. When a power device malfunctions, the sub-string of power devices comprising the malfunctioning power device may be replaced by disconnecting the connectors at each end, removing the substring comprising the faulty power device, and connecting a new substring of power devices. Similarly, a terminal connector may be included in one of every the X power devices, where X, for example, may be a number of devices between 2 and 10 power devices.

In some variations, an apparatus includes a plurality of power devices and a plurality of photovoltaic generators connected to the power devices. The power devices may include an input terminal, a common terminal and first and second output terminals. An input terminal of a first power device may be connected to a first power source terminal of one of the plurality of photovoltaic generators, a first output terminal of a second power device may be connected to a second power source terminal of one of the plurality of photovoltaic generators, and a second output terminal of the second power device may be connected to a common terminal of the first power device. The first and second output terminals may output a common output voltage, with a total output current flowing through the power device (e.g. a photovoltaic string current where the power device is part of a photovoltaic string) being divided between a first output current flowing through the first output terminal and a second output current flowing through the second output terminal. The first output current may further flow through a connected photovoltaic generator, and in some variations, the power device may be operated to provide a first output current corresponding to a Maximum Power Point current of the photovoltaic generator. The power device may be operated to provide a second output current corresponding to a differential current between the total output current and the first output current.

In some variations, the first output terminal may comprise a connector designed to be connected to a photovoltaic generator terminal, for example, using an MC4™ connector. In some variations, the second output terminal and the common terminal may comprise conductors preconnected to the power device and other power devices (e.g. conductors 220*c* and 220*d* of FIG. 2A, or conductors 220*a* and 220*b* of FIG. 2B). Dividing the current of a power device into two or more portions may create smaller current portions that allow for cables which may be thinner and cheaper than those which would otherwise be needed.

At least one of the power devices may include a combiner box configured to couple to a plurality of photovoltaic strings and to combine power from the plurality of photovoltaic strings. One or more power devices may include one or more sensors or sensor interfaces configured to measure or to receive measurements of one or more parameters associated with the plurality of photovoltaic generators. One or more power devices may include one or more safety switches configured to disconnect and/or short circuit the photovoltaic generators upon detection of a predefined potentially unsafe condition or in response to a manual trigger. The manual trigger may include activation of a rapid-shutdown switch or button.

In some variations, the power device may include output conductors configured to transmit and/or receive PLC signals. A communications link (e.g. may be integrated with output conductors and may be communicatively coupled to a communication device. A thermal sensor device may be integrated with output conductors and may provide temperature measurements to a control device associated with the apparatus. The thermal sensor device may include a thermocouple device and/or a linear heat detector. Temperature measurements by the thermal sensor device may be obtained at one or more locations along the output conductors.

In some variations, an apparatus includes a plurality of power devices and a plurality of conductors connecting, each connecting one power device to at least one other power device. A first conductor may be connected between an input of a first power device and a first output of a first power generator. A second conductor may be connected between an output of the first power device and a second output of first power generator. A third conductor may be connected between an output of a second power device and the common terminal of the first power device. The conductors may be internally connected to circuitry inside a respective power device. At least one of the plurality of conductors may, at a first end, be soldered or connected via a screw to the power device. A second end of the conductor may be soldered or connected via a screw to another power device. Specifically, the first end and second end may each be connected to a power converter or monitoring device in a respective power device.

Other variations may consider alternative storage techniques, such as packing power device chains into boxes, winding the chain around multiple poles, and the like.

Although selected variations of the present invention have been shown and described, it is to be understood the present invention is not limited to the described variations. Instead, it is to be appreciated that changes may be made to these variations without departing from the principles and spirit of the invention, the scope of which is defined by the claims and the equivalents thereof. Further, elements of each variation may be combined with elements from other variations in appropriate combinations or subcombinations. For example, conductors 234*a-b* of FIG. 4C may be located at a same side of lid 232, similarly to as shown with regard to terminals 210*c* and 210*d* of FIG. 2A. As another example, a chain of power devices may connect a plurality of photovoltaic generators in parallel, as shown in FIG. 5C, wherein each of the plurality of photovoltaic generators comprises a plurality of serially connected photovoltaic panels (as shown in FIG. 1E) or photovoltaic cells.

In illustrative variations disclosed herein, photovoltaic generators are used as examples of power sources which may make use of the novel features disclosed. Each PV generator may comprise one or more solar cells, one or more solar cell strings, one or more solar panels, one or more solar shingles, or combinations thereof. In some variations, the power sources may include batteries, flywheels, wind or hydroelectric turbines, fuel cells or other energy sources in addition to or instead of photovoltaic panels. Systems, apparatuses and methods disclosed herein which use PV generators may be equally applicable to alternative systems using additional power sources, and these alternative systems are included in variations disclosed herein.

Figure 9A:
FIGS. 9A-9F are block diagrams according to various aspects of the present disclosure.

Further embodiments of the present disclosure are presented below with respect to FIGS. 9A-9F, 10A-10B, 11A-11B, 12A-12C, 13-14, 15A-15D, 16, 17A-17B, 18A-18G, and 19A-19C. Referring to FIG. 9A, illustrative photovoltaic installation 900 may include one or more photovol- (PV) generators 101. Each PV generator may be coupled to a one or more photovoltaic (PV) power device(s) 902. Each PV generator 101 may comprise one or more solar cells, solar cell strings, solar panels or solar shingles. In some embodiments, PV power device 902 may comprise a power conversion circuit such as a direct current - direct current (DC/DC) converter such as a buck, boost, buck-boost, buck+boost, flyback and/or forward converter, or a charge-pump. In some embodiments, PV power device 902 may comprise a direct current - alternating current (DC/AC) converter, also known as an inverter or a micro-inverter. In some embodiments, PV power device 902 may comprise a maximum power point tracking (MPPT) circuit with a controller, configured to extract maximum power from one or more of the PV generator(s) to which the power device is coupled. PV power device 902 may further comprise a control device such as a microprocessor, Digital Signal Processor (DSP) and/or a Field Programmable Gate Array (FPGA). In some embodiments, the control device may implement MPPT control discussed above (e.g. "perturb and observe" methods, impedance matching) for determining an optimal or preferred operating point for a connected power source.

In some embodiments, PV power device 902 may comprise circuitry and/or sensors configured to measure parameters on or near the photovoltaic generator(s), such as the voltage and/or current output by the photovoltaic generator (s), the power output by the photovoltaic generator (s), the irradiance received by the module and/or the temperature on or near the photovoltaic generator (s).

In the illustrative embodiment depicted in FIG. 9A, a plurality of PV power devices 902 are coupled to a plurality of PV generators 101, to form a photovoltaic string 905. One terminal of the resultant photovoltaic string 905 may be coupled to a power (e.g., direct current) bus, and the other terminal of the string 905 may be coupled to a ground bus. In some embodiments, the power and ground buses may be input to system power device 906. In some embodiments, system power device 906 may include a DC/AC inverter and may output alternating current (AC) power to a power grid, home or other destinations. In some embodiments, system power device 906 may comprise a combiner box, transformer and/or safety disconnect circuit. For example, system power device 906 may comprise a DC combiner box for receiving DC power from a plurality of PV strings 905 and outputting the combined DC power. In some embodiments, system power device 906 may include a fuse coupled to each string 905 for overcurrent protection, and/or one or more disconnect switches for disconnecting one or more PV strings 905.

In some embodiments, system power device 906 may include or be coupled to a control device and/or a communication device for controlling or communicating with PV power devices 902. For example, system power device 906 may comprise a control device such as a microprocessor, Digital Signal Processor (DSP) and/or a Field Programmable Gate Array (FPGA) configured to control the operation of system power device 906. System power device 906 may further comprise a communication device (e.g. a Power Line Communication circuit and/or a wireless transceiver) configured to communicate with linked communication devices included in PV power devices 902. In some embodiments, system power device 906 may comprise both a control device and a communication device, the control device configured to determine desirable modes of operation for PV power devices (e.g. power devices 902), and the communication device configured to transmit operational commands and receive reports from communication devices included in the PV power devices.

In some embodiments, the power and ground buses may be further coupled to energy storage devices such as batteries, flywheels or other storage devices.

PV power devices 902 may be coupled to photovoltaic generators101 such that each PV power device may be coupled to two PV generators and two other PV power devices, with the possible exception of one power device coupled to the ground or power bus. Similarly, each PV generator 101 may be coupled to two PV power devices 902, with the possible exception of one PV generator coupled to the ground or Power bus.

In some embodiments, the PV power devices may be "standalone" products, manufactured and packaged separately. In some embodiments, the PV power devices may be coupled to one another using conductors of appropriate length at the time of manufacturing, packaged and sold as an integrated unit, and deployed as an integrated unit when installing a PV system (e.g. photovoltaic installation 900). For example, power devices 902 may be assembled as an integrated string of power devices or part of a string of power devices, and may be coupled to one another during manufacturing. During installation, the integrated string may be simply strung out alongside photovoltaic generators 101 and each power device 902 may be coupled to a corresponding one of the photovoltaic generators 101 quickly and easily, forming photovoltaic string 905, or part of string 905.

Each PV power device 902 may comprise several terminals for coupling (e.g. connecting) to photovoltaic generators 101 and/or other PV power devices 902. In the illustrative embodiment of FIG. 9A, each PV power device 902 comprises four terminals: One "Vin" terminal for receiving power from the positive output of a PV generator 101, two "Vout" terminals for outputting power from the PV power device 902, and one "common" terminal for coupling to a "Vout" terminal of a different PV power device 902 or to a ground bus. In some embodiments, each PV power device 902 may feature a different number of terminals, and/or may feature four terminals configured differently, as will be illustrated in further embodiments.

Electrical current is routed along string 905 in two paths. A first path is formed by conductors coupling PV power devices 902 while bypassing photovoltaic generators 101, and a second path is formed by coupling photovoltaic generators 101 to PV power devices 902. For example, conductors 903b and 903c are connected between "Vout" and "common" terminals of PV power devices, without being directly connected to a PV generator. Conductors 904a, 904b and 904c are examples of conductors which connect PV generators 101 to terminals of a PV power device 902. Conductors deployed at either end of a PV string (e.g. PV string 905) may be connected in a manner different from the conductors forming the first and second paths. For example, conductor 903a is connected on one end to the ground bus and a terminal of a PV generator, and on the other end the "common" terminals of a PV power device 902. Conductor 903n connects the two "Vout" terminals of one PV power device 902 to each other and to the power bus, to combine the currents from the two paths and deliver the combined currents to the power bus.

Figure 9B:
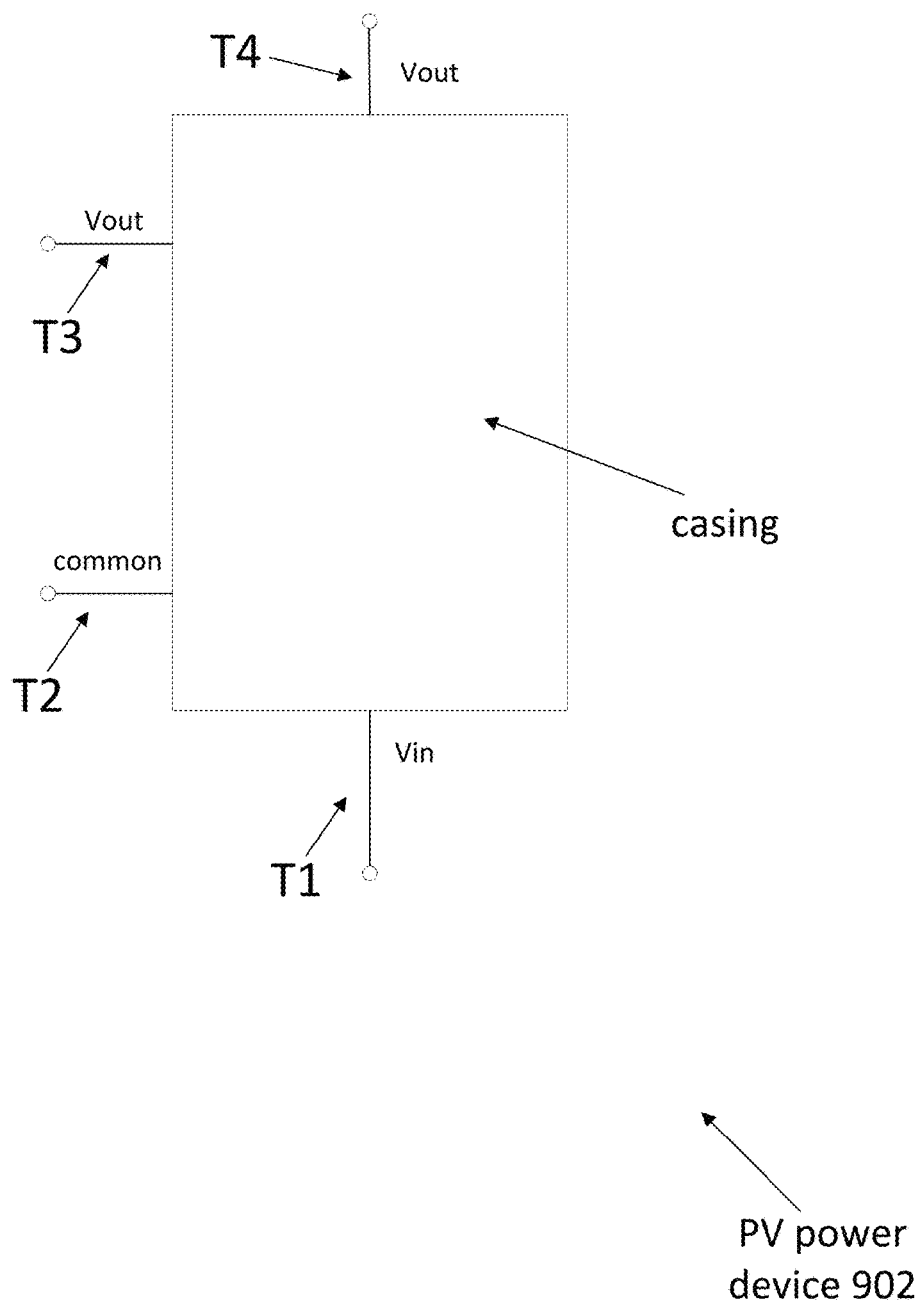

Reference is now made to FIG. 9B, which shows an illustrative embodiment of the external connection terminals of a photovoltaic power device 902, such as those featured in illustrative photovoltaic installation 900. PV power device 902 may include four terminals configured for electrically connecting to terminals labeled "Vin", "Vout" and "common" in FIG. 9A Terminal T1 may be configured to receive an input current from a photovoltaic generator or power device. Terminal T2 may be configured to be coupled to a photovoltaic generator and/or a photovoltaic power device, and may serve as a common terminal for both input and output. Terminals T3 and T4 may be configured to output electrical power (voltage and current) to additional PV generators and/or power devices. Terminals T3 and T4 may output the same voltage in reference to the common terminal T2, though they may output different current and different power. The physical location of the terminals in relation to the casing of the power device may be variously configured to allow for convenient coupling in a photovoltaic string. This illustrative embodiment features terminals T1 and T4 on opposite sides of the power device, with terminals T2, T3 along one side. Other configurations may be considered and implemented in alternative embodiments and are within the scope of embodiments included herein.

Figure 9C:
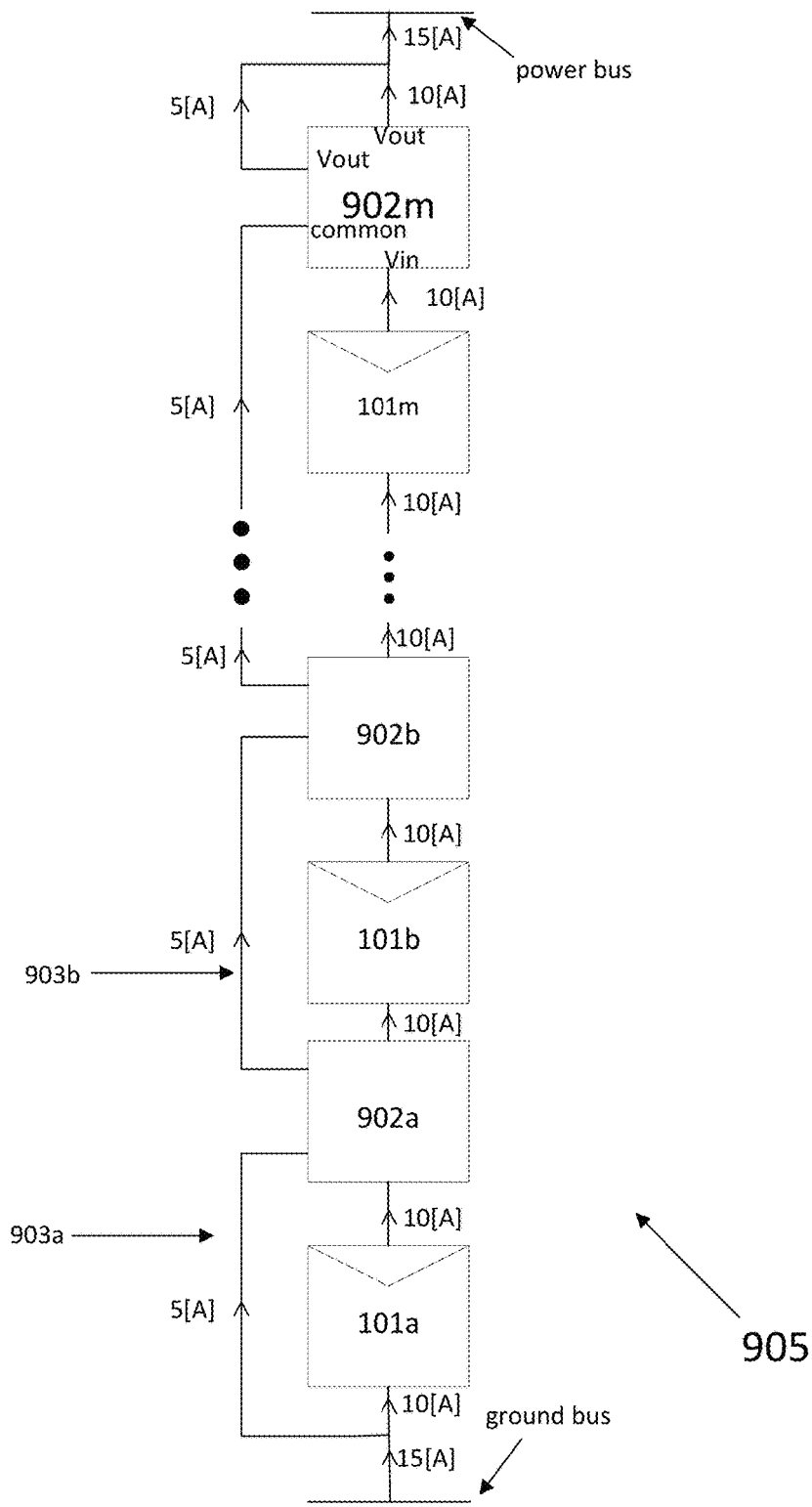

Reference is now made to FIG. 9C, which shows a numerical illustrative embodiment featuring a part of a photovoltaic string 905. Photovoltaic string 905 as depicted in this figure may be used as PV string 905 in FIG. 9A. PV string 905 may include a plurality of photovoltaic (PV) generators 101. Each PV generator 101 may be coupled to a one or more photovoltaic power device(s) 902. Each PV generator 101 may comprise one or more solar cells, one or more solar cell strings, one or more solar panels, one or more solar shingles, or combinations thereof. For example, a PV generator 101 may include a solar panel, two solar panels connected in series or in parallel, or eight solar panels connected in series. In some embodiments, PV power device 902 may comprise a power conversion circuit such as a direct-current-to-direct current (DC/DC) converter such as a buck, boost, buck+boost (e.g., a buck converter followed by a bust converter or a boost converter followed by a book converter), buck-boost, flyback and/or forward converter. In some embodiments, PV power device 902 may comprise a time-varying DC/DC converter, configured to output a different DC voltage at different times. For example, PV power device 902 may comprise a time-varying DC/DC converter configured to output a positive voltage triangular wave, or a voltage wave resembling a rectified sine wave. In some embodiments, PV power device 902 may comprise a direct current—alternating current (DC/AC) converter, also known as an inverter (e.g., a micro-inverter). In some embodiments, PV power device 902 may comprise a Maximum Power Point Tracking (MPPT) circuit with a controller, configured to extract maximum power from one or more of the PV generator(s) the PV power device is coupled to. PV power devices 902 may be coupled to photovoltaic generator 101 such that each PV power device may be coupled to two PV generators and two other PV power devices, with the possible exception of a PV power device coupled to the ground bus (e.g. beginning PV power device 902a) or a PV power device coupled to the power bus (e.g. ending PV power device 902m). Similarly, each PV generator 101 may be coupled to two PV power device 902, with the possible exception of one PV generator coupled to the ground or power bus, such as PV generator 101a depicted in FIG. 9C. The combined string current (i.e. the current flowing between the ground bus and the power bus) may be, in this illustrative embodiment, 15[A]. In other embodiments the string current may be higher or lower. Each photovoltaic generator 101 may operate at a current of 10[A]. The full string current may be routed through two paths, one path flowing through the PV generators 101 and carrying 10[A], the other path bypassing the PV generators and flowing from one PV power device to another. In the illustrative embodiment shown in FIG. 9C, the string bypass path may be comprised of conductors 903a, 903b etc. Conductor 903a may route 5[A] from the ground bus to beginning PV power device 902a, bypassing PV generator 101a. Bypass path 903b may be coupled to an output of PV beginning power device 902a and carry 5[A] to PV power device 902b, bypassing PV generator 101b. Additional bypass paths may be similarly coupled, to route 5[A] through the string while bypassing the PV generators. In some embodiments, the current flowing through the modules may vary from module to module and from time to time, and the current flowing through the bypass paths may similarly vary. FIG. 9C illustrates an illustrative embodiment in which all PV generators 101 (e.g. 101a, 101b etc.) are operating at a maximum power point current of 10[A]. In some operating conditions, different PV generators may have different maximum power points such that different PV generators conduct maximum-power currents of different magnitudes, as will be described in other embodiments disclosed herein.

Different PV generators may operate at different power points, even in the same PV installation. As a numerical example, two PV generators may be capable of outputting 300[W], with one PV generator operating at a maximum power point of 20[V] and 15[A], and another PV generator operating at a maximum power point of 30[V] and 10[A]. As a different example, two PV generators may be capable of generating different maximum power levels. For example, one PV generator may output 300[W] and operate at a maximum power point of 20[V] and 15[A], while a second PV generator may be partially shaded and/or dirty, and be capable of outputting only 266[W] at a maximum power point of 19[V] and 14[A]. An MPPT circuit may be configured to identify the maximum power point of one or more PV generators the MPPT circuit is coupled to, and to operate the PV generator at the PV generator's maximum power point independent of temperature, solar radiance, shading or other performance deterioration factors of other PV generators in the installation. In some PV installations, a plurality of PV generators may all be operating at their respective maximum power points, with each PV generator operating at a different current independent of the other generators. In illustrative embodiments, bypass paths (e.g. conductors 903a1, 903b etc.) may carry differing currents to compensate for differing PV generator maximum power point currents.

Figure 9D:
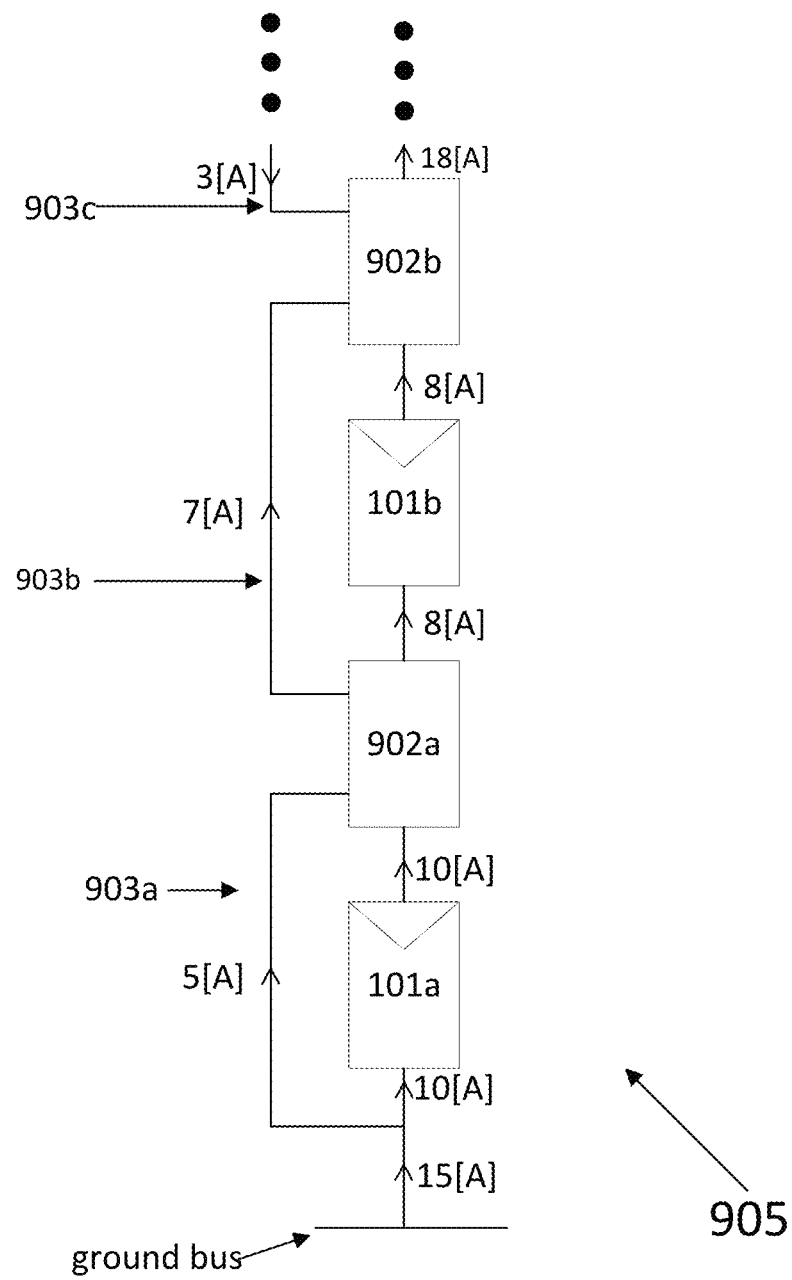

Reference is now made to FIG. 9D, which shows a portion of a photovoltaic string according to some illustrative embodiments. Photovoltaic string 905 comprises a plurality of PV generators 101 (e.g. 101a, 101b etc.) and PV power devices 902 (e.g. 902a, 902b etc.), Photovoltaic string 905 may be the same as or part of PV string 905 of FIG. 9A. The coupling method of the PV generators and PV power devices to one another may be similar to embodiments previously described herein. In this illustrative embodiment, the PV string 905 current may be 15[A]. PV generator 101a may operate at 10[A], with 5[A] bypassing the module via conductor 903a, which is coupled to beginning PV power device 902a. PV generator 101b may operate at 8[A], with 8[A] flowing to the PV generator from beginning PV power device 902a. Beginning PV power device 902a may further output 7[A] flowing over bypass path 903b, which is coupled to PV power device 902b. PV power device 902b may receive 8[A] from PV generator 101b and 7[A] via conductor 903b, and output 18[A] to the next PV generator in the string (not depicted) and output -3[A] over conductor 903c to the next PV power device in the string (not depicted). A negative bypass current simply indicates a reverse direct current (i.e. flowing in the opposite direction compared to the current portion flowing through the photovoltaic generators). In some embodiments, the bypass current may be an alternating current (AC), while the current portion which flows through the PV generators may be a direct current (DC) as further described below. In some embodiments, both the PV generator and bypass paths may carry a direct current.

By splitting the full string current into multiple portions and routing each portion along a different path, some embodiments may offer advantages. Conduction losses along a photovoltaic string may be expressed as Ploss=I2*R, where Ploss denotes the total conduction losses, I denotes the string current and R the combined resistance of the string conductors. Conductor resistance is calculated as, when denotes the resistivity of the conducting material, is the conductor length and A denotes the conductor cross section. As indicated by the first equation, a decrease in current results in a quadratic decrease in conduction losses. Therefore, it is beneficial to minimize current flowing through any single path in the system, as losses may decrease and higher efficiency may be obtained. Furthermore, many photovoltaic generators (e.g. solar panels) are sold already featuring cables which may be rated to support a current which is lower than the desired string current. In one type of PV installation featuring PV generators and PV power devices, PV generator cables may couple a PV generator to a PV power device while carrying the PV generator's maximum power point current, with the PV power device featuring additional cables to carry the entire string current. In certain PV installations, this may result in both higher losses (e.g. because of losses incurred by both the PV generator cables carrying the full generator currents and the PV power device cables carrying the full string current) and higher cabling costs (e.g. not taking advantage of the length of the PV generator cables to reduce the length of the PV power device cables). By splitting the string current into multiple portions, the included photovoltaic generator cables may be utilized to support a portion of the current, and an additional cable (which may also be required only to support a portion of the current, and may therefore be thinner and cheaper) may be added at a lower cost than the cost of replacing the entire photovoltaic generator cable. Additionally, the cost of conductors is not always linear, and the price of a cable rated to carry 15[A] may sometimes be higher than the combined costs of a 10[A]-rated cable and a 5[A]-rated cable.

Figure 9E:
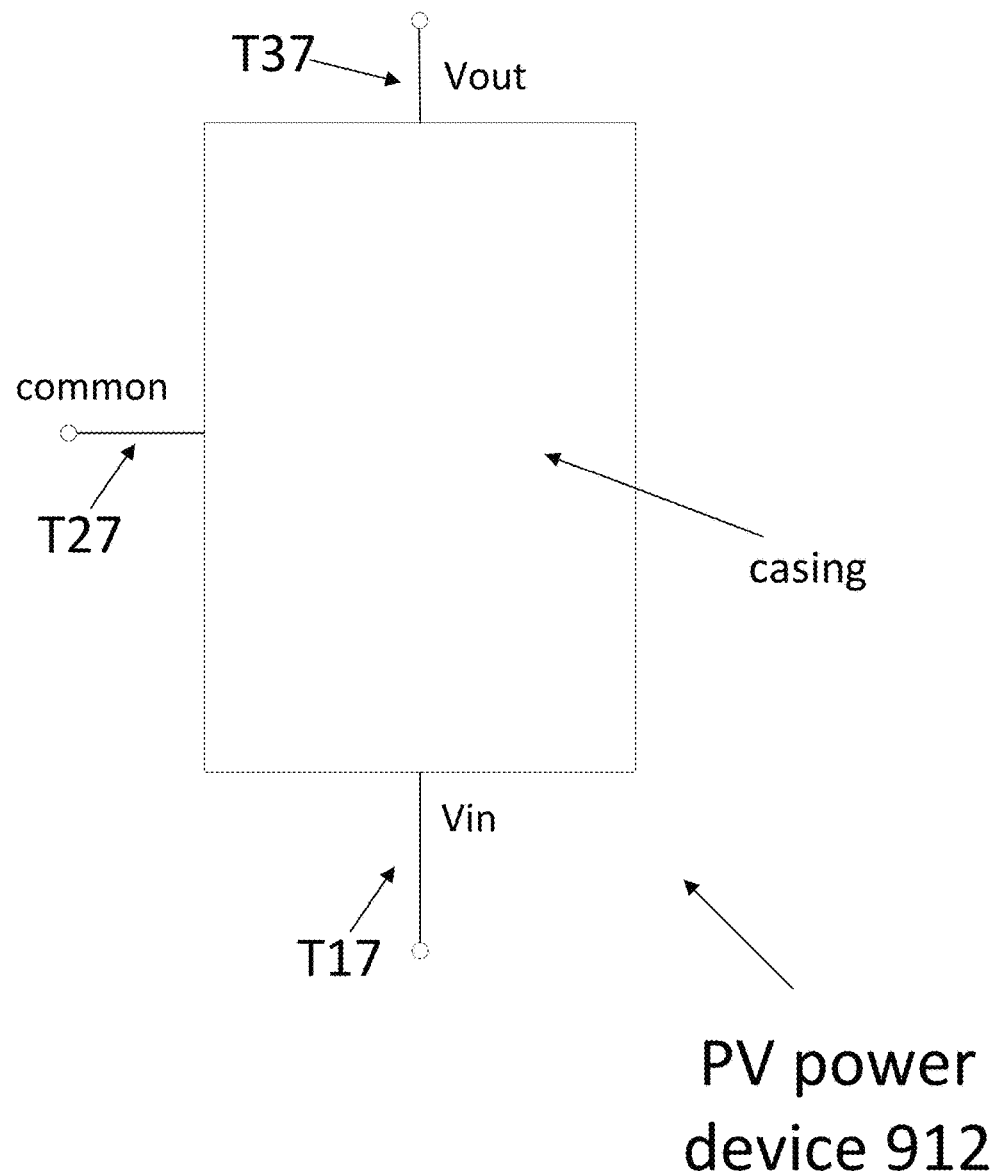

Referring now to FIG. 9E, illustrative photovoltaic power devices utilized in illustrative embodiments herein may feature different numbers of terminals. For example, power device 912 may include three terminals: terminal T17 may be utilized to receive an input voltage (Vin), terminal T37 may be utilized to output an output voltage (Vout), and terminal T27 may output a voltage level common to the input and output. The internal circuitry of power device 912 may be similar to that of other power devices discussed in detail herein, with only one output voltage terminal made available. If desirable, the output voltage terminal may be split during system deployment using a splitting device, such as a splice connector (e.g. a T-connector).

Figure 9F:
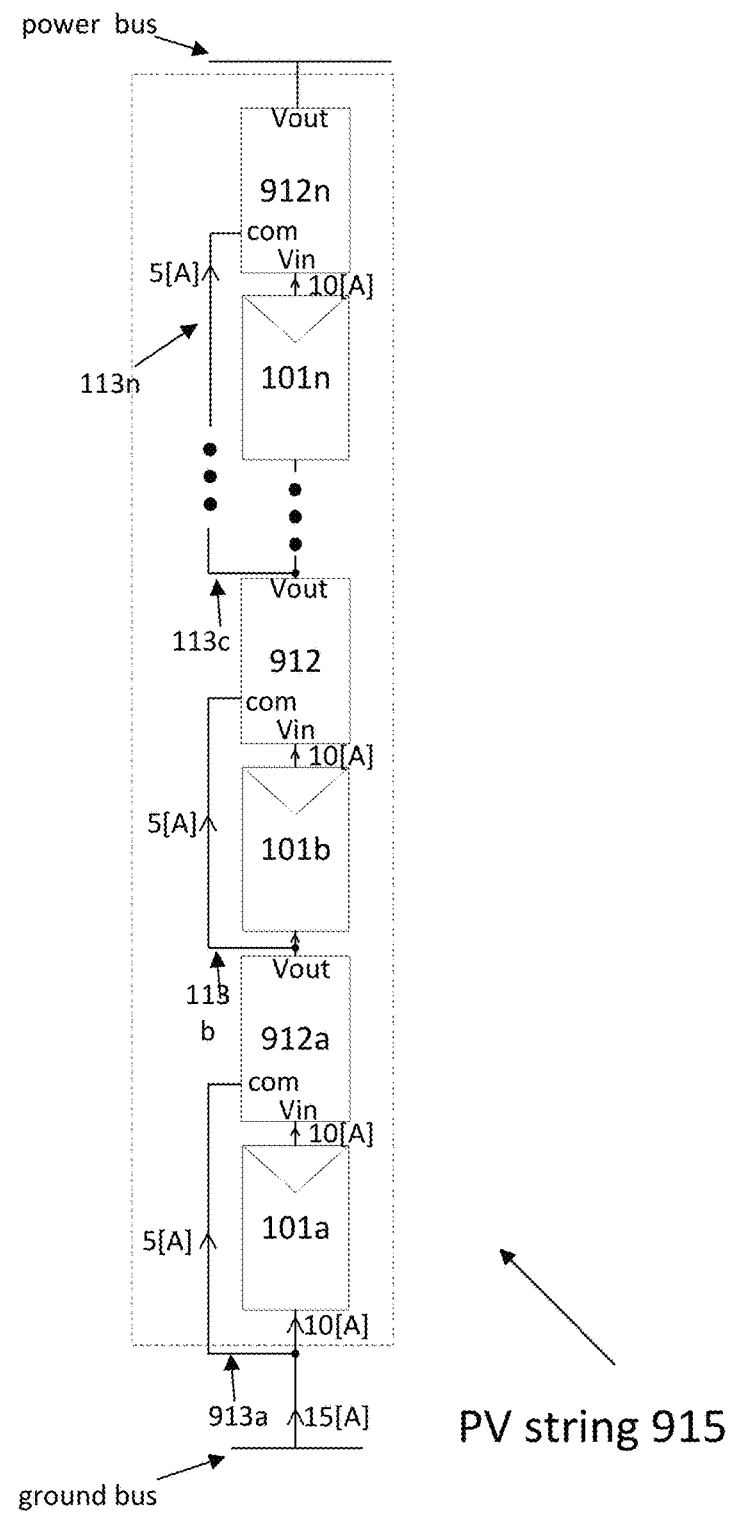

Reference is now made to FIG. 9F, which shows an illustrative embodiment of photovoltaic string 915 according to certain embodiments. PV string 915 may be used as string 905 of FIG. 9A. In this illustrative embodiment, each of a plurality of PV generators in a PV string (e.g. PV string 915) may be coupled to two PV power devices, with the exception of one PV generator (e.g. PV generator 101a) which may be coupled to the ground bus. Each of a plurality of PV power devices in a PV string (e.g. PV string 915) may be coupled to two PV generators, with the exception of one PV power device (e.g. PV power device 912n) which may be coupled to the power bus. Similar to other embodiments disclosed herein, the string current may be divided into two portions and routed along two paths, with a first path passing through PV generators 101 (e.g., 101a, 101b, etc.) and a second path comprising bypass paths 913 (e.g. path 913a, path 913b, etc.) which bypass the modules and carry current from one PV power device to the next PV power device in the string. As a numerical example, the string current may be 15[A], with 10[A] being routed through the PV generators, and 5[A] being routed through the power devices. Each power device 912 may output 15[A] from its single Vout terminal. The power devices 912 depicted may be arranged and implemented similarly to the power device depicted in FIG. 9E, where the power device's Vin terminal is at the bottom of the power device, the common terminal is at the side and the device's Vout terminal is at the top. The power devices 912 may be implemented using a device similar to the device shown in FIG. 9B, with a reduced number of terminals (e.g. combining T3 and T4 to a single terminal).

Figure 10A:
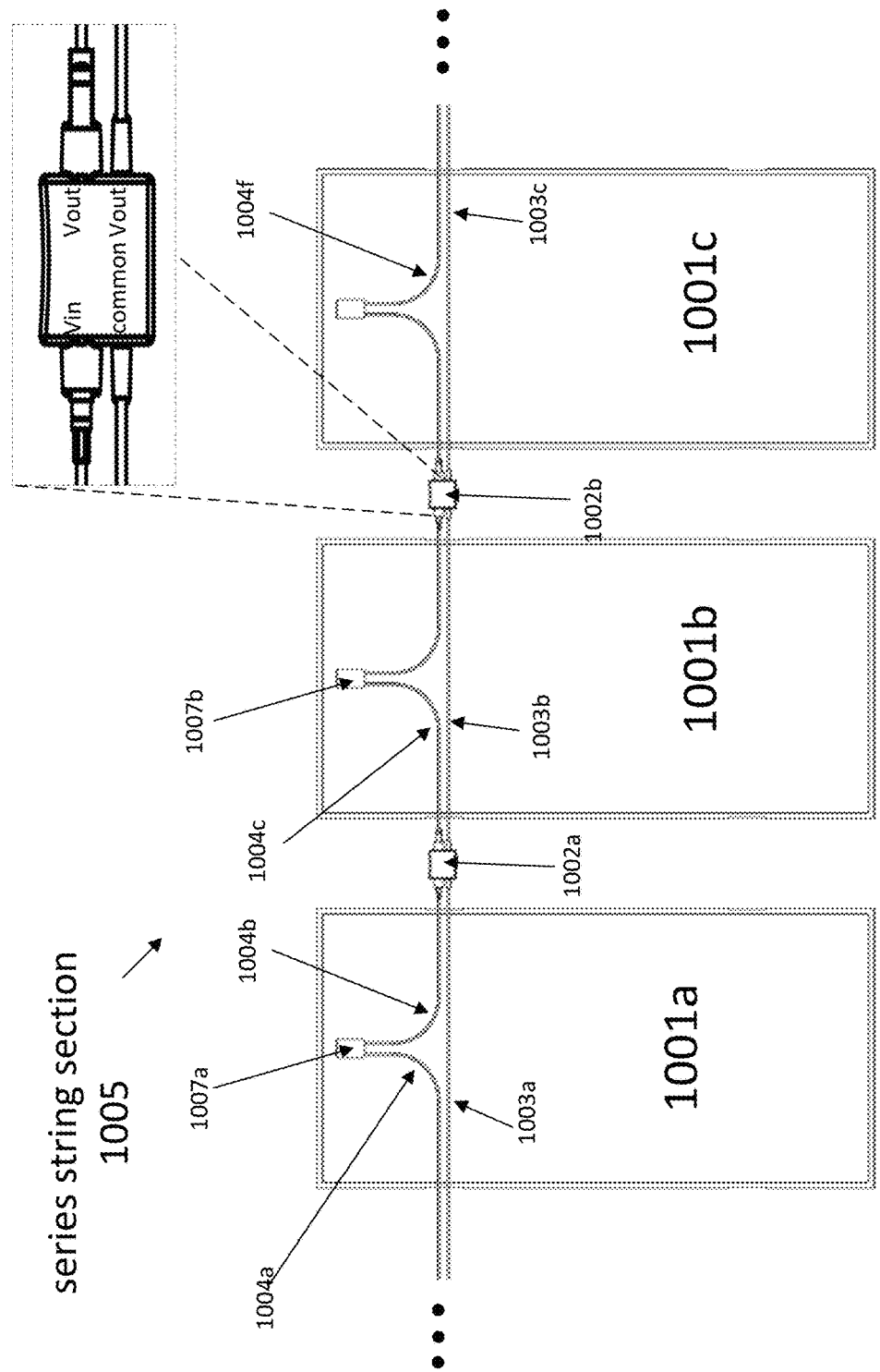
FIG. 10A illustrates a string section according to various aspects of the present disclosure.

Reference is now made to FIG. 10A, which shows an illustrative embodiment of a series string section of photovoltaic string 1005, which may be part of or the same as photovoltaic string 905 that may be found in systems such as photovoltaic installation 900. PV generator 1001a may comprise a photovoltaic panel including junction box 207a.

PV power device 1002a may be coupled to PV generators 1001a and 1001b, and PV power device 1002b may be coupled to PV generators 1001b and 1001c. PV power devices 1002a and 1002b may be similar to or the same as PV power devices 902 of FIG. 9A, and may feature four electrical terminals ("Vin", "common" and two "vout" terminals) arranged as depicted in FIG. 10A. In some embodiments, the two "Vout" terminals may be arranged differently (e.g. arranged such as power device 902 of FIG. 9B) or combined into one, similarly to PV power device 912 of FIG. 9E. Bypass cable 1003b may be connected between a "Vout" terminal of PV power device 1002a and the "common" terminal of PV power device 1002b. Panel cable 1004b may couple a terminal (e.g. the higher-voltage terminal) of PV generator 1001a to the "Vin" terminal of PV power device 1002a, and panel cable 1004c may couple a "Vout" terminal of PV power device 1002a to PV generator 1001b (e.g. to the lower voltage terminal of PV generator 1001b).

In some embodiments, PV generator 1001a may be the "first" module in a section of photovoltaic series string 1005. In some embodiments, a splice connector (e.g. a "T-connector") may combine panel cable 1004a and bypass cable 1003a and be connected to a ground bus. Similarly, in some embodiments, PV generator 1001c may be the "last" module in photovoltaic series string section 1005. In some embodiments, a splice connector (e.g. a "T-connector") may combine panel cable 1004f and bypass cable 1003c and be connected to a power bus.

PV generator 1001 (e.g. any of PV generators 1001a-1001c), the connected junction box 1007 and the connected panel cables 1004 may be a pre-integrated assembly before connection to PV power devices 1002. Bypass cables 1003 may be pre-integrated with one of the connected PV power devices (e.g., bypass cable 1003b may be an integrated part of PV power device 1002a or 1002b). Bypass cables 1003 may be two cables spliced together during assembly of the string section, with each portion an integrated part of a PV power device (e.g., bypass cable 1003b may be comprise two cables, with one cable integral to 1002a and the other cable integral to 1002b).

Figure 10B:
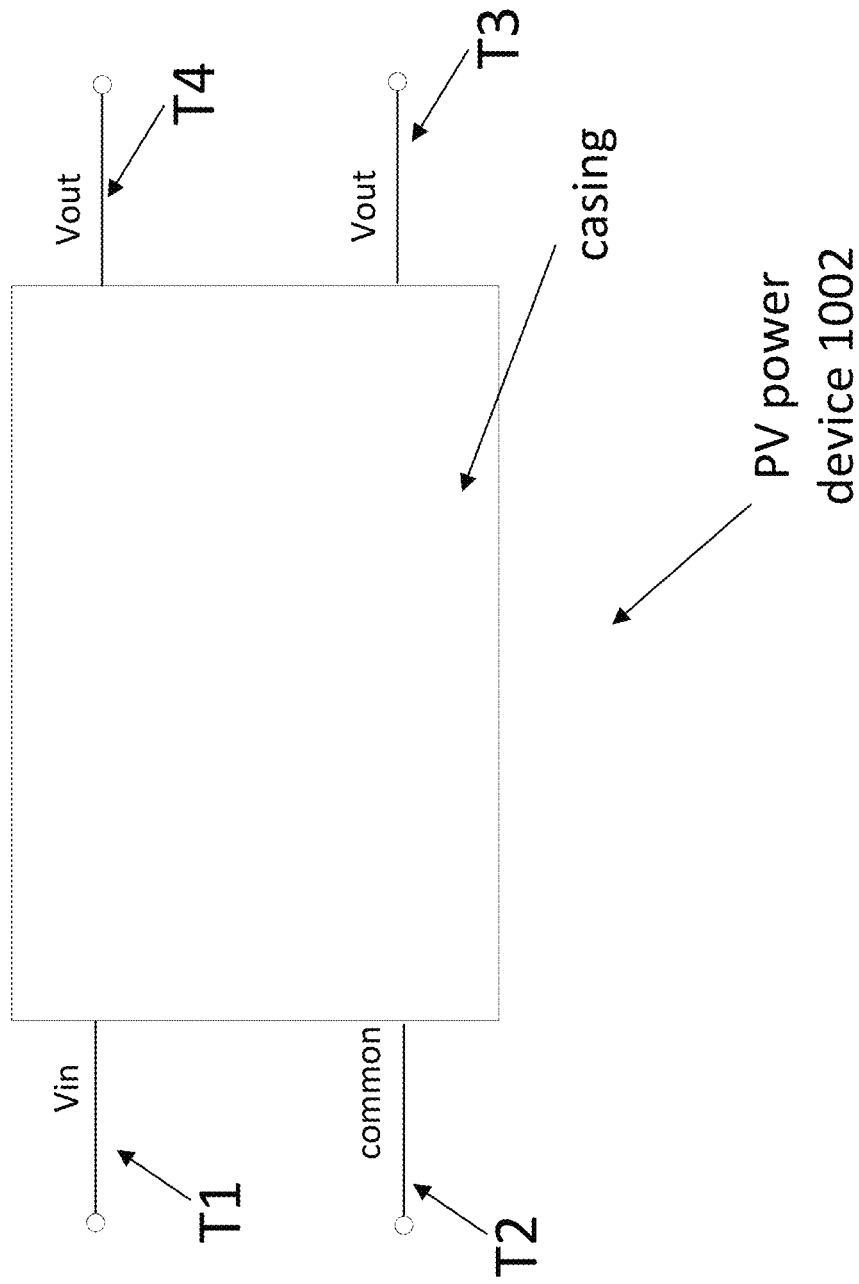
FIG. 10B illustrates a PV power device according to various aspects of the present disclosure.

Reference is now made to FIG. 10B, which shown an illustrative embodiment of the external connection terminals of a photovoltaic power device 1002, such as those featured in the illustrative string section in FIG. 9B. PV power device 1002 may include four terminals. Terminal T1 may be configured to receive an input from a photovoltaic generator or power device. Terminal T2 may be configured to be coupled to a photovoltaic generator and/or a photovoltaic power device, and may serve as a common terminal for both input and output. Terminals T3 and T4 may be configured to output voltage, current and/or power to additional PV generators and/or power devices. Terminals T3 and T4 may output the same voltage in reference to the common terminal T2, though they may output different current and different power. The physical location of the terminals in relation to the casing of the power device may be arranged to allow for convenient coupling in a photovoltaic string. This illustrative embodiment features terminals T1, T2 on the same side of the power device, with terminals T3, T4 located on the opposite side. Other arrangements may be considered and implemented in alternative embodiments and are within the scope of embodiments included herein.

Figure 11A:
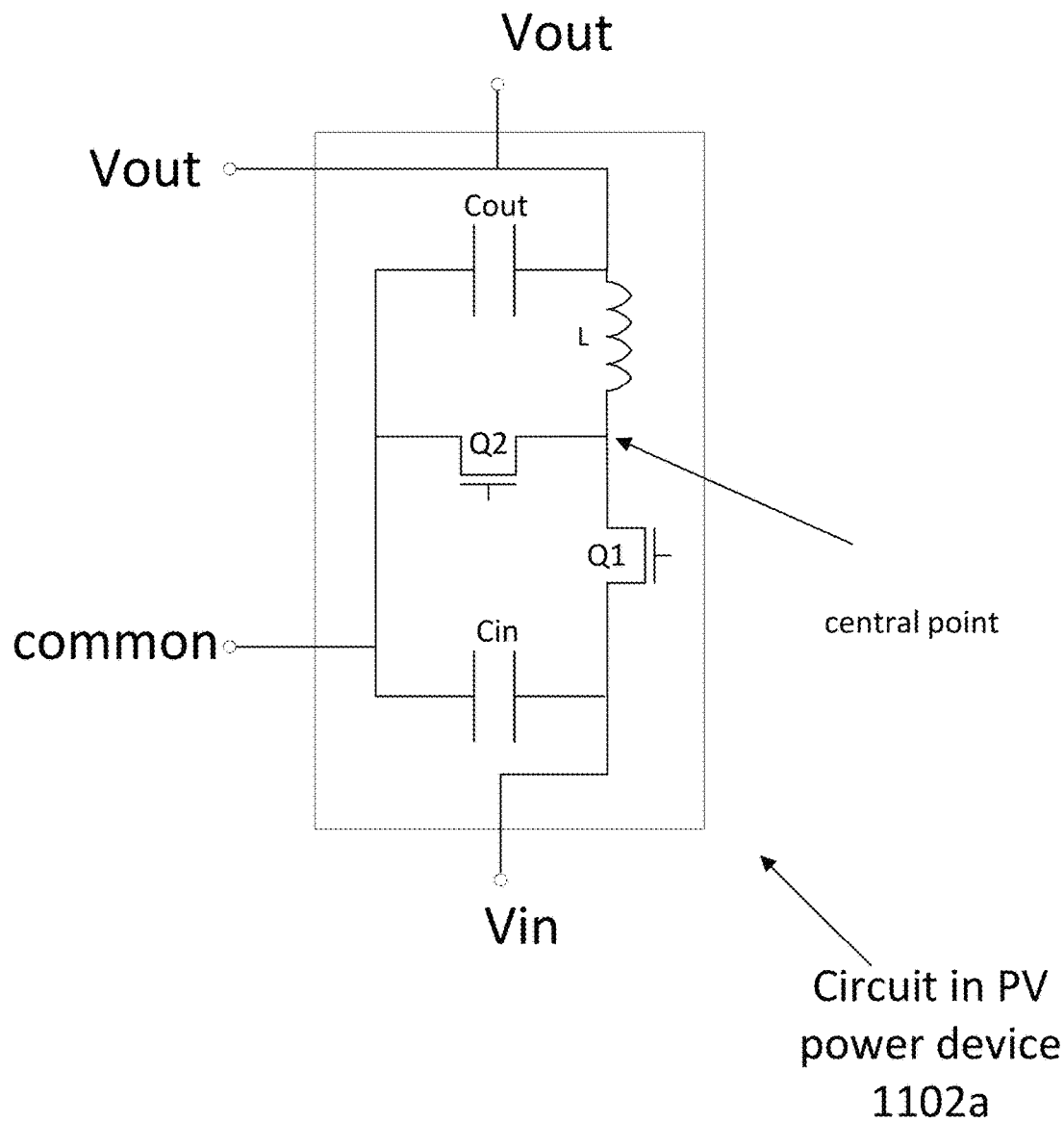
FIGS. 11A-11B illustrate PV power device circuits according to various aspects of the present disclosure.

Reference is now made to FIG. 11A, which shows some of the internal circuitry of a photovoltaic power device 1102a according to various illustrative embodiments (e.g., PV power device 1102a may be similar to or the same as PV power device 902 of FIGS. 9A-9D, or PV power device 1002 of FIGS. 10A-10B). In some embodiments, photovoltaic power device 1102a may be implemented using a variation of a Buck DC/DC converter. The power device may include a circuit having two input terminals, denoted Vin and common, and two output terminals which output the same voltage Vout. The input and output voltages are in relation to the common terminal. The circuit may include an input capacitor Cin coupled between the common terminal and the Vin terminal, an output capacitor coupled between the common terminal and the Vout terminals. The circuit may include a central point used for reference. The circuit may include a pair of switches (e.g. MOSFET transistors) Q1 and Q2, with Q1 coupled between Vin and the central point, and Q2 coupled between the common terminal and central point. The circuit may further include inductor L coupled between the Vout terminals and the central point. By staggering the switching of switches Q1 and Q2, the circuit may convert the input voltage Vin to output voltage Vout. If current is input to the circuit by the Vin and common terminals, and the voltage drop across capacitors Cin and Cout stay about constant at voltages Vin and Vout respectively, the currents input to the circuit are combined at inductor L to form an inductor current which is about equal to the sum of the current input at the Vin and common terminals. The inductor current may contain a ripple due to the charging and discharging of capacitors Cin and Cout, but the voltage ripples over the capacitors are generally small, and similarly the inductor current ripple may be generally small. The inductor current may be output by the pair of output terminals Vout. In some embodiments, more than two Vout terminals may be utilized to split the output current into more than two portions. In some embodiments, a single output terminal may be included, and system designers may split the output terminal externally (i.e. outside of the PV power device circuit), if desired. The switching of switches Q1 and Q2 may be controlled by an external control device (not explicitly depicted). If the electrical terminals Vin, common and Vout are arranged as depicted in FIG. 11A, power device 1102a may be used as the power device in configurations such as those shown in FIGS. 9A-9D (e.g. device 902).

Figure 11B:
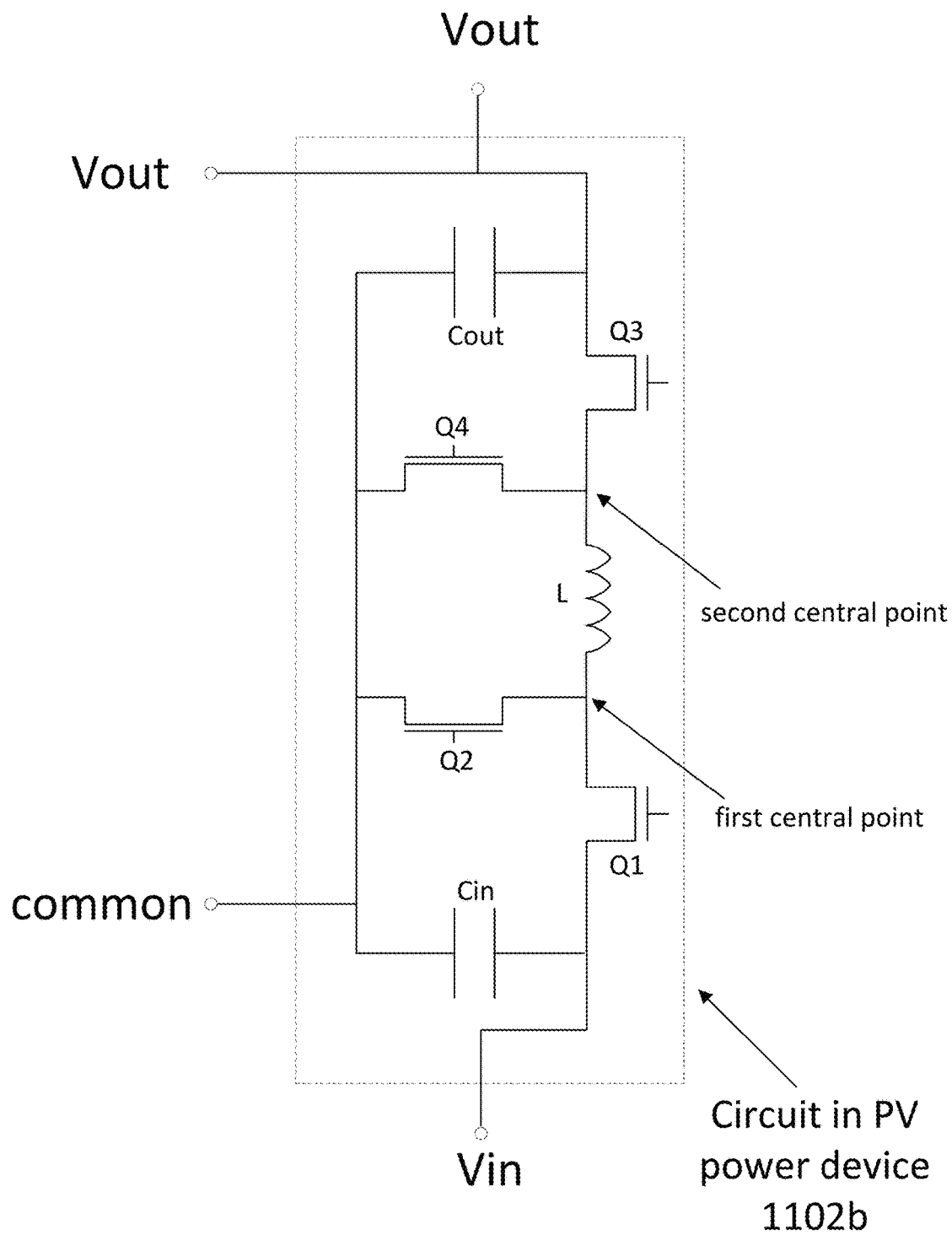

Reference is now made to FIG. 11B, which shows some of the internal circuitry of a photovoltaic power device according to one illustrative embodiment. In some embodiments, photovoltaic power device 1102b may be implemented using a variation of a Buck+Boost DC/DC converter. The power device may include a circuit having two input terminals, denoted Vin and common, and two output terminals which output the same voltage Vout. The output voltage is in relation to the common terminal. The circuit may include an input capacitor Cin coupled between the common terminal and the Vin terminal, an output capacitor coupled between the common terminal and the Vout terminals. The circuit may include two central points used for reference. The circuit may include a plurality of switches (e.g. MOSFET transistors) Q1, Q2, Q3 and Q4 with Q1 connected between Vin and the first central point, and Q2 connected between the common terminal and the first central point. Q3 may be connected between the Vout terminal and the second central point, and Q4 may be connected between the common terminal and the second central point. The circuit may further include inductor L coupled between the two central points.

The operation of the Buck+Boost DC/DC converter in PV power device 1102b may be variously configured. If an output voltage lower than he input voltage is desired, Q3 may be statically ON, Q4 may be statically OFF, and with Q1 and Q2 being PWM-switched in a complementary manner to one another, the circuit is temporarily equivalent to the Buck converter depicted in FIG. 11A and the input voltage is bucked. If an output voltage higher than he input voltage is desired, Q1 may be statically ON, Q2 may be statically OFF, and with Q3 and Q4 being PWM-switched in a complementary manner to one another, the input voltage is boosted. Staggering the switching of switches Q1 and Q2, the circuit may convert the input voltage Vin to output voltage Vout. If current is input to the circuit by the Vin and common terminals, and the voltage drop across capacitors Cin and Cout are about constant voltages Vin and Vout respectively, the currents input to the circuit are combined at inductor L to form an inductor current which is equal to the sum of the current input at the Vin and common terminals. The inductor current may contain a ripple due to the charging and discharging of capacitors Cin and Cout, but if the voltage drop across capacitors Cin and Cout are about constant, the voltage ripples over the capacitors are small, and similarly the inductor current ripple may be small. The inductor current may be output by the pair of output terminals Vout. In some embodiments, more than two Vout terminals may be utilized to split the output current into more than two portions. In some embodiments, a single output terminal may be included, and system designers may split the output terminal externally (i.e. outside of the PV power device circuit), if desired.

Figure 12A:
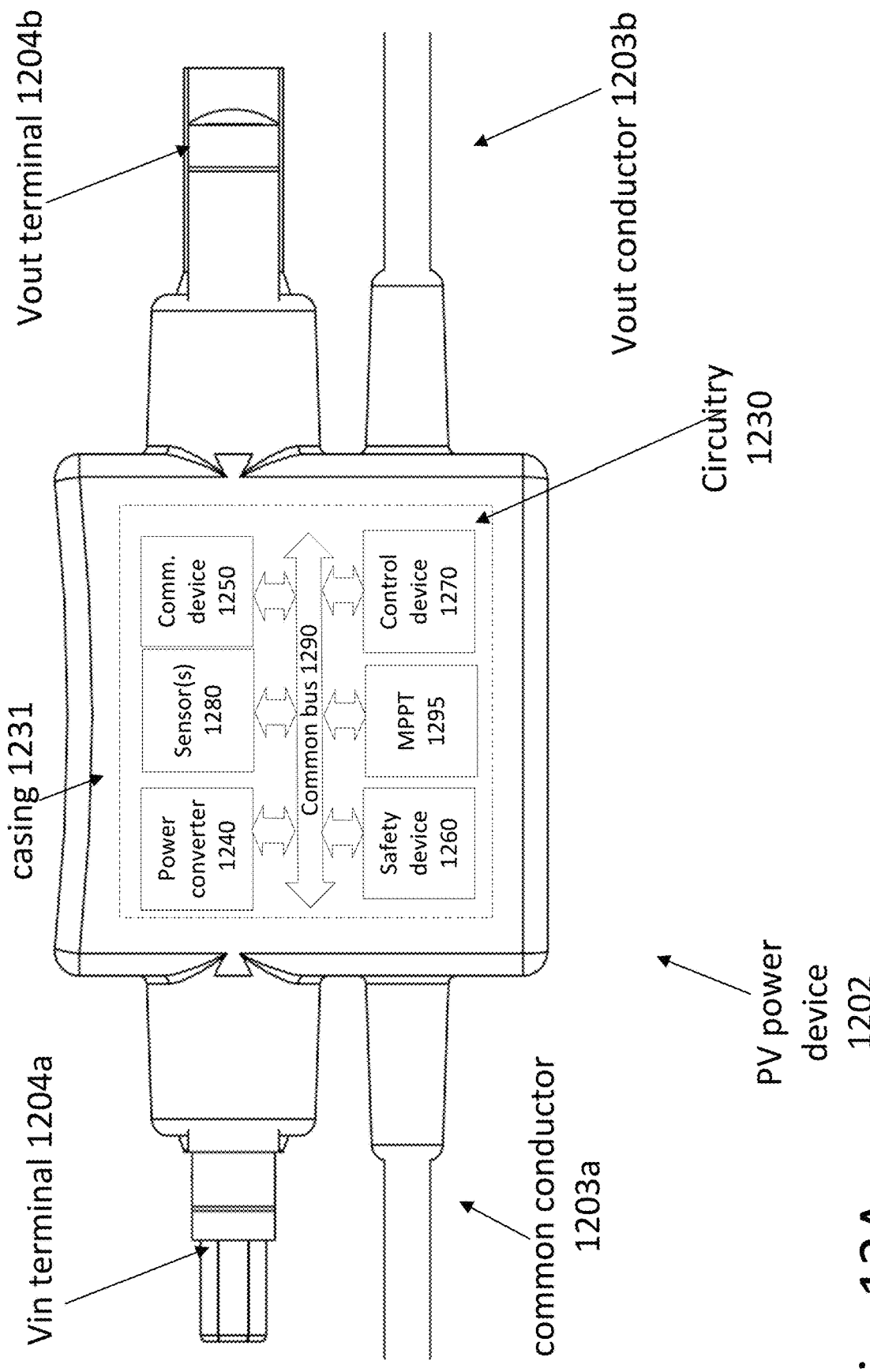
FIG. 12A illustrates a PV power device configuration according to various aspects of the present disclosure.

Reference is now made to FIG. 12A, which illustrates a photovoltaic power device according to illustrative embodiments. Photovoltaic power device 1202 may include a casing 1231. The casing 1231 may house circuitry 1230 (illustrated functionally). In some embodiments, circuitry 1230 may include power converter 1240. Power converter 1240 may include a direct current-direct current (DC/DC) converter such as a buck, boost, buck+boost, flyback, Cuk and/or forward converter. In some embodiments, power converter 1240 may include a direct current - alternating current (DC/AC) converter (e.g., an inverter, or a micro-inverter designed to convert a small portion of power from DC to AC, such as a 300W micro-inverter) instead of, or in addition to, a DC/DC converter.

In some embodiments, circuitry 1230 may include Maximum Power Point Tracking (MPPT) circuit 1295, configured to extract increased power from the PV generator the power device is coupled to. In some embodiments, MPPT circuit 1295 may be configured extract increased power from a PV generator connected to its input terminal, and in some embodiments, MPPT circuit 1295 may be configured extract increased power from a PV generator connected to its output terminal(s). In some embodiments, power converter 1240 may include MPPT functionality, rendering MPPT circuit 1295 unnecessary. Circuitry 1230 may further comprise control device 1270 such as a microprocessor, Digital Signal Processor (DSP) and/or an FPGA. Control device 1270 may control and/or communicate with other elements of circuitry 1230 over common bus 1290. In some embodiments, circuitry 1230 may include circuitry and/or sensors/sensor interfaces 1280 configured to measure parameters directly or receive measured parameters from connected sensors on or near the photovoltaic generator, such as the voltage and/or current output by the module, the power output by the module, the irradiance received by the module and/or the temperature on or near the module. In some embodiments, circuitry 1230 may include communication device 1250, configured to transmit and/or receive data and/or commands to/from other devices. Communication device 1250 may communicate using Power Line Communication (PLC) technology, acoustic communications technologies, or wireless technologies such as BlueTooth™, ZigBee™, Wi-Fi™, cellular communication or other wireless methods.

In some embodiments, circuitry 1230 may include safety devices 1260 (e.g. fuses, circuit breakers and Residual Current Detectors). For example, fuses may be connected in series with some or all of conductors 1203a 1203b, and terminals 1204a and 1204b, with the fuses designed to melt and disconnect circuitry at certain currents. As another example, PV power device 1202 may include a circuit breaker, with control device 1270 configured to activate the circuit breaker and disconnect PV power device 1202 from a PV string or a PV generator in response to detecting a potentially unsafe condition or upon receiving a command (e.g. via communication device 1250) from a system control device. As yet another example, PV power device 1202 may include a bypass circuit featuring a switch, with control device 1270 configured to activate the bypass circuit and short-circuit the input and/or output terminals of PV power device 1202 in response to detecting a potentially unsafe condition or upon receiving a command (e.g. via communication device 1250) from a system control device.

The various components of circuitry 1230 may communicate and/or share data over common bus 1290. Input voltage (Vin) terminal 1204a may be configured to be coupled to the positive output of a photovoltaic generator (e.g. as in FIGS. 9A-9D). Output voltage (Vout) terminal 1204b may be configured to be coupled to the negative output of a different photovoltaic generator, as described with regard to some of the embodiments herein (e.g. as in FIGS. 9A-9D). In some configurations, Common conductor 1203a and output voltage (Vout) conductor 1203b may be coupled to other photovoltaic power devices.

Figure 12B:
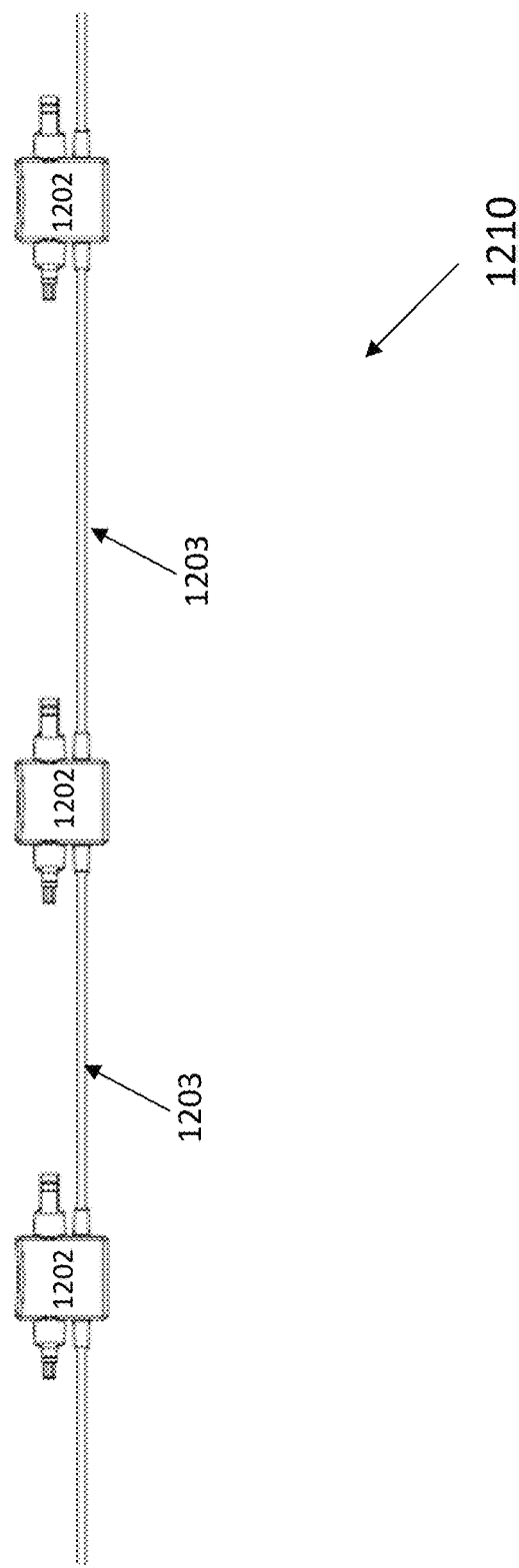
FIG. 12B illustrates a portion of a string of PV power devices according to various aspects of the present disclosure.

In some embodiments, conductors 1203a and 1203b may be integrated to photovoltaic power devices at each end, at the time of manufacturing, creating a string of connected photovoltaic power devices as depicted in FIG. 12B, allowing a plurality of coupled power devices to be manufactured and sold as a single unit 1210 for fast and easy field deployment. The length of the conductors (e.g. 1203a, 1203b) between adjacent power devices may be selected according to a length (or width) of a photovoltaic generator, to enable connecting adjacent power devices to adjacent photovoltaic generators. Manufacturing a string of power devices as a single unit, with the power devices interconnected using integrated (e.g. pre-connected) conductors 1203 may provide additional advantages such as reduced cost (e.g. by saving the cost of two connectors. For example, PV power device 1202 is depicted in FIG. 12A having two connectors and two conductors, and if the conductors 1203a, 1203b do not connect PV power device 1202 to an adjacent power device, an additional two connectors may be required) and a lower risk of electrical arcing or overheating due to a faulty connection between connectors. In some embodiments, PV power device 1202 may feature an integrated conductor 1203a, with conductor 1203b replaced by a terminal for connecting to an integrated conductor from a different PV power device. In some embodiments, conductors 1203a and 1203b may be replaced by terminals (e.g. MC4™ connectors made by Multi-Contact or other equivalent connectors) similar to 1204a and 1204b, to allow an installer to insert a cable of his or her choosing to be deployed. Terminals 1204a and 1204b and conductors 1203a and 1203b may be coupled to the terminals of DC/DC or DC/AC power converter 1240. For example, power converter 1240 may include a Buck converter similar to the converter depicted in FIG. 11A. In that case, Vin terminal 1204a of FIG. 12A may be coupled to the corresponding Vin terminal of FIG. 11A, Vout terminal 1204b and Vout conductor 1203b of FIG. 12A may be coupled to the Vout terminals of FIG. 11A, and the common conductor 1203a of FIG. 12A may be coupled to the common terminal of FIG. 11A. For visual clarity, these connections are not depicted explicitly, and in some embodiments the connections may differ.

Reference is now made to FIG. 12B, which shows a portion of a string of PV power devices. String 410 may be part of a string of PV power devices 1202 (e.g. devices similar to or the same as PV power device 1202 of FIG. 12A) connected to each other via conductors 1203 which may be the same as or similar to common conductor 1203a of FIG. 12A. The length of each conductor 1203 may be about the same as the length a dimension of a PV generator, to enable each PV power devices to be coupled to more than one PV generator (as depicted in FIG. 10A) and/or to enable coupling adjacent PV power devices to adjacent PV generators in a series string. In some embodiments, string 410 may be manufactured and/or packaged, stored and sold as a single unit, enabling fast and easy deployment in a PV installation.

Figure 12C:
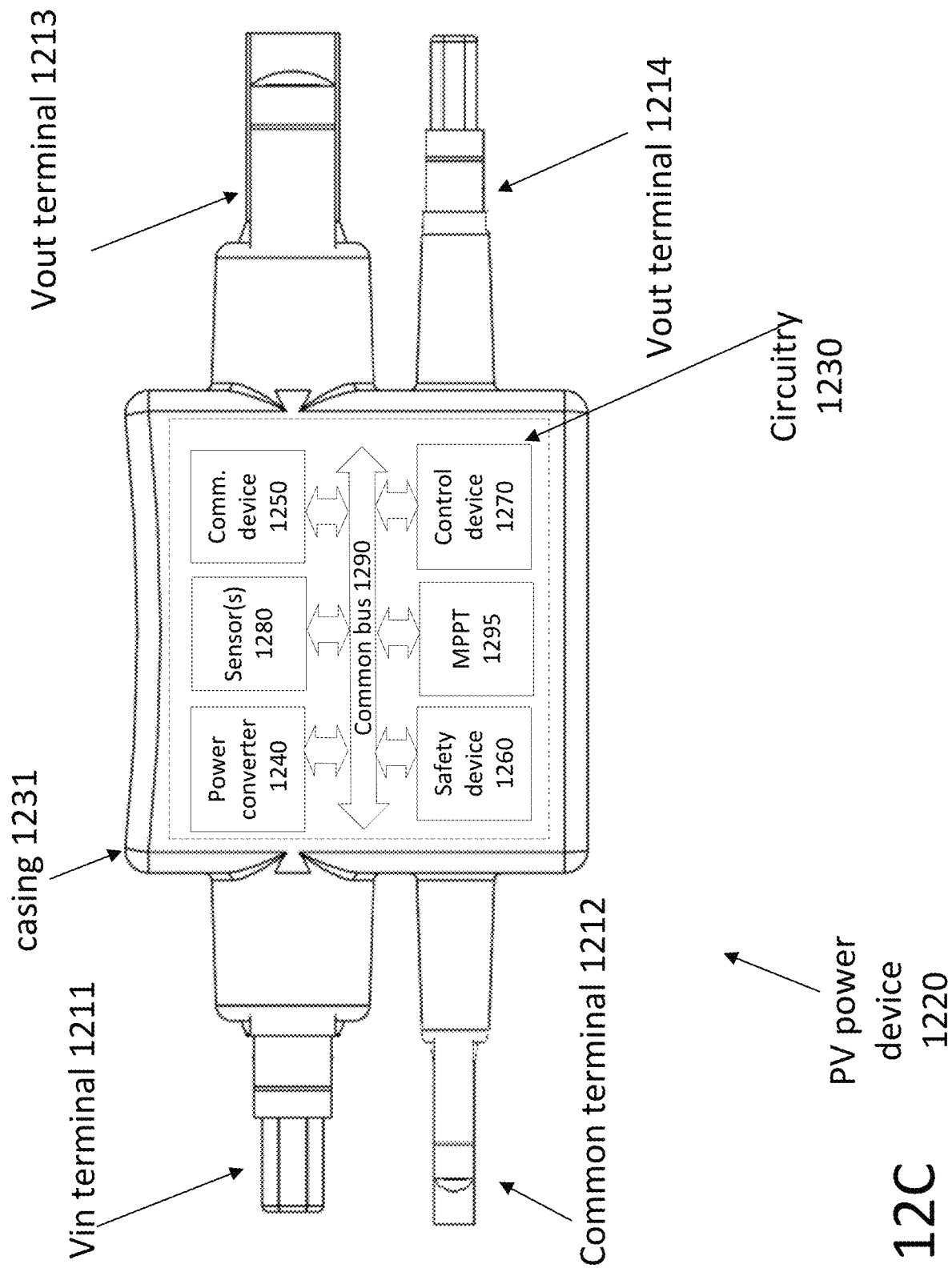
FIG. 12C illustrates a PV power device configuration according to various aspects of the present disclosure.

Reference is now made to FIG. 12C, which illustrates a photovoltaic power device according to illustrative embodiments. First photovoltaic power device 1220 may include a casing 1231 and circuitry 1230 (illustrated functionally). Circuitry 1230 may comprise circuits and devices similar to or the same as circuitry 1230 as described with regard to FIG. 12A. PV power device 1220 may comprise input voltage (Vin) terminal 1211, common terminal 1212, output voltage (Vout) terminal 1213 and output voltage (Vout) terminal 1214. Input voltage terminal 1211 may be provided for coupling (e.g. connecting) to a first output terminal (e.g. a positive output terminal) of a first photovoltaic generator.

Output voltage terminal 1213 may be provided for coupling (e.g. connecting) to a second output terminal (e.g. a negative output terminal) of a second photovoltaic generator. Common terminal 1212 may be provided for coupling to an output voltage terminal (e.g. similar to or the same as output terminal 1214), provided by a second PV power device similar to or the same as PV power device 1220. Output voltage terminal 1214 may be provided for coupling to a common terminal (e.g. similar to or the same as common terminal 1212) provided by a third PV power device similar to or the same as PV power device 1220.

In some embodiments, such as embodiments similar to or the same as FIG. 12A, a first conductor couples (e.g. connects) common terminal 1212 to an output voltage terminal of the second PV power device, and a second conductor couples (e.g. connects) output voltage terminal 1214 to the common terminal of the third PV power device. In some embodiments, the first and second conductors connect the first, second and third power devices at the time of manufacturing, with the first, second and third power devices along with the first and second conductors provided as a single connected apparatus or part of a single connected apparatus. In some embodiments, the first and second conductors are not provided along with PV power device 1220, and are connected during installation of PV power device 1220.

Figure 13:
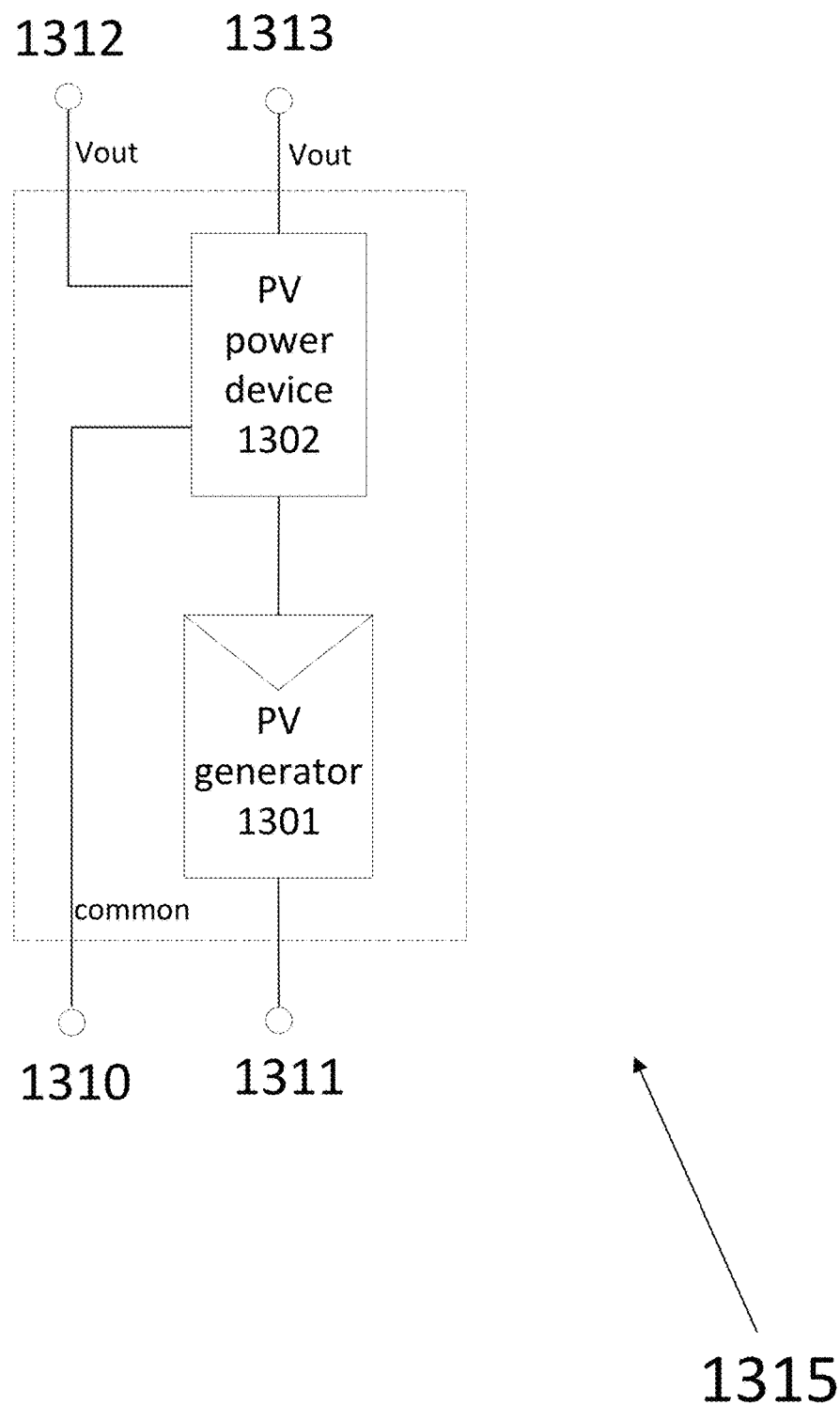
FIG. 13 illustrates a PV power device and PV generator arrangement according to various aspects of the present disclosure.

Reference is now made to FIG. 13, which illustrates an integrated illustrative embodiment. Integrated apparatus 1315 may include a photovoltaic generator 1301 (e.g., 101, 1001 etc.) coupled to a PV power device 1302 (e.g., 902, 1002, 1202a, 1202b etc.). Some embodiments may employ the cabling method described herein to couple PV generator 1301 to PV power device 1302. PV power device 1302 may further comprise circuitry similar to or the same as circuitry 1230 of FIG. 12A. For example, PV power device 1302 may comprise control device 1270 such as a microprocessor, Digital Signal Processor (DSP) and/or an FPGA. PV power device 1302 may include Maximum Power Point Tracking (MPPT) circuit 1295, configured to extract maximum power from the PV generator the power device is coupled to. In some embodiments, control device 1270 may include MPPT functionality, rendering MPPT circuit 1295 unnecessary. Control device 1270 may control and/or communicate with other elements of PV power device 1302 over common bus 1290. In some embodiments, PV power device 1302 may include circuitry and/or sensors/sensor interfaces 1280 configured to measure parameters on or near the photovoltaic generator 1301 or PV power device 1302, voltage, current, power, irradiance and/or temperature. In some embodiments, PV power device 1302 may include communication device 1250, configured to transmit and/or receive data and/or commands from other devices. Communication device 1250 may communicate using Power Line Communication (PLC) technology, or wireless technologies such as ZigBee, Wi-Fi, cellular communication or other wireless methods. In some embodiments, integrated apparatus 1315 and/or PV power device 1302 may include safety devices 1260 (e.g. fuses, circuit breakers and Residual Current Detectors). The various components of PV power device 1302 may communicate and/or share data over common bus 1290. Integrated apparatus 1315 may feature four terminals which are accessible from outside the apparatus, at least two of which output the same voltage. The components of integrated apparatus 1315 may be similar to or the same as those of circuitry 1230 of FIG. 12A. In FIG. 13 the two terminals outputting the same voltage are denoted 1312 and 1313. The integrated apparatus may be formed by embedding the components into a photovoltaic generator, the casing of the photovoltaic generator or mounting the components onto the photovoltaic generator. The integrated apparatus may include a portion of or all the circuitry required to comprise a "building block" that may be used for simple "plug 'n play" construction of optimized photovoltaic string. In this manner, the advantages of the current splitting detailed herein may be realized in the internal integrated circuit layout, with one current path in the integrated circuit including a photovoltaic generator 1301 (e.g. solar cell, panel or shingle) and another current path bypassing the module. Additional advantages of an implementation as an integrated circuit such as ease of connection, possible cost reduction, etc. may also be realized.

Figure 14:
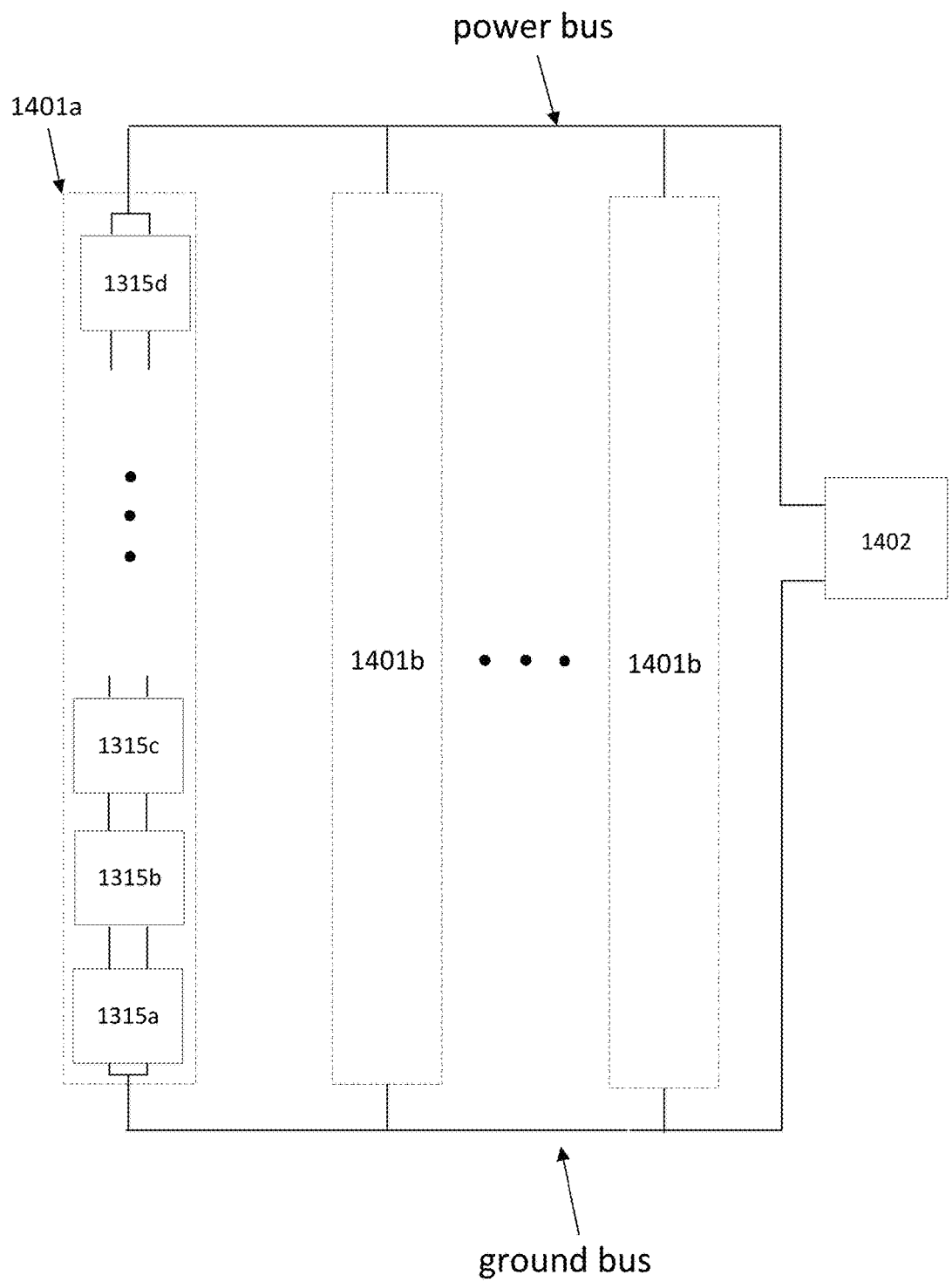
FIG. 14 illustrates a PV system according to various aspects of the present disclosure.

Reference is now made to FIG. 14, which shows a photovoltaic system according to another illustrative embodiment. A number of photovoltaic strings 1401 (e.g. 1401a, 1401b) may be coupled in parallel between ground and power buses to provide power to the power bus. The power and ground buses may be coupled to the inputs of system power device 1402. In some embodiments, system power device 1402 may include a DC/AC inverter and may output AC power to the grid, home or other destinations. In some embodiments, system power device 1402 may comprise a combiner box, transformer and/or safety disconnect circuit. One or more photovoltaic strings 1401 may comprise a plurality of series-coupled integrated apparatuses 1315. In a string 1401, one apparatus 1315 may have its terminals 1310, 1311 coupled to the ground bus. The other apparatuses 1315 in the string may have their terminals 1310, 1311 coupled to the terminals 1312, 1313 of the preceding apparatuses 1315 in the string. One apparatus 1315 may have its terminals 1312, 1313 coupled to the power bus. The other apparatuses 1315 in the string may their terminals 1312, 1313 coupled to terminals 1310, 1311 of the next apparatus 1315 in the string. A photovoltaic system constructed in this manner may enjoy the benefits of optimized photovoltaic strings, multiple current paths which enable cheaper cabling, fully integrated components including safety, monitoring and control functions, and simple installation.

In some photovoltaic systems, it may be beneficial to couple devices outputting a voltage which is not strictly AC or DC. For example, PV power devices (e.g. devices comprising circuitry similar to circuitry 1230 of FIG. 12A) may be configured to output a voltage waveform similar to a rectified sine wave, a triangle wave or a square wave. In some systems, configuring each PV power device to output a signal other than DC may reduce the size and cost of the filters and switching circuits required of a system power device configured to supply AC power to a grid or home (e.g. a DC/AC inverter).

Figure 15A:
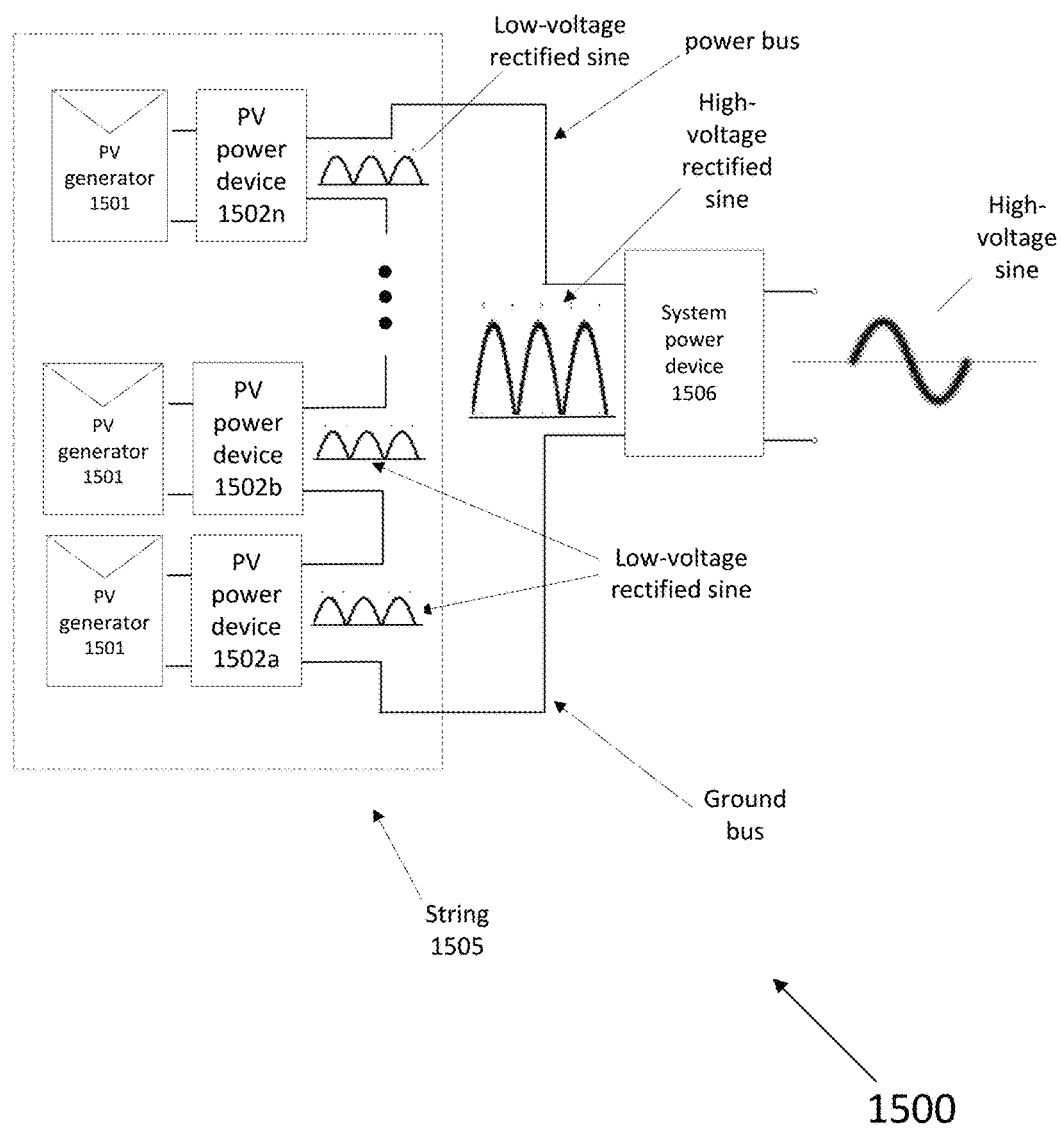
FIGS. 15A-15B illustrate a PV system according to various aspects of the present disclosure.

Reference is now made to FIG. 15A, which shows a photovoltaic system according to another illustrative embodiment in which benefit may be derived by rerouting current portions within a photovoltaic string. System 1500 may comprise one or more photovoltaic strings 1505 coupled to one another in parallel (only one string is illustrated). Each string may comprise a plurality of PV generators 1501 (e.g. 1501a, 1501b etc.) and PV power devices 1502 (e.g. 1502a, 1502b, etc.). In the embodiment depicted in FIG. 15A, the outputs of each PV generator 1501 are coupled across the inputs of a power device 1502, and the outputs of the PV power devices are serially coupled to one another to form a photovoltaic serial string. The inputs of each PV power device may receive power from a PV generator, and the outputs of the PV power device deliver power to string 1505.

Each power device 1502 may include circuitry similar to or the same as circuitry 1230 of FIG. 12A. For example, each power device 1502 may include a DC/DC converter configured to output a time-varying DC signal which emulates a rectified sine wave, triangular wave, square wave or other wave form which may be later processed and converted to a sine wave. The different power devices may output signals which are identical to one another, or different in shape, magnitude and/or phase. The outputs of the power devices may be summed to form a string voltage signal which is input to system power device 1506.

Figure 15B:
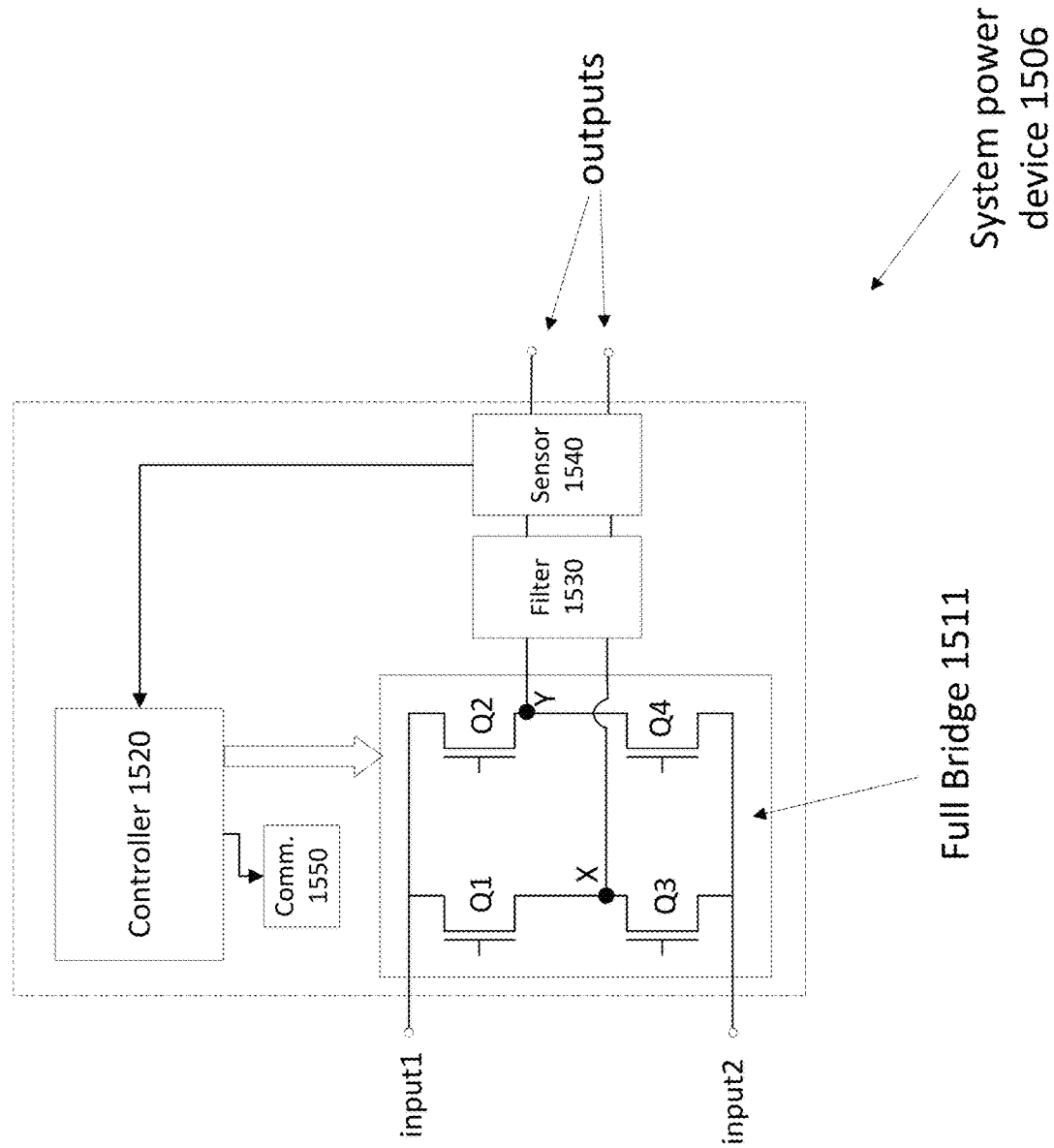

System power device 1506 may be configured to receive the string voltage input and output an alternating current (AC) signal such as a sine wave, which may be fed to the grid or home. In the illustrative embodiment depicted in FIG. 15A, each power device 1502 outputs a low-voltage rectified sine wave which is synchronized to be in-phase with the rectified sine waves output by the other power devices in the same string. Synchronization may be achieved by a master control device (e.g. a controller 1520 and communication device 1550 of system power device 1506, as depicted in FIG. 15B) commanding the PV power devices to produce a voltage of a certain waveform, and at a certain phase. The synchronized, rectified sine waves may be of a low frequency such as 100Hz or 120Hz, and may be summed to form a higher-voltage, rectified sine wave of amplitude about that of the utility grid voltage, such as 311[V] in European systems or 156[V] in the USA.

The voltage output by each power device 1502 may be substantially lower than a utility grid voltage. The summed peak output voltages of each group of serially connected power devices 1502 may be about the same as a utility grid peak voltage. For example, a string of ten serially connected power devices 1502 may have a total peak voltage of about 311V, and the output voltage of each of the ten power devices 1502 may output, on average, about 31V.

System power device 1506 may configure the output voltage to be appropriate for feeding the grid, home or storage devices. For example, if the string voltage signal is a rectified sine wave of grid-voltage amplitude, system power device 1506 may comprise a full-bridge to converter the rectified sine wave to an alternating sine wave. In some embodiments, the string voltage amplitude may be different from grid voltage amplitude, and may be adjusted by circuits and/or devices such as a transformer. In some embodiments, the string voltage may be similar to a triangular or square wave, and filtering may be applied before or after converting the signal from time-varying-DC to AC.

In some embodiments, a plurality of strings 1505 may be connected in parallel at the input of system power device 1506. Each string 1505 may be connected to system power device 1506 via a switch (not explicitly shown), the switch being operable to disconnect a string 1505 (e.g., an individual string 1505 without disconnecting other strings 1505) in response to a failure occurring at or in the disconnected string 1505 and/or a failure to provide adequate or synchronized power to system power device 1506.

In some embodiments, system power device 1506 may regulate the voltage across string 1505. For example, system power device 1506 may set the peak string voltage to a substantially constant value (e.g. a rectified sine voltage signal with a peak value of 350V), with the string current varying according to power available from PV generators 1501. The substantially constant peak voltage value may be changed periodically according to operational considerations such as the efficiency of system power device 1506 at different input voltages and currents, according to available power, or as part of a safety-response protocol.

In some embodiments, system power device 1506 may regulate the current flowing through string 1505. For example, system power device 1506 may set the string current to a substantially constant value with the string voltage amplitude varying according to power available from PV generators 1501. The substantially constant current value may be changed periodically according to operational considerations such as the efficiency of system power device 1506 at different input voltages and currents, according to available power, or as part of a safety-response protocol.

Reference is now made to FIG. 15B, which shows a system power device 1506 according to illustrative embodiments. System power device 1506 may include full bridge 1511, controller 1520, filter 1530 and sensor 1540. System power device 1506 may further include additional components such as communication device(s), sensor(s) /sensor interfaces, safety and/or disconnect devices(s), monitoring device(s) and/or auxiliary power circuit(s) (not explicitly depicted) similar to or the same as the components of circuitry 1230 of FIG. 12A. Full bridge 1511 may comprise four switches (e.g. MOSFETs) Q1, Q2, Q3 and Q4, two inputs and two outputs. Q1 may be connected between input1 and X. Q2 may be connected between input1 and Y. Q3 may be connected between input2 and X. Q4 may be connected between input2 and Y.

When switches Q1 and Q4 are ON and switches Q2 and Q3 are OFF, the output terminals may output a signal which is an inversion of the input signal. When switches Q1 and Q4 are OFF and switches Q2 and Q3 are ON, the output terminals may output a signal which is identical to the input signal. If the input signal is a rectified sine wave such as the string voltage of system 1500 of FIG. 15A, by inverting every second lobe of the rectified sine wave, an alternating sine wave may be obtained. The switching of the switches Q1-Q4 may be controlled by controller 1520. For example, the controller may apply a PWM signal to turn switches Q1 and Q4 OFF and switches Q2 and Q3 ON for the duration of one positive sine lobe, and then reverse the signals (i.e. turn Q1 and Q4 ON and switches Q2 and Q3 OFF) to invert the next sine lobe. Controller 1520 may include a microprocessor, Digital Signal Processor (DSP), ASIC, and/or an FPGA. System power device 1506 may include filter 1530 which may be placed on either the input or output side of the device, to filter higher-order harmonics which may be present in the processed signal. An appropriate filter (e.g. a low-pass LC filter) may reduce higher-order harmonics, creating an output signal which more closely resembles a pure sine wave.

Sensor 1540 may comprise a voltage-sensor for measuring the voltage output by system power device 1506. In some embodiments, the output of system power device 1506 is coupled to a utility grid, and sensor 1540 may further measure the grid voltage. Sensor 1540 may provide output voltage measurements to controller 1520, with controller switching switches Q1-Q4 responsively to the measurements provided by sensor 1540. For example, when sensor 1540 measures an output voltage of negative polarity, sensor 1540 may provide the negative voltage measurements to controller 1520, and controller 1520 may responsively switch Q1 and Q4 to the ON state and switches Q2 and Q3 to the OFF state. Communication device 1550 may be configured to communicate with communication devices deployed in PV power devices, for example, communication devices similar to or the same as communication device 1250 of FIG. 12A. For example, if communication device 1250 includes a Power Line Communication transceiver, communication device 1550 may similarly be a PLC transceiver. If communication device 1250 includes a wireless transceiver, communication device 1550 may similarly be a wireless transceiver. Communication device 1550 may transmit voltage magnitude measurements to PV power devices 1502 of FIG. 15A, with each PV power device 1502 configured to output a voltage corresponding to the magnitude measurements.

As a numerical example, when sensor 1540 measures an output voltage of 100V, communication device 1550 may transmit the measurement of 100[V] to PV power devices 1502, with each PV power device 1502 adjusting its duty cycle to output 100/N [V], where N is the number of serially-connected PV power devices 1502. In some embodiments, the total voltage of 100[V] may be split unevenly amongst PV power devices 1502, with each PV power device 1502 outputting a voltage proportional to the power processed by the respective PV power device, and the total voltage output by all of PV power devices 1502 equaling 100[V].

In some illustrative embodiments, two or more system power devices 1506 may be deployed in parallel in system 1500, reducing the risk of system failure in case of a failure in a single device. While component redundancy often significantly increases system cost, the architecture of system 1500 may enable system power device 1506 to be implemented using inexpensive circuitry (e.g. low frequency switches Q1-Q4 and/or a controller 1520 that does not need expensive processing capabilities), thereby decreasing the cost of adding redundant components to reduce the risk of system failure. By adding a backup system power device 1506, system 1500 may reduce the number of single points of failure or have no single point of failure, such that a failure of a single device does not cause the entire system to cease producing power. In some embodiments, certain components within system power device 1506 may be duplicated for redundancy. For example, system 1500 may comprise system power device 1506 comprising a single controller 1520, a single filter 1530 and a single communication device 1550, but multiple sensors 1540 and full-bridges 1511.

Figure 15C:
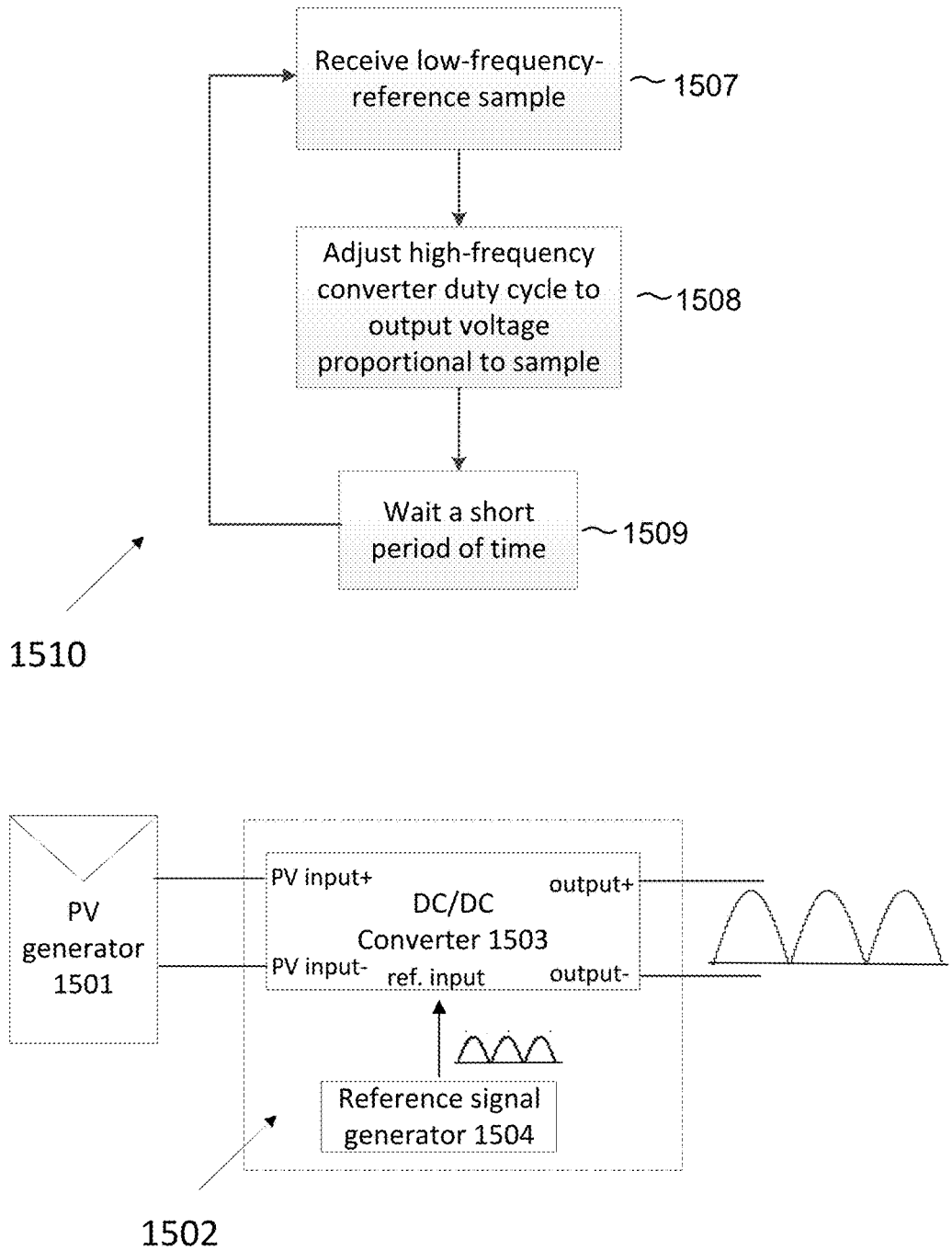
FIG. 15C illustrates a PV system and associated method according to various aspects of the present disclosure.

Reference is now made to FIG. 15C, which shows an illustrative embodiment of generating a pseudo-AC signal which varies over time, for example, a DC output that is varied in amplitude in a step-wise manner to emulate a biased or rectified alternating-current signal. DC/DC converter 1503 may receive an input from a DC voltage source such as PV generator 1501. In alternative embodiments, PV generator 1501 may be replaced in FIGS. 15A and 15C by an alternating current (AC) power source (e.g. a wind turbine), PV power device 1502 comprising an alternating current to direct current (AC/DC) rectifying circuit (not explicitly depicted) converting the AC input power to DC power to be input to DC/DC converter 1503. Converter 1503 may further receive a reference signal from reference signal generator 1504, and may attempt to output a voltage signal which is proportional to the reference signal. For example, signal generator 1504 may output a rectified sine wave reference with an amplitude of 100mV, and converter 1503 may output a rectified sine which tracks the reference, but with a different amplitude. If converter 1503 operates at a frequency significantly higher than the frequency of the reference signal, the tracking can be highly accurate for any reference waveform. For example, the reference signal may be of a low frequency such as 100Hz or 120Hz, and the DC/DC converter may operate at a frequency of tens or hundreds of kHz. The converter's high frequency may allow it to stabilize an output voltage rapidly, within a time-frame that is a small fraction of the period of the reference signal.

Reference signal generator 1504 may be implemented in various manners. In some embodiments, digital samples may be stored on a memory device (e.g. Read Only Memory (ROM) Random Access Memory (RAM), Flash memory or similar memory devices) coupled to DC/DC converter 1503, with a digital sample provided to DC/DC converter 1503 at regular intervals. In some embodiments, reference signal generator 1504 may comprise an analog oscillator and an analog-to-digital (A/D) converter configured to sample the oscillator and provide a digital sample to DC/DC converter 1503. In some embodiments, reference signal generator 1504 may be a communication device for receiving reference samples from a different communication device (e.g. communication device 1550 of FIG. 15B, transmitting samples measured by sensor 1540) and providing them the DC/DC converter 1503.

Still referring to FIG. 15C, DC-DC converter 1503 may carry out method 1510. At step 1507, the DC/DC converter may digitally sample the reference signals. At step 1509, the DC/DC converter may adjust the duty cycle of its high-frequency switching components to output a voltage which is proportional (according to a predefined ratio) to the reference signal. At step 1509, the converter may wait a short time before the next sample is processed. In some embodiments, the short time is predetermined (e.g. the converter may draw a new reference sample from memory or sample an oscillating reference signal after a period of time such as about 10 microseconds or about 100 microseconds). In some embodiments, the method will wait until a new sample is received from an external device, in which case the short time is not predetermined by the converter. In the illustrative embodiment depicted in FIG. 15C, the reference signal is a rectified sine, and the converter output is a rectified sine of a different amplitude. The higher the frequency, the "smoother" the output signal may be (e.g., because the output voltage would be adjusted in smaller time-interval steps).

In illustrative systems such as system 1500, it may be desirable for photovoltaic power devices 1502 to be configured to output voltage and current signals shaped similarly to one another, to maintain a system power factor close to one. For example, if the voltage signal output by a PV power device is shaped as a triangular wave, to maintain a power factor equal to one the current output may be a triangular wave proportional to the triangular voltage wave (i.e. of the same frequency, and with no phase shift between the two signals). In some embodiments, the output voltage or current is imposed on the power device outputs, requiring the converter device to configure either the voltage or the current to match the imposed signal. Illustrative embodiments may include, but are not limited to, systems comprising PV power devices configured output in-phase voltage and current waveforms, to obtain a power factor close or equal to unity.

Synchronization of PV power devices to output in-phase voltage and current waveforms may be achieved is several ways. In some embodiments, synchronization may be achieved by providing each DC/DC converter with the same reference sample at the same time. For example, communication device 1550 of FIG. 15B may transmit a reference sample to an entire string of serially-connected DC/DC converters at the same time, with each DC/DC converter receiving the sample at about the same time and outputting a voltage derived from the same reference sample. In some embodiments, each DC/DC converter may store (e.g. in a memory device) a group of digital samples to be processed in order according to predetermined time intervals, with a trigger received from an external device signaling each converter to restart processing from the first sample.

In some embodiments, DC/DC converter 1503 may include a bypass circuit (not explicitly shown) disposed between the DC/DC converter 1503 output terminals (denoted output+ and output− in FIG. 15C), and include a controller configured to activate the bypass circuit (e.g. to directly connect the output+ terminal to the output− terminal) in response to a failure by the DC/DC converter to synchronize the converter output to other converter outputs, or in response to a different failure in the converter or in PV generator 1501. In response to such failures (or bypassing) of a DC/DC converter 1503 in a PV power device 1502 (e.g. PV power device 1502a of FIG. 15A), other serially-connected PV power devices 1502 (e.g. PV power devices 1502b-1502n) may adjust (e.g. raise) their output voltages to compensate for the failed device.

Figure 15D:
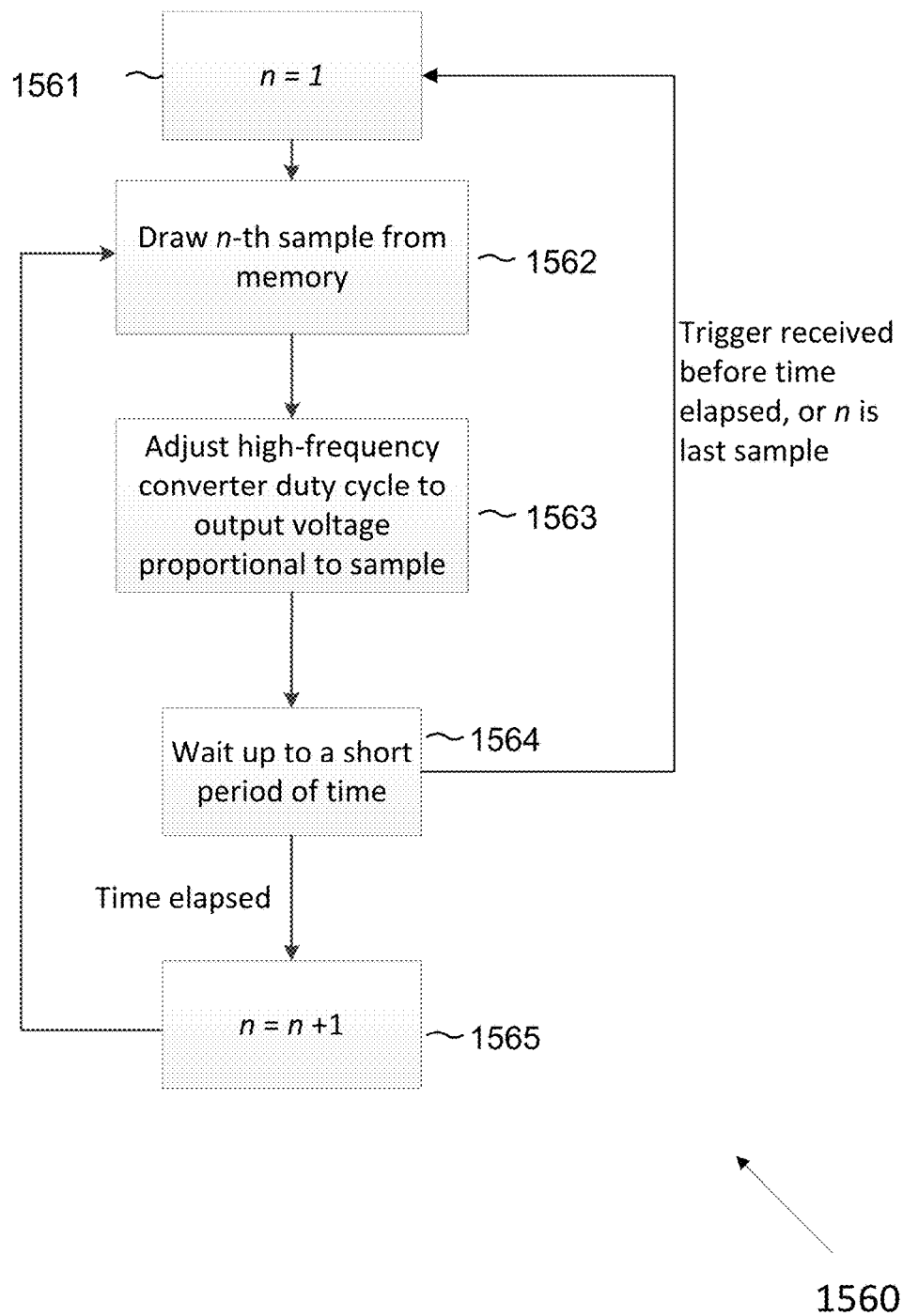
FIG. 15D illustrates a method according to various aspects of the present disclosure.

Reference is now made to FIG. 15D, which shows a method for synchronizing waveforms according to aspects of the present disclosure. Method 1560 may be carried out by one PV power device or a plurality of series or parallel connected PV power devices such as PV power devices 1502. Each power device may include a memory device storing a sequence of output voltage reference samples. At step 1561, the power device may initialize the counter n to the first reference sample. At step 1562, the n-th (at the initialization stage, the first) sample is drawn from memory, and at step 1563 the power device adjusts the duty cycle of a high-frequency converter to output a voltage proportional to the n-th sample. At step 1564, the method may wait up to a predetermined short period of time (e.g. 10 microseconds or 100 microseconds). If the time elapses, the method may increment n at step 1565 and loop back to step 1562, where a new sample is drawn from memory. If a trigger is received before the predetermined time elapses, the method may loop back to step 1561 and reset n to equal 1.

In some embodiments, the trigger may be received from a system control device. For example, a group of serially connected PV power devices 1502 may each hold in memory a sequence of 1000 samples corresponding to a single lobe of a rectified sine wave. System power device 1506 may be configured to send a trigger via communication device 1550 every 10 milliseconds (corresponding to a frequency of 100Hz), with each PV power device 1502 receiving the trigger at about the same time. Upon reception of the trigger, each PV power device may output 0[V], corresponding to the first sample of a rectified sine wave. Each predetermined short period of time at step 1564 may be 10 microseconds per sample. In some embodiments, each PV power device may be configured to set n=1 after the final sample is processed, even without receiving a trigger. The triggers may be used as a timing synchronization backup method, to ensure that the PV power devices are resynchronized at least once per cycle.

Figure 16:
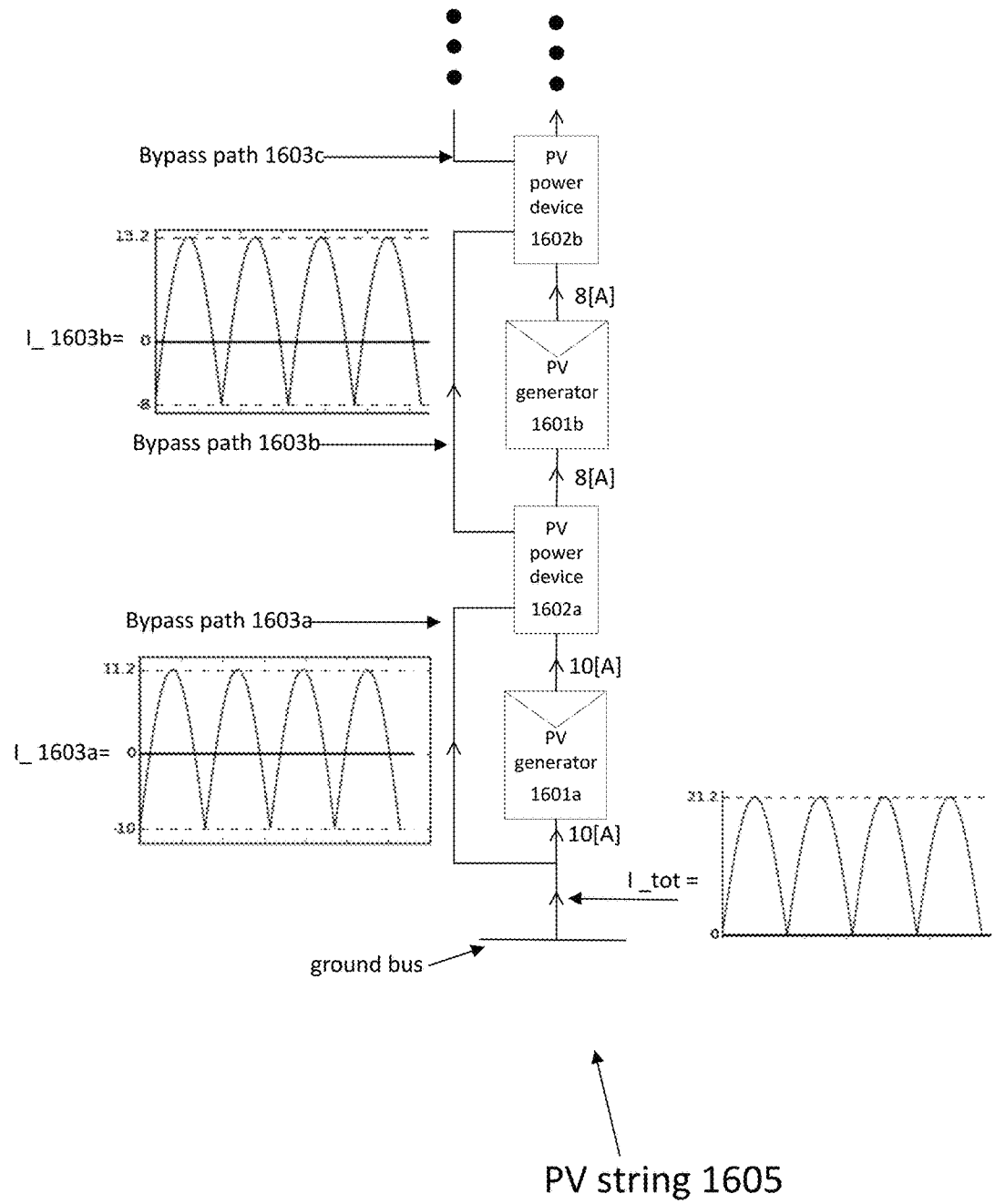
FIGS. 16, 17A and 17B illustrate various components of a PV system according to various aspects of the present disclosure.

Reference is now made to FIG. 16, which shows how illustrative embodiments of conductor splitting techniques may be applied to illustrative systems such as system 1500. Photovoltaic string 1605 may be part of or the same as other photovoltaic strings disclosed herein, such as photovoltaic string 905 of FIG. 9A. Photovoltaic string 1605 may comprise a plurality of photovoltaic generators (e.g. 1601a, 1601b etc.) and a plurality of photovoltaic power devices 1602 (e.g. 1602a, 1602b etc.). The string current may be a DC current that is varied (e.g., step-wise adjusted), for example, a current of magnitude 15[A](RMS) shaped as a rectified sine wave with a peak amplitude of 21.2[A]. The string current may be divided into two portions, with a first DC portion being routed through photovoltaic generators 1602, and a second AC portion being routed along a second route comprising bypass paths 1603 (e.g. 1603a, 1603b etc.), bypassing the PV generators. The two portions may be joined at the bottom of the string by the ground bus, and at the top of the string by the power bus (not shown). By routing a DC portion of the string current through photovoltaic generators, the current flowing through the bypass paths may comprise biased rectified sine waves. The root-mean-square (RMS) of a biased rectified sine current is given by where A is the amplitude of the rectified sine wave (routed through bypass paths 1603) and B is the DC current bias (routed through the PV generators). Similar formulae exist for other current waveforms such as triangular waves. The root-mean-square of an unbiased rectified sine current is given by where A is the amplitude of the rectified sine wave. It can be shown that careful selection of the bias B may reduce the RMS of the current flowing through the bypass paths significantly, possibly requiring thinner, cheaper cables compared to those that would be required to carry the entire, unbiased string current.

Selection of the bias B may include a calculation to minimize an RMS value of a current. For example, given a mathematical expression of an RMS current, the derivative of the expression may be calculated parametrically, and a B selected to set the derivative to zero, corresponding to a minimum value. For example, given the RMS value of a rectified sine wave current signal , the minimum value of IRMS is calculated to be obtained for . In some embodiments, where the RMS value of a current may be difficult to calculate analytically, simulation may show various RMS values obtained when varying B, and an appropriate B (e.g. to minimize the current RMS) may be selected.

In some embodiments, B may be selected as to increase the power output by a photovoltaic generator, and A may be accordingly selected to minimize an RMS current value (e.g. by analytic methods or by simulation).

With appropriate selection of conductor sizes for the bypass paths, losses may also be reduced, as explained previously herein. In the illustrative embodiment discussed herein, PV generator 1601a carries a DC current of 10[A], with the remainder of the string current, a rectified sine-wave bypassing PV generator 1601a via bypass path 1603a to PV power device 1602a may be biased by 10l[A]. PV generator 1601b carries a DC current of 8[A], with the remainder of the string current, a 8[A]-biased rectified sine-wave bypassing module 1601b via bypass path 1603b. PV power devices 1602 may comprise similar components and may utilize similar methods to the components and methods discussed herein with regard to power devices 1502. The terminals and internal circuitry of power devices 1502 may be configured to provide input, common and output voltages similarly to the configurations discussed herein with regard to power devices 902, 1002, 1102a, 1102b, 912, 1202, 1220, and 1302.

Figure 17A:
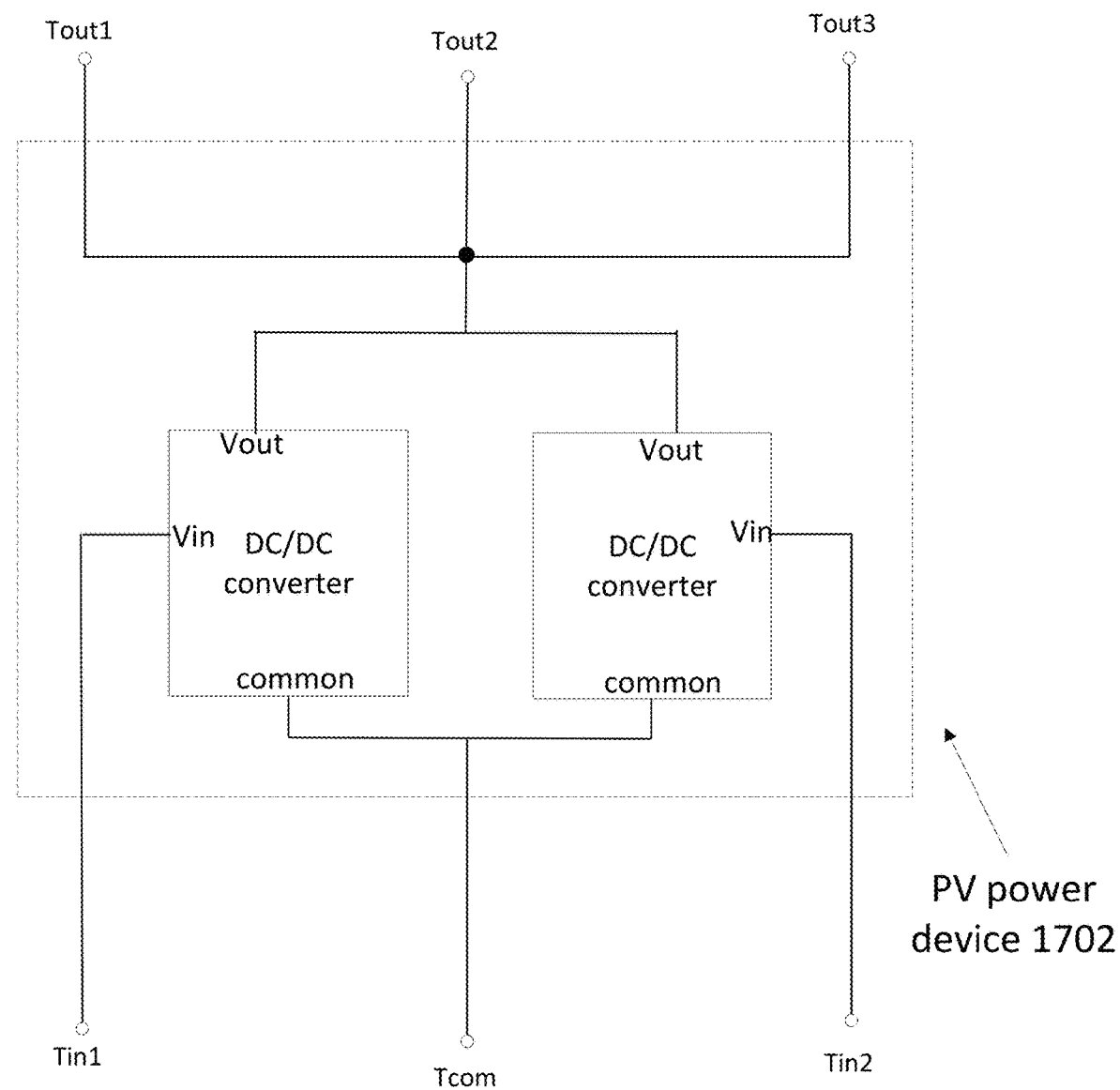

Reference is now made to FIG. 17A, which shows a photovoltaic power device according to illustrative embodiments. Power device 1702 may comprise two DC/DC converters. Different types of DC/DC converters may be used, such as Buck, Boost, Buck+Boost, Flyback and/or Forward converters. In some embodiments, the power device may comprise two different types of converters. For example, one converter may be a Buck converter, and the other converter may be a Buck+Boost converter. The two converters may include, for example, 3 terminals: an input terminal, an output terminal and a common voltage terminal. Each converter's input terminal may be configured to be coupled to a separate set of one or more PV generators. For example, terminal Tin1 may be coupled to the input of one DC/DC converter, and may be configured to be coupled to a first set of one or more PV generators. Terminal Tin2 may be coupled to the input of the other DC/DC converter, and may be configured to be coupled to a second set of one or more PV generators. The converters' common terminals may be coupled to one another and made available via external terminal Tcom. The converters' output terminals may be coupled to one another, with the converters being configured to process the input voltages to allow matching and coupling of output voltages. The coupled output terminals may then be split into three externally available output terminals Tout1, Tout2 and Tout3, with each terminal capable of carrying a portion of a total photovoltaic string current. In some embodiments, power device 1702 may comprise more than two converters, may be coupled to more than two sets of photovoltaic generators, and may feature a different number of externally available terminals. In some embodiments, a plurality of photovoltaic power devices may be coupled to one another using conductors of predetermined length at the time of manufacturing, packaged and sold as a single unit, and deployed as a single unit when installing a photovoltaic system.

Figure 17B:
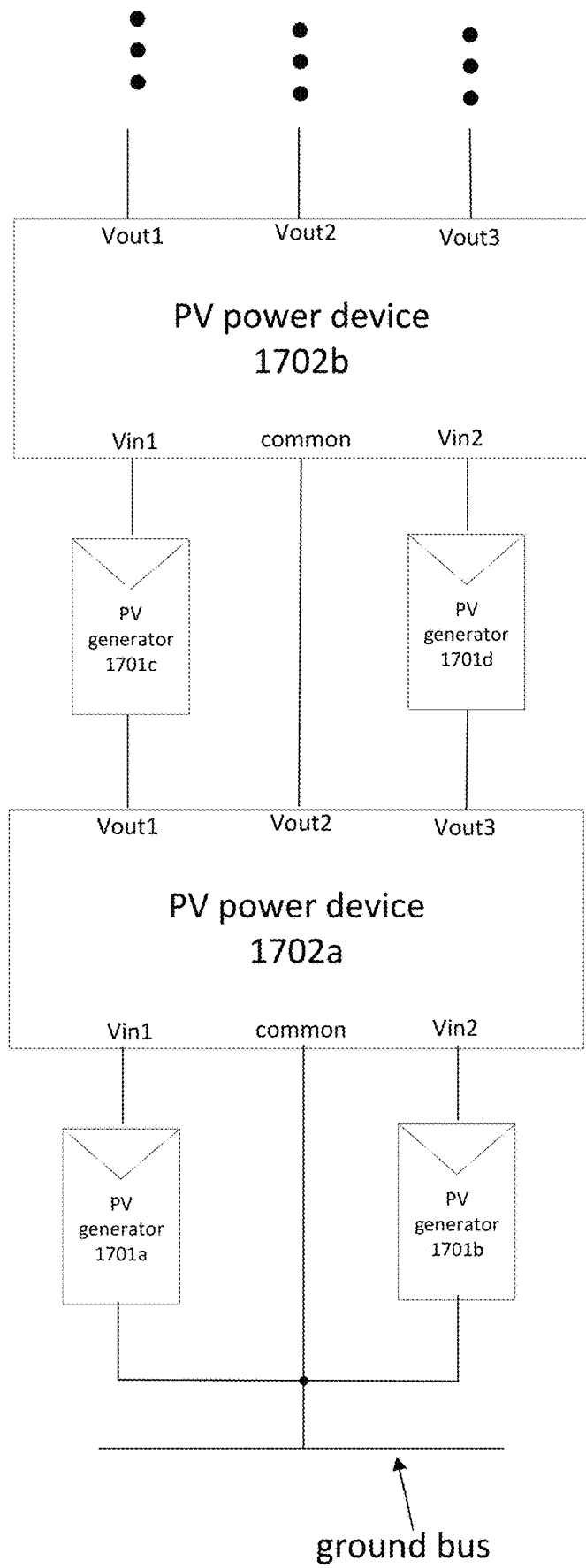

Reference is now made to FIG. 17B, which shows a portion of a photovoltaic string according to illustrative embodiments. Photovoltaic generators 1701a and 1701b may have their negative output terminals coupled to the string ground bus, and have their positive output terminals coupled to the Vin1 and Vin2 terminals of PV power device 1702a. PV power device 1702a's common terminal may also be coupled to the ground bus. Output terminals Vout1 and Vout3 of power device 1702a may be coupled to the negative output terminals of additional PV generators 1701c and 1701d, respectively. Power device 1702a may be coupled to the next power device in the string, 1702b, by coupling output terminal Vout2 of device 1702a to the common terminal of device 1702b. Additional PV generators and power devices may be connected similar to the manner described herein to form a photovoltaic string. The three output terminals of the final power device in the string may be coupled to a power bus (not shown). Using the cabling scheme described herein allows the string current to be split along three paths, potentially reducing system losses and allowing cheaper conductors to be used for some of the conduction paths. The portion of the photovoltaic string illustrated in FIG. 17B may be included in photovoltaic installation 900 in place of string 905.

Figure 18A:
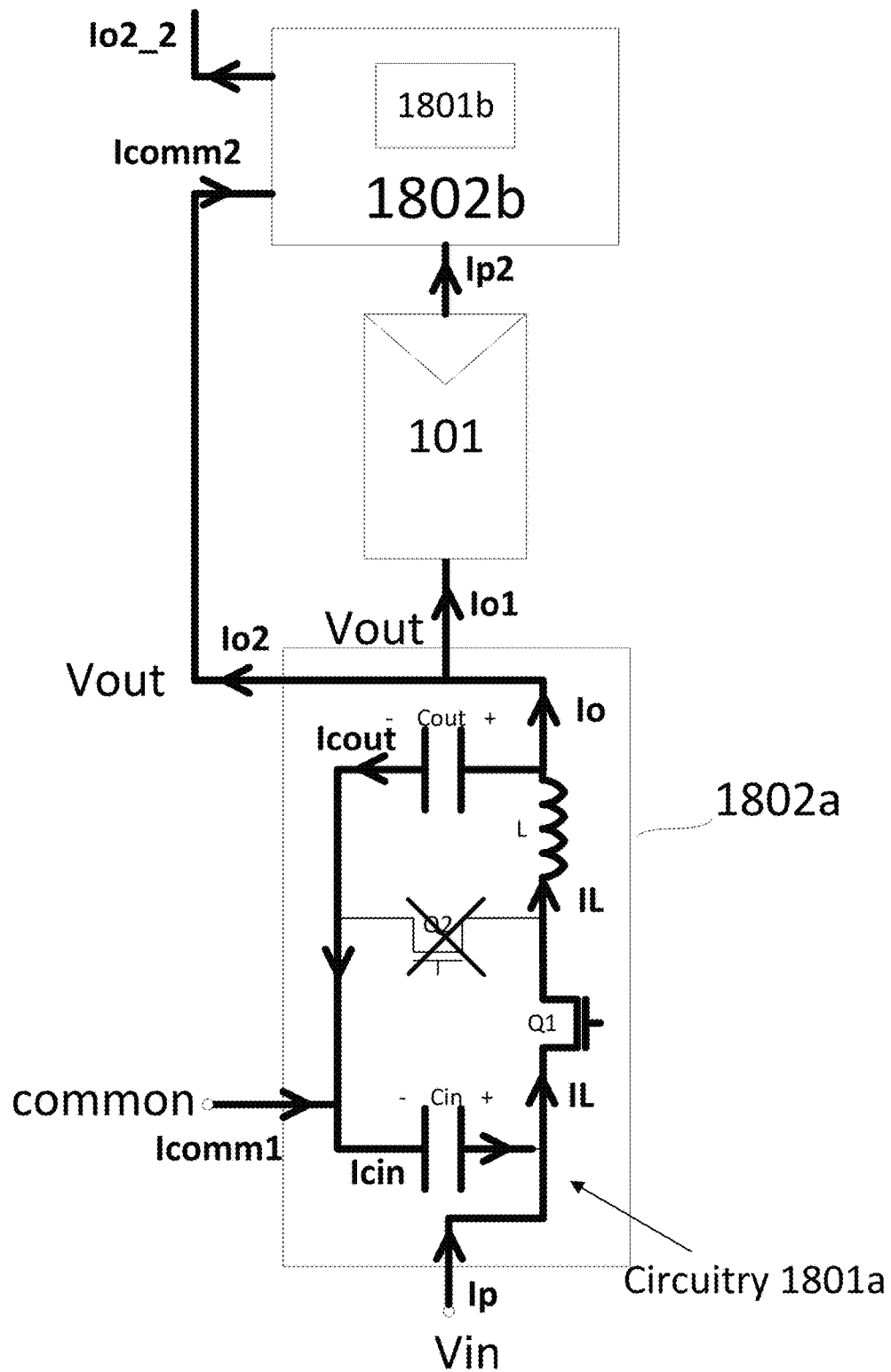
FIGS. 18A-18G illustrate operational aspects of a PV system according to various aspects of the present disclosure.

Reference is now made to FIG. 18A, which shows PV power device 1802a comprising circuitry 1801a. PV power device may be the same as or similar to previously described photovoltaic power devices according to various illustrative embodiments (e.g., PV power device 902 of FIGS. 9A-9D, PV power device 1202 of FIG. 12A-12B, PV power device 1302 of FIG. 13, etc.). Circuitry 1801a may be similar to or the same as circuitry of FIG. 11A. FIG. 18A depicts the current flowing in the branches of circuitry 1801a when switch Q2 is OFF and Q1 is ON. Current Icomm1 flows into the circuitry from the common terminal and current Ip flows into the circuitry from the Vin terminal. Current IL flows through switch Q1 and inductor L and the current Io is split into two portions, Io1 and Io2, which flow through the two Vout terminals, respectively. The currents Icin and Icout flow through the capacitors Cin and Cout, respectively. According to the denoted capacitor voltage polarities, Cin is discharging, and Cout is charging. The voltage drop across inductor L is about (i.e. assuming negligible voltage drop over switch Q1) Vout-Vin, which in this illustrative embodiment will be negative (since the circuitry comprises a buck converter), leading to a reduction in the current flowing through inductor L. According to Kirchoff's Current Law (KCL), the following relationships hold:

Icin=Icomm1+Icout

IL=Ip+Icin

Icout =IL - Io

Io =Io1+Io2.

Current Io1 flows through a PV generator 101 and into PV power device 1802b comprising circuitry 1801b, which may be similar to or the same as circuitry 1801a. If no current leaks out of PV generator 101, then Ip2=Iob1. Similarly, Io2=Icomm2, i.e. one of the output current portions of circuitry 1801a becomes input current at the common terminal of PV power device circuitry 1801b.

Figure 18B:
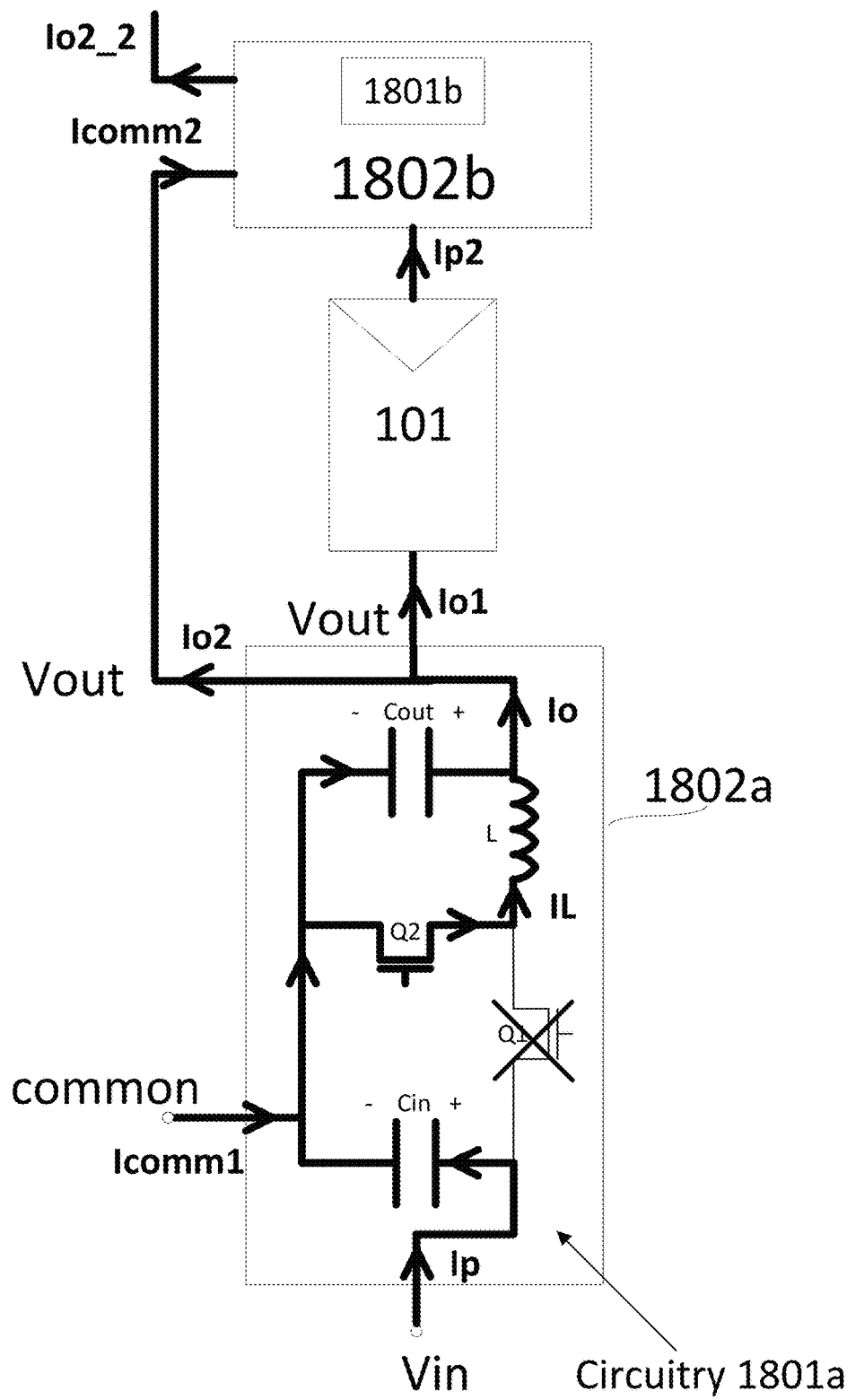

Reference is now made to FIG. 18B, which shows circuitry 1801a when switch Q1 is OFF and switch Q2 is ON. According to the denoted capacitor voltage polarities, Cin is charging, and Cout is discharging. The voltage drop across inductor L is Vout, which is a positive quantity, leading to an increase in the current flowing through inductor L. The increase in inductor current when Q2 is ON compensates for the decrease in inductor current when Q2 is OFF, and the DC current flowing through inductor L is about constant under constant operating conditions (e.g. no change in the solar irradiance, the performance of the PV generators or in the load connected to the photovoltaic system).

Figure 18C:
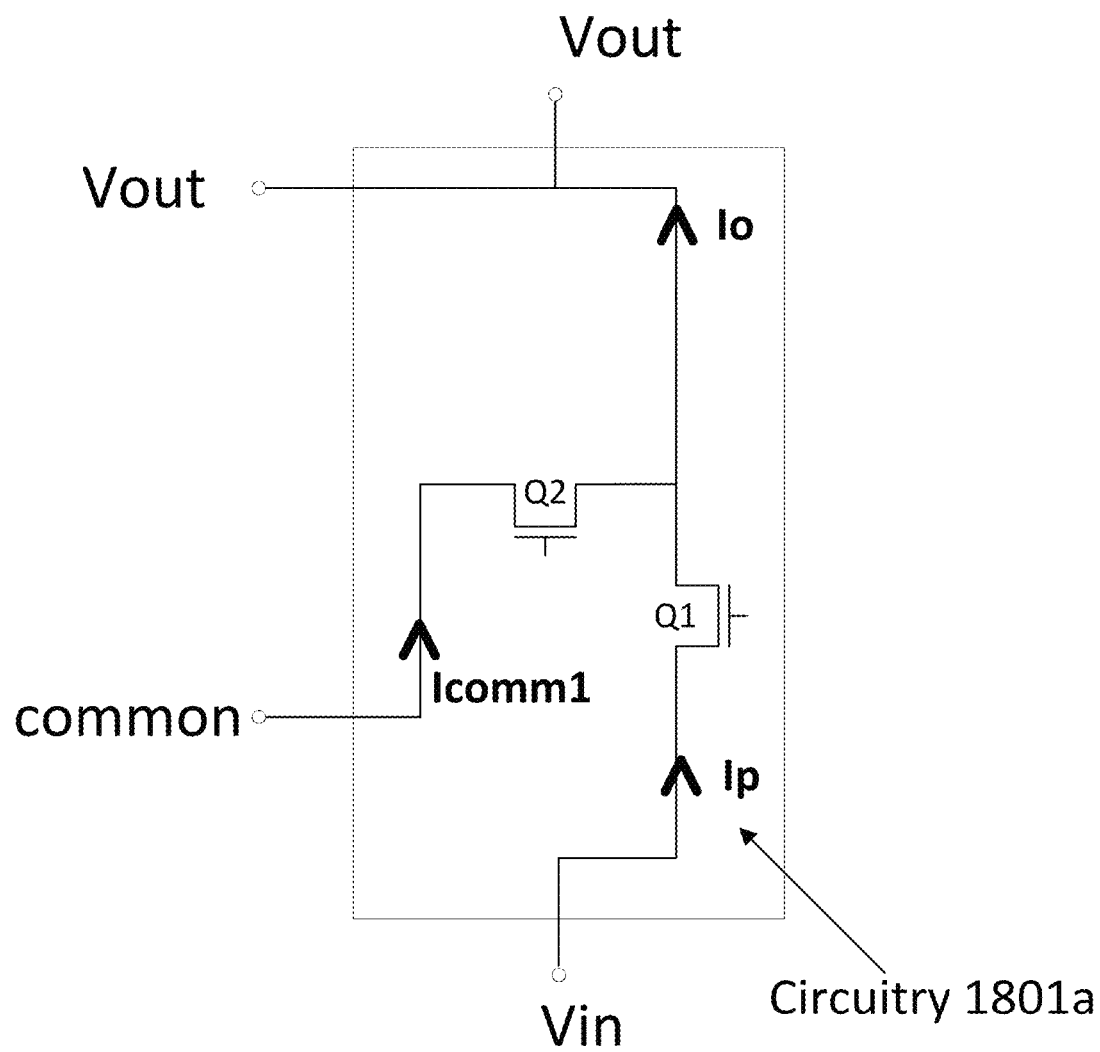

Reference is now made to FIG. 18C, which shows a DC-equivalent circuit of circuitry 1801a according to the illustrative embodiments of FIGS. 18A and 18B. The inductor L has been replaced with a short-circuit, and the capacitors Cin and Cout have been replaced by open circuits, in accordance with common practice when obtaining equivalent DC-models of electrical circuits. Under the operating condition where Q1 and Q2 are switched in opposing states (e.g., Q2 is off when Q1 is on, and Q2 is off when Q1 is on), D denotes the duty cycle of switch Q1, i.e. the relative portion of each switching cycle in which Q1 is ON (e.g. D=0.2 corresponds to Q1 being ON 20% of the time, and Q2 being on 80% of the time), then the DC current lo can be expressed as .

Figure 18D:
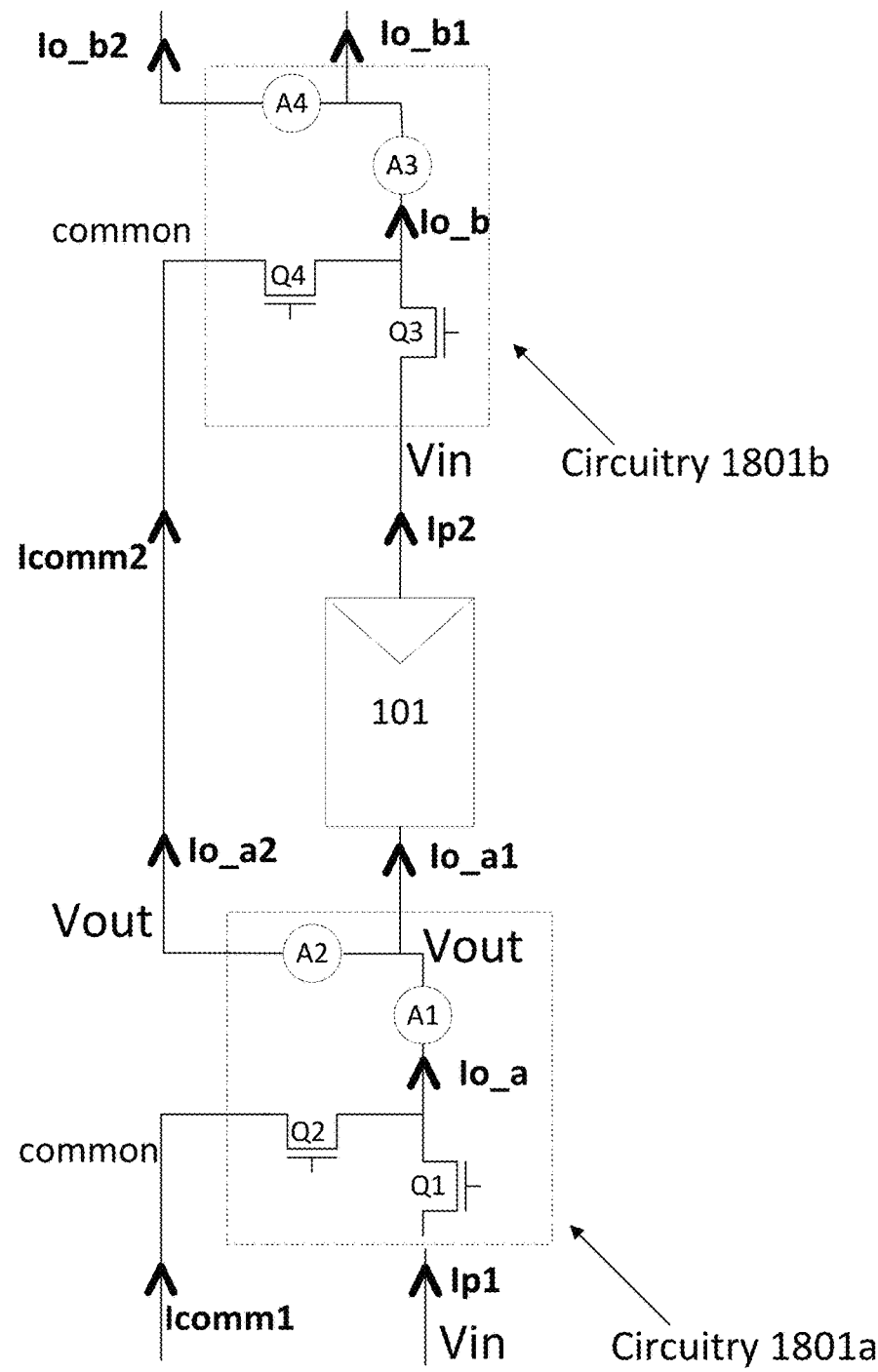

Reference is now made to FIG. 18D, which shows a DC-equivalent circuit of serially-connected circuitry 1801a and 1801b. Output current Io a1 of circuitry 1801a is coupled (e.g. connected) to PV generator 101, with PV generator outputting current Ip2 to the Vin terminal of circuitry 1801b. If little or no current leaks out of PV generator 101, then Io a1 ~ Ip2. Similarly, Io a2=Icomm2. Ammeters A1, A2, A3 and A4 may measure the DC components of currents Io a, Io a2, Io b and Io b2, respectively. Currents Io a1 and Io b1 may be readily computed by the results as Io b1=Io b—Io b2, and Io a1=Io a—Io a2. Ammeters A1 and A2 may be part of a power device (e.g. power device 1202 of FIG. 12A) and may be coupled to a control device and to a communication device (e.g. control device 1270 and communication device 1250 of FIG. 12A, where circuitry 1801a may be part of power converter 1240). Similarly, ammeters A3 and A4 may be part of a different power device (e.g. a second power device 1202 of FIG. 12A) coupled to a control device and may be to a communication device (e.g. control device 1270 and communication device 1250 of FIG. 12A, where circuitry 1801b may be part of power converter 1240).

Still referring to DC-analysis of the circuitry of FIG. 18D, the absence of electrical storage devices (and assuming no current leakage) leads to the equations Ip1+Icomm1=Io a=Io a1 +Io=Ip2 +Icomm2=Io b=Io b1+Io b2. Switch Q4 is serially connected to ammeter A2. Similarly, switch Q3 is serially connected to PV generator 101, which carries current Io a1. As mentioned above, Io a1 is calculated as Io a1=Io a−Io a2, with Io a and Io a2 directly measured by ammeters A1 and A2, respectively. In some embodiments, Io a1 may be directly measured, along with Io a and/or Io a2. If Io a1 and one of either Io a or Io a2 are directly measured, then the unmeasured current may be calculated using the two measured currents.

Still referring to FIG. 18D, varying the duty cycles of switches Q3 and 04 may affect the DC current measurements of ammeters A1 and A2. As a numerical example, if Io b=Io a=15[A] and a duty cycle of D=0.5 is selected for the operation of switch Q4, then the equation will hold. If the duty cycle is changed from 0.5 to 0.2, then the new equation will be . Therefore (unless, coincidentally,, but that condition can be easily avoided by selecting a duty cycle for switch Q1 which creates an inequality), and will hold, and varying the duty cycles of switches Q3 and Q4 of circuitry 1801b may cause the DC current readings of ammeters A1 and A2 of circuitry 1801a to change.

Figure 18E:
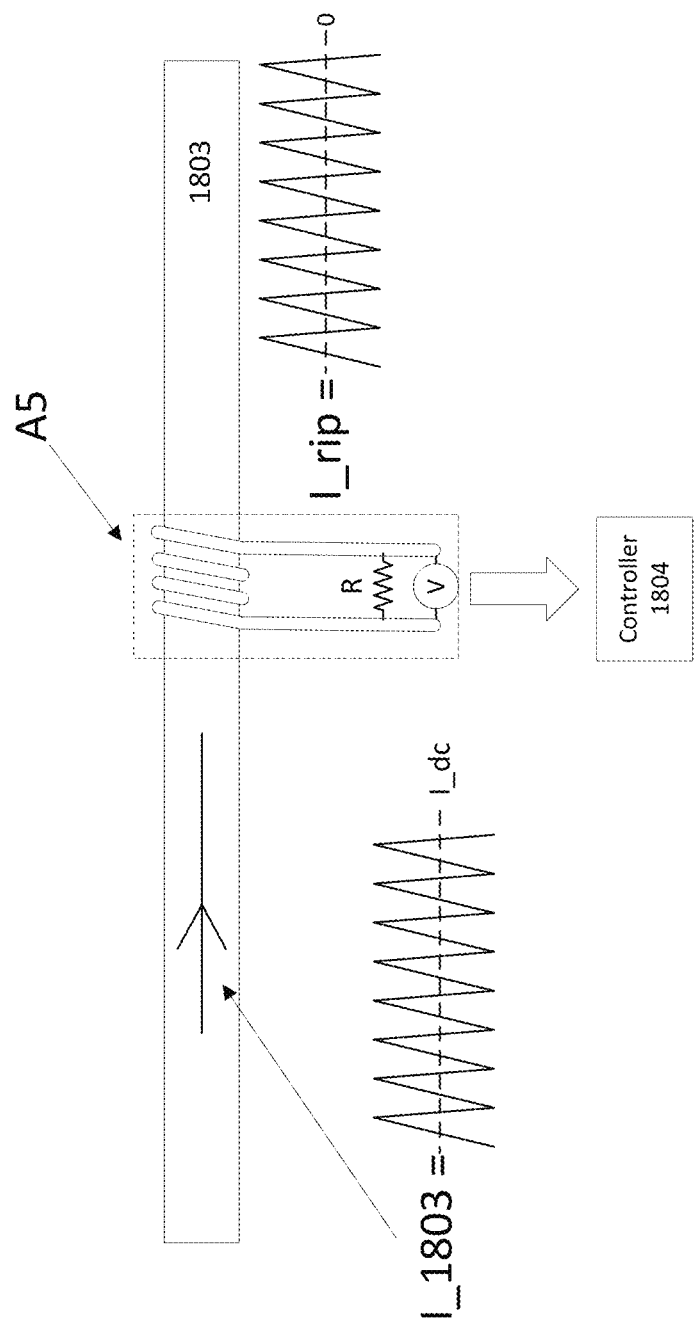

Reference is now made to FIG. 18E, which illustrates an apparatus for detecting alternating-current components in the current flowing through system conductors according to illustrative embodiments. Conductor 1803 may be a conductor carrying current | 1803, which may be similar to or the same as currents IL, Io, Io1 or Io2 of FIG. 18B. Current | 1803 may include a direct-current (DC) component which may correspond to a DC current such as Io a, Io a1 or Io a2 of FIG. 18D. Current | 1803 may further include an alternating-current (AC) component | rip caused by variations in the current flowing through a power-converter inductor (e.g. inductor L of circuitry 1801a in FIG. 18B). Ammeter A5 may be coupled to conductor 1803 and may be configured to measure the AC-current component | rip of current | 1803. According to one illustrative embodiment, ammeter A5 comprises windings wound around conductor 1803 and coupled (e.g. connected) to resistor R. According to Faraday's Law of Induction, the voltage measured across resistor R will be proportional to the change in magnetic flux through the windings, which in turn will be proportional to the current flowing through the windings. In some embodiments, a different type of AC-ammeter may be used, such as a hall effect sensor.

The current I rip measured by ammeter A5 may depend on the amplitude, frequency, and duty cycle of the AC-component of the current flowing through conductor 1803. For example, if the AC component of current | 1803 has a high frequency (e.g. tens or hundreds of kHz, or MHz), ammeter A5 may detect a corresponding high frequency in current I rip.

Similarly, the positive and negative slopes of a triangular current waveform may be calculated by ammeter A5. In some embodiments, ammeter A5 provides current measurements to controller 1804, with controller 1804 calculating the frequency, slope values and amplitude of the corresponding triangular waveform. Controller 1804 may be similar to or the same as control device 1270 of FIG. 12A.

Figure 18F:
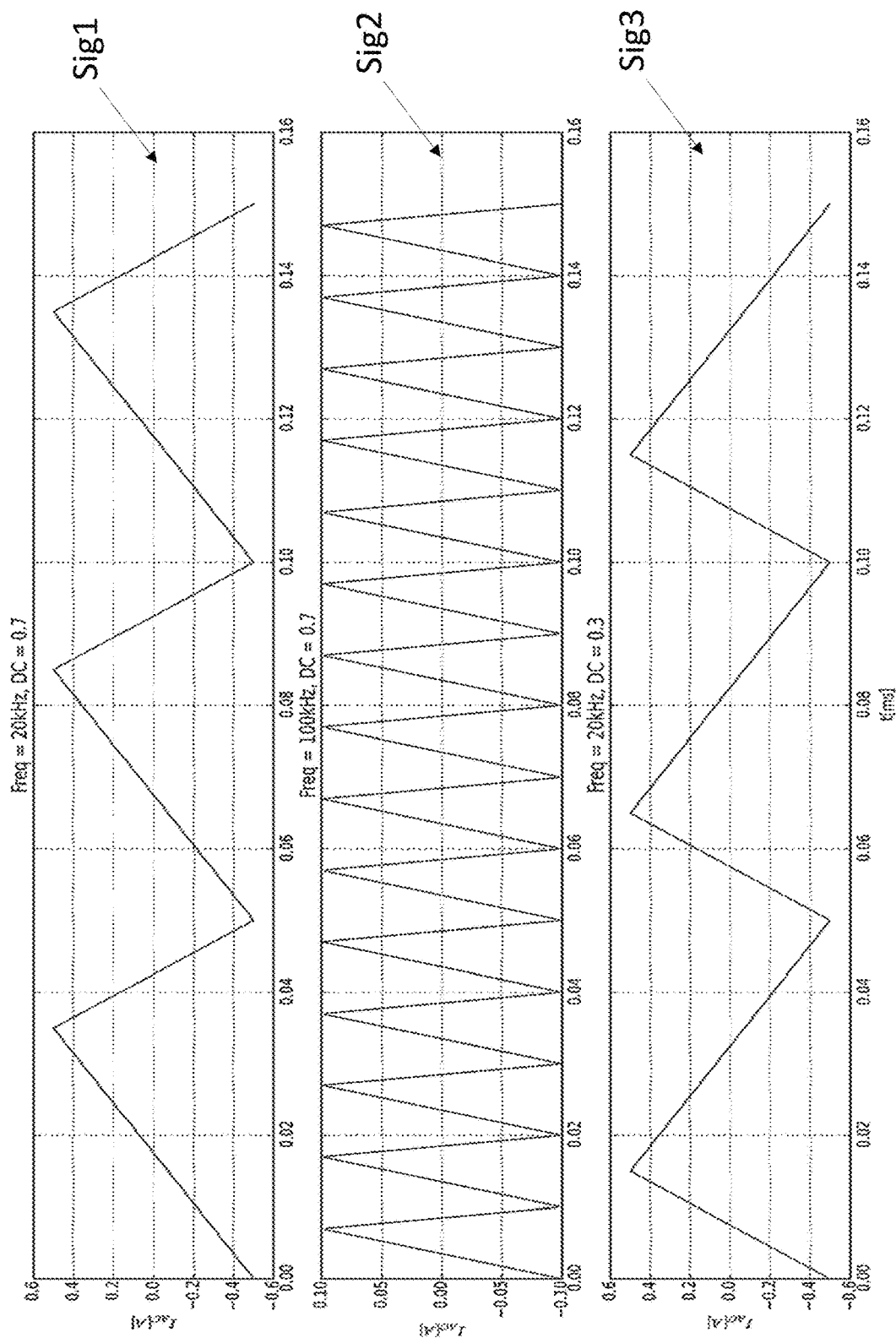

Reference is now made to FIG. 18F, which illustrates various alternating current signals which may be generated by controlling the switching of switches Q1-Q4 of FIG. 18D. Sig1 is a 20kHz triangular wave with an amplitude of 1Vp-p, a rising slope of and a falling slope of . Sig2 is a 100kHz triangular wave with an amplitude of 0.2Vp-p, a rising slope of and a falling slope of . It is evident that Sig1 and Sig2 have essentially the same shape and slope values, indicating that they are generated by switches switching at similar duty cycles. However, Sig2 is of a frequency larger by a factor of five than the frequency of Sig1, and the ripple amplitude is correspondingly smaller by a factor of five. Sig1 may represent a current measured by AC ammeter A2 when operating the circuit of FIG. 18B, switching switch Q3 at a frequency of 20kHz and a duty cycle of 0.7. When the frequency of Q3 is increased to 100kHz, the current measured by ammeter A2 corresponds to Sig 2. If the switching frequency of Q3 is maintained at 20kHz, but the duty cycle is changed from 0.7 to 0.3, ammeter A2 measures a current corresponding to Sig3, which has a positive slope of and a negative slope of . In various embodiments, either a DC-current ammeter or an AC-current ammeter (e.g. ammeter A2) deployed in a first power device circuitry (e.g. circuitry 1801b) may detect changes in current by changing the switching duty cycle of a switch (e.g. Q3) deployed in a second power device circuitry (e.g. circuitry 1801a).

Figure 18G:
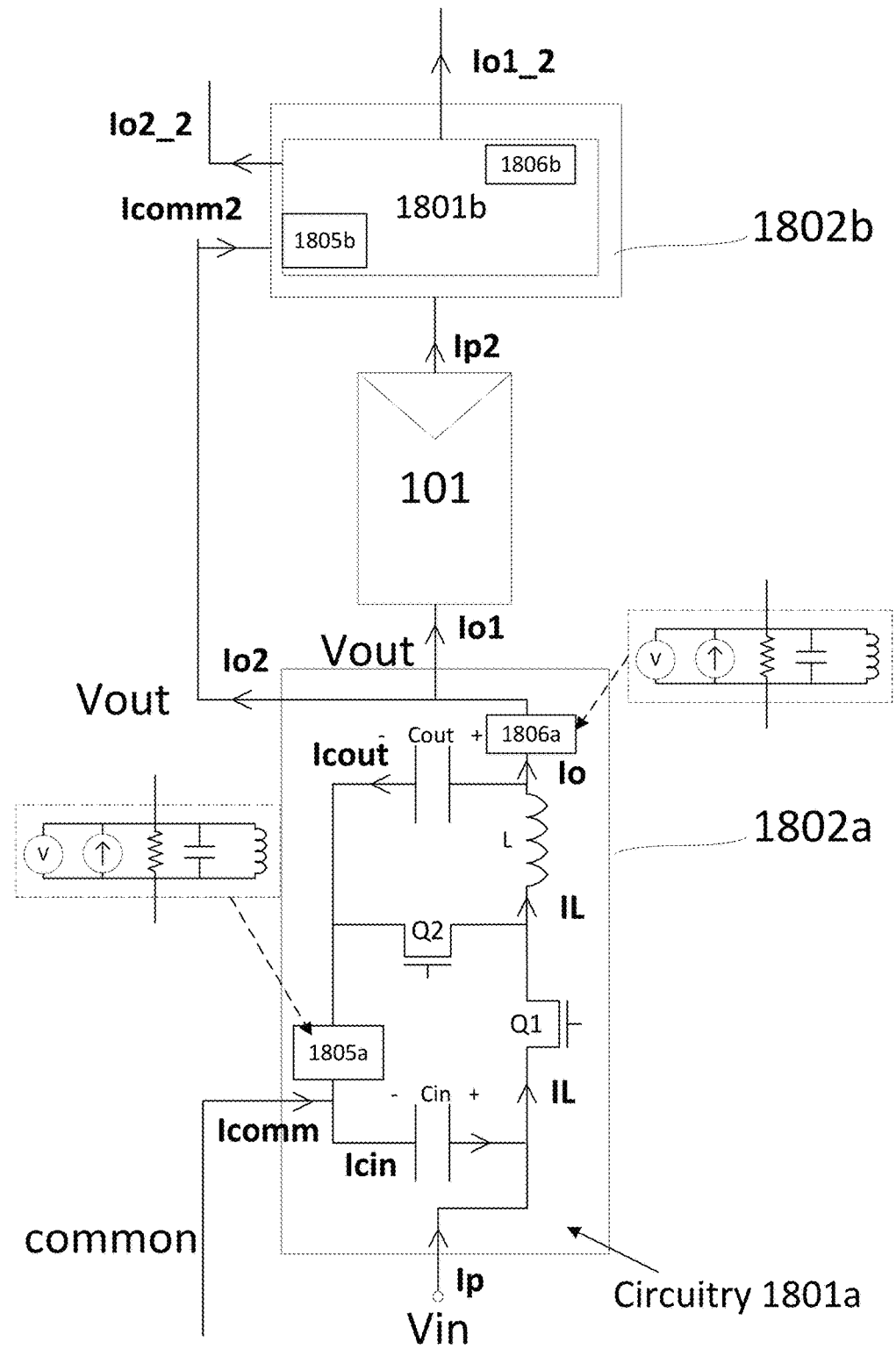

Reference is now made to FIG. 18G, which illustrates PV power device circuitry according to illustrative embodiments. Power line communication (PLC) circuit 1805a may be deployed in circuitry 1801a, between the common terminal and the negative node of output capacitor Cout. PLC circuit 1806a may be deployed in circuitry 1801a, between the Vout terminals and the positive node of output capacitor Cout. PLC circuits 1805b and 1806b may be similarly deployed in PV power device circuitry 1801b. PLC circuits 1805a-b and 1806a-b may be variously implemented. In one embodiment, each PLC circuit comprises a parallel circuit comprising a resistor, an inductor, a capacitor, a current source and a voltmeter. The inductor and capacitor sizes are selected to resonate at a resonance frequency, with the equivalent circuit impedance achieving a maximum value at the resonance frequency. The current source of each PLC circuit injects a high-frequency (e.g. tens or hundreds of KHz) current signal into the PV power device circuitry, with a portion of the current signal reaching the other PLC devices, inducing a high-frequency voltage across the resistor terminals and measured by the voltmeter.

Implementation of Power Line Communications (PLC) over a conventional serial string of photovoltaic power devices may be challenging due to the presence of inductors (e.g.

inductor L of circuitry 1801a) which inherently suppress high-frequency current signals. This challenge is generally overcome by broadcasting current signals at a high enough amplitude to enable signal detection even after the attenuation caused by inductors. However, point- to-point PLC over serial strings of PV power devices includes the additional challenge of differentiating between current signals generated by different PV power devices. For example, in a string comprising ten serially-connected PV power devices, a current signal broadcast by a first PV power device may be received by the other nine power devices at about the same amplitude, making it difficult to determine the relative order of PV power devices with respect to one another.

By coupling an output of a first to PV power device to an input of an adjacent PV power device, the novel cabling method described herein may enable point-to-point PLC between adjacent PV power devices that is unimpeded by inductors. In the illustrative embodiment of FIG. 18G, PLC circuit 1806a of circuitry 1801a is coupled to PLC circuit 1805b of circuitry 1801b with no inductor disposed between them. Because there is no inductor between PLC circuits 1806a and 1805b, PLC circuit 1806a may receive a high-frequency current signal transmitted by PLC circuit 1805b at a higher amplitude than the signal amplitude received by other PLC circuits included in the serial string. Similarly, PLC circuit 1805b may receive a high-frequency current signal transmitted by PLC circuit 1806a at a higher amplitude than the signal amplitude received by other PLC circuits included in the serial string. The increased PLC signal amplitude detected by an adjacent PV power device enables each PV power device to determine which device(s) are its "neighbors," e.g., directly adjacently connected.

As mentioned above, in some illustrative embodiments (e.g. the circuitry of FIG. 18D) PV power device circuitry may enable one-way adjacency determination even without specialized PLC circuitry. For example, PV power device circuitry 1801a may determine that it is connected to circuitry 1801b by on knowing the duty cycle which each serially connected PV power device is being operated at and measuring the currents Io a1 and Io a2. However, circuitry 1801b might not be able to determine that it is connected to 1801a, rather, it may determine that it is connected to the next PV power device in the string (e.g. 1801c, not explicitly depicted). By adding PLC circuitry (e.g. as depicted in FIG. 18G), the adjacency determination may be two-way.

Various aspects include mapping the location of power devices in photovoltaic installations, as well as various methods and apparatuses for carrying out localization algorithms. The circuitry disclosed in FIGS. 18A-18G may enable certain PV power devices to determine which other PV power devices are directly connected to them if they are provided with information regarding the operating state of neighboring PV power devices. Aggregation of the determinations made by each PV power device in a serial string of PV power devices may enable a full map to be generated, the map including location information for each PV power device.

Figure 19A:
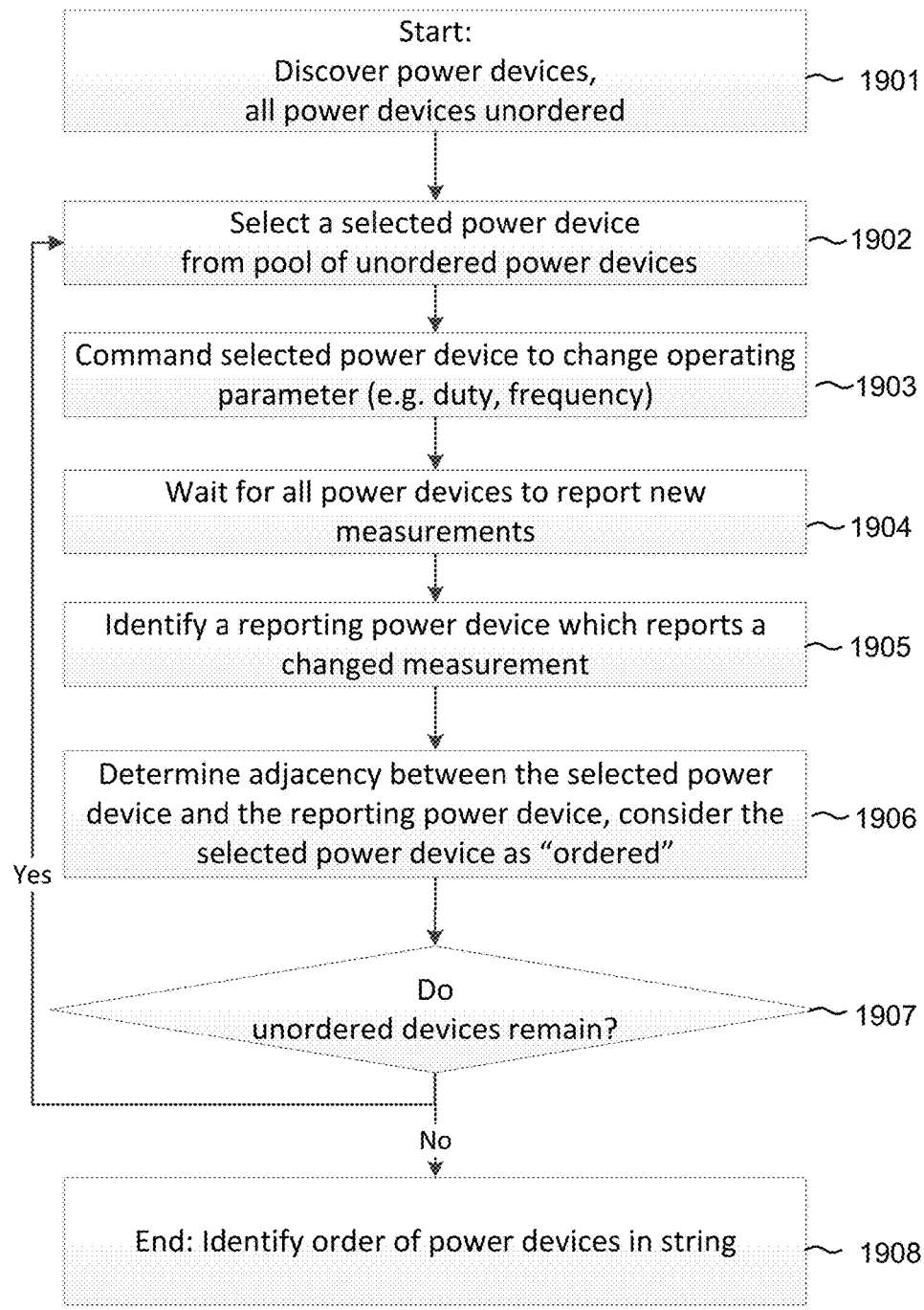
FIGS. 19A-19C illustrate methods of operating and associated states of a PV system according to various aspects of the present disclosure.

Reference is now made to FIG. 19A, which depicts an illustrative method for determining the order of serially coupled PV power devices comprising a photovoltaic string. Method 1900 may be applied to photovoltaic strings comprising PV power devices and circuitry according to illustrative embodiments (e.g. string 905 of FIG. 9A, which may comprise PV power devices 902 having circuitry similar to or the same as circuitry 1801a of FIGS. 18A-18D, 18G). Method 1900 may be carried out by a control device in communication with PV power devices. For example, the method may be carried out by system power device 906 of FIG. 9A, system power device 1402 of FIG. 14, system power device 1912 of FIG. 19B, or system power device 1506 of FIGS. 15A-15B, with control and communication devices (e.g. devices comprised by system power device 110 of FIG. 9A, or controller 1520 and communication device 1550 of FIG. 15B) carrying out the method steps. In an alternative embodiment, a PV power device (e.g. PV power device 1202 or 1220 of FIGS. 12A-12C) may operate in a "master mode" and carry out method 1900 with regard to the other PV power devices comprised by the PV string.

At step 1901, the method is initialized The control device carrying out method may discover PV power devices in a photovoltaic string, e.g. by receiving unique ID numbers of the PV power devices comprises by string. As an illustrative example, each PV power device may transmit a telemetry (e.g. by a wireless transmitter, or by power line communications) to the system power device, the telemetry including the PV power device's unique ID. The system power device may store the PV power devices' ID numbers to memory.

In some embodiments, the control device carrying out the method may have a list of PV power devices comprised in the PV string. For example, the control device may have PV power device identification numbers stored to memory. The method may identify an order in which the PV power devices are connected, with all serially coupled PV power devices initially unordered (i.e., there is no available information regarding the sequential order in which PV power devices are arranged. For example, for every pair of a first PV power device and a second PV power device in a serial PV string, it might not be known if the first PV power device is coupled closer to a ground bus than the second PV power device, or if the second PV power device is coupled closer to the ground bus than the first PV power device). At step 1902, a device (e.g., 1506) may select one of the PV power devices as a selected power device which has not yet been ordered (i.e. its sequential order in relation to a different PV power device has not been determined) . The first time step 1902 is reached, all PV power devices in the string may be candidates for selection as the selected power device. In subsequent iterations of a portion of the method, step 1902 may select a selected power device from a shrinking pool of power devices, since at each iteration, a selected power device may be classified as "ordered" and might not be a candidate for selection at the next iteration.

At step 1903, the device performing the method may command the selected power device to change an operational parameter. For example, the selected power device may comprise switches (e.g., the selected power device may comprise circuitry such as circuitry 1801b of FIG. 18D, including switches Q3 and Q4), and at step 1903, the selected power device may be commanded to change a duty cycle or frequency of a switching signal. The command to change an operational parameter may be issued by a system power device, and the transmitted command may include an ID number of the selected power device. In some embodiments, the command is received by some or all of the PV power devices, but may be ignored by all PV power devices not having the ID number indicated by the command (i.e. all PV power devices which are not the selected power device).

In illustrative PV systems, PV power devices comprising a PV string may periodically transmit reports and/or telemetries to system power devices. For example, with reference to FIG. 12A, communication device 1250 may periodically transmit measurements (e.g. current, voltage, temperature and/or irradiance measurements) taken by sensor/sensor interfaces 1280 to a system power device. At step 1904, the system power device carrying out method 1900 may wait to receive measurements from some or all of the PV power devices comprising the PV string. One or more of the PV power devices may report measurements which indicate that they are adjacent to the selected power device.

As an illustrative example, the selected power device may comprise circuitry 1801b of FIG. 18D. Prior to step 1903, switch Q3 may be switched at a duty cycle of 0.7, and the power device comprising circuitry 1801a may periodically report (e.g. to a system power device) the DC current measured by ammeters A1 and A2. As explained previously, the DC current measured by ammeter A2 may reflect the duty cycle of switch Q3. At step 1903, the selected power device may be commanded by a system power device to change the duty cycle of switch Q3 from 0.7 to 0.3. The change in duty cycle may be reflected by measurements taken by ammeter A2, and at step 1904, the new measurements may be received by a system power device from the power devices.

At step 1905, the system power device may compare measurements received from PV power devices to previously received measurements, and may detect the change in measurements received from circuitry 1801*b*. In response to detecting the change in measurements received from circuitry 1801*b*, the method may determine that circuitry 1801*b* is adjacent to the selected power device, determine that circuitry 1801*b* is comprised by a second, reporting power device adjacent to the selected power device, and uniquely identify the reporting power device (e.g. identified by its associated unique ID number) as being adjacent to the selected power device (e.g., as identified by its associated unique ID number).

At step 1906, the system power device carrying out method 1900 method may consider the selected power device as "ordered" and remove it from the pool of unordered devices. The method may save to memory an indication that the selected power device is adjacent to the reporting power device. As the method iterates through steps 1902-1907, the method may create a table mapping selected PV power devices to their "neighbors", i.e. one or more adjacent PV power devices.

At step 1907, if unordered devices remain, the method may loop back to step 1902. If no unordered devices remain, the method may proceed to step 1908, and aggregate the results stored when iterating over steps 1902-1907. The results stored by the time step 1908 is reached may enable the method to identify the sequence in which the PV power devices are wired in the string.

Figure 19B:
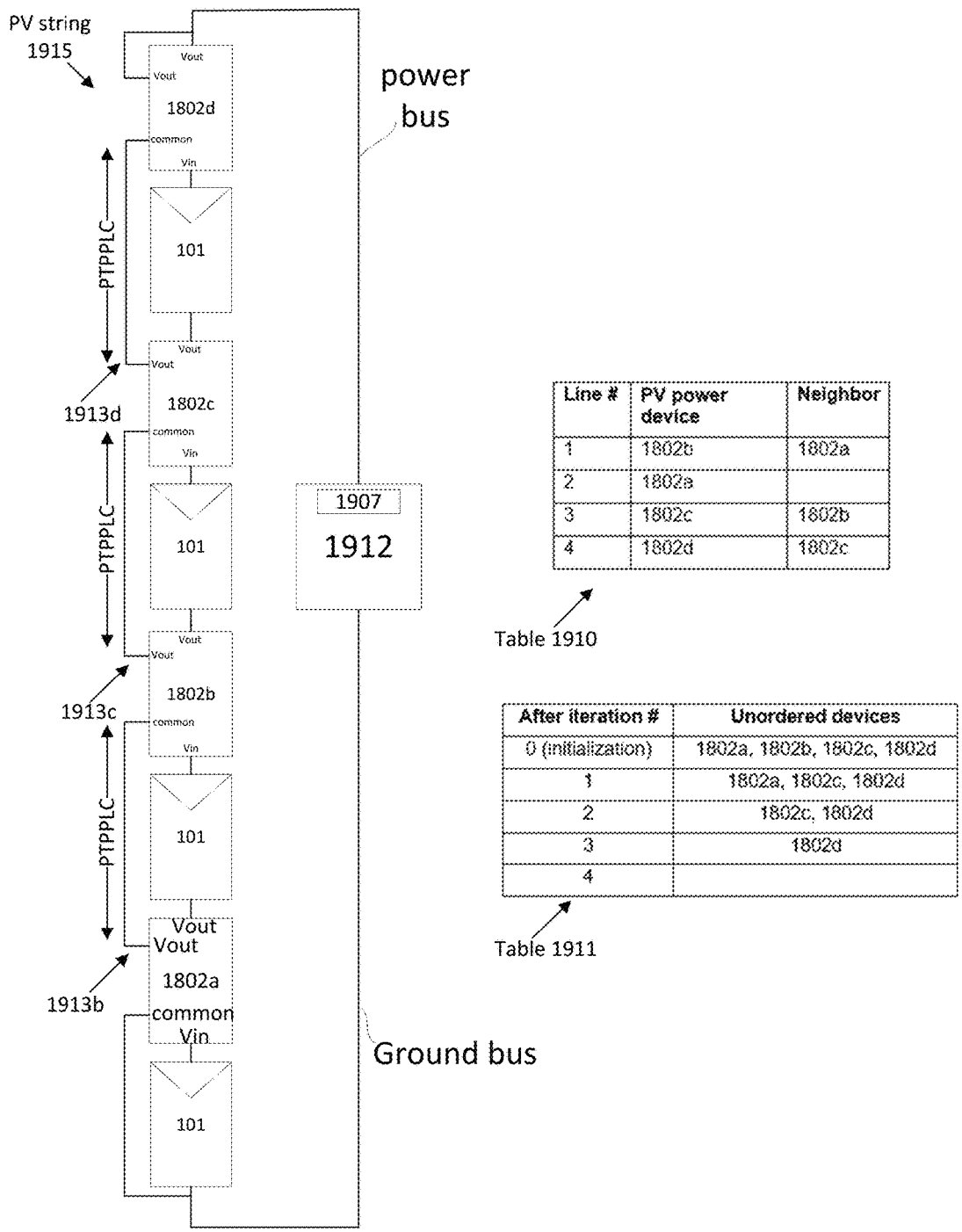

Reference is now made to FIG. 19B, which illustrates, by way of example, a result of running method 1900 on an illustrative PV string. In this illustrative example, PV string 1915 comprises four PV power devices: 1802*a*, 1802*b*, 1802*c* and 1802*d*, each comprising circuitry similar to or the same as circuitry 1801*a* of FIGS. 18A-18D or of FIG. 18G. At the outset of the method, the order of the power devices is unknown (i.e. the method does not know which (i.e. first) PV power device is coupled to the ground bus, which (i.e. second) PV power device is coupled to the first PV power device, and so on. At the method initialization, table 1910 is empty, and table 1911 indicates that the pool of unordered power devices comprises all of the PV power devices in string 1915. The first time the method reaches step 1902, the method selects (e.g. at random, the lowest ID number, etc.) power device 1802*b* as the selected power device. At step 1902, PV power device 1802*b* may be commanded to change an operating parameter (e.g. the duty cycle of switching elements in PV power device 1802*b*). At step 1904 PV power devices 1802*a-d* report measurements taken by sensors/sensor interfaces such as ammeters. At step 1905, the method may determine that only the measurements taken by PV power device 1802*a* have changed substantially, and may determine that PV power device 1802*a* is adjacent to PV power device 1802*b*. At step 1906, Line #1 of table 1910 may be saved to memory, indicating that PV power devices 1802*a*, 1802*b* are adjacent to one another, and PV power device 1802*b* may be removed from the pool of unordered devices (as indicated by table 1911, in the line corresponding to the end of the first iteration).

At step 1907, the method may determine that the pool of unordered devices is not empty, loop back to step 1902, and select PV power device 1802*a* as the selected power device. In some embodiments, the selection may be random. In some embodiments, the reporting power device of the previous iteration may become the selected power device (provided it is still in the pool of unordered devices). At the next time step 1905 is reached, the method may determine that no PV power devices have reported changed measurements, and may determine that PV power device 1802*a* is coupled to the ground bus. In this iteration, no reporting power device may be labeled, and Line #2 of table 1910 may be generated indicating the PV power device 1802*a* has no neighbor at this iteration. PV power device 1802*a* may be removed from the pool of unordered devices at step 1906.

After iterating through steps 1902-1907 an additional two times, step 1908 may be reached, with table 1910 having four line indicating the results of the four iterations through steps 1902-1907. At step 1908, the method may determine that PV power device 1802*a* is coupled to the ground bus, as indicated by Line #2 of table 1910. The method may determine that PV power device 1802*b* is coupled to PV power device 1802*a* (as indicated by Line #1 of table 1910), PV power device 1802*c* is coupled to PV power device 1802*b* (as indicated by Line #3 of table 1910), and that PV power device 1802*d* is coupled to PV power device 1802*c* (as indicated by Line #4 of table 1910). The method may therefore output the determination that the order of the power devices is 1802*a*-1802*b*-1802*c*-1802*d*, as shown in the figure.

Point-to-point PLC between adjacent power devices may be used for a variety of communication and control applications in addition to mapping photovoltaic installations. For example, in some photovoltaic installations, photovoltaic power devices may measure operational parameters such as input or output voltage, input or output current, input or output power, and the temperature and/or solar irradiance in the vicinity of the power device. These operational parameters may be periodically transmitted via PLC (e.g., by a sequence of point-to-point PLC transmissions along the string of power devices) to a data collection point, such as a memory or control device (e.g. a dedicated data collection or control device, or a device included in a system device such as a power combiner box or DC-to-AC inverter). In PLC that does not use the point-to-point configuration as disclosed herein, a transmitted data packet may be transmitted at a high power amplitude, to enable the transmitted signal to be received at the data collection point at a power amplitude sufficient to be detected by PLC receiving circuitry. For example, a last power device may be located 100 meters away from the data collection point, with 15 other power devices connected in between the last power device and the data collection point. Without using point-to-point PLC, the last power device would need to transmit a high-power signal to be received 100m away after traversing 15 other power devices. By taking advantage of circuitry deployed in the illustrative embodiment of FIG. 18G, each respective first power device may transmit a signal to be received at the second power device immediately adjacent to the first power device, each power device repeating all messages received from other power devices, reducing the required signal power amplitude. The power device connected to the data collection point may be physically closest to the data collection point, and may transmit data at an amplitude significantly lower than what would otherwise be required by each other power device, still enabling reception of the message by the device collecting data. In some embodiments, the power device connected to the data collection point may transmit data at an amplitude sufficient to traverse several PV power devices. One possible advantage of transmitting data at an increased amplitude may be enablement of continuous communication in case an intermediate device fails. Referring again to FIG. 19B, PV power device 1802a may communicate with PV power device 1802b using Point-to-Point Power Line Communications (PTPPLC) over bypass path 1913b. In some embodiments (e.g. each PV power device 1802 has circuitry similar to or the same as circuitry 1801a of FIG. 18A), communication may be uni-directional (e.g. power device 1802b is able to send data to power device 1802a, while power device 1802a might not be able to send data to power device 1802b), and in some embodiments (e.g. each PV power device 1802 has circuitry similar to or the same as circuitry 1801a of FIG. 18G), communication may be bidirectional (for example, power devices 1802a and 1802b may be able to send data to each other). System power device 1912 (e.g. DC-to-AC inverter or combiner box) may be similar to system power device 110 of FIG. 9A, and may be coupled between the ground bus and power bus, and may comprise a data-collection device (e.g. a memory device, a controller, etc.—not explicitly depicted). System power device 1912 may further comprise PLC device 1907 coupled to carry out power line communications over the power bus and/or the ground bus. Similarly to other illustrative embodiments disclosed herein, additional PV strings similar to PV string 1915 (not explicitly depicted) may be coupled in parallel with PV string 1915, and coupled to system power device 1912. In some embodiments enabling one-way PLC, PV power device 1802d may transmit data to PV power device 1802c, PV power device 1802c may transmit data to PV power device 1802b, PV power device 1802b may transmit data to PV power device 1802a, and PV power device 1802a may transmit data to system power device 1912. In some embodiments enabling two-way PLC, PV power device 1802d may transmit data to system power device 1912 and PV power device 1802c, PV power device 1802c may transmit data to PV power devices 1802d and 1802b, and so on.

System power device 1912 may be configured to transmit commands and/or sent data to PV power devices 1802a-d. For example, step 1903 of method 1900 may comprise system power device 1912 transmitting a PLC signal over the power bus indicating an ID number of a selected PV power device.

In some embodiments, a message sent by a PV power device to an adjacent PV power device may be transmitted at a power amplitude significantly lower than a message which may be sent to system power device (e.g. 1912). For example, communication between PV power devices 1802b and 1802c may utilize much lower power than communication between PV power device 1802b and system power device 1912, due to the much shorter distance and lower number of electrical circuits in between the two communicating devices. In case a PV power device (e.g. 1802b) fails, two PV power devices adjacent to the failed PV power device (e.g. 1802a and 1802c) may communicate via PLC, with PV power device 1802b providing a bypass path for PLC signals. PLC between PV power devices 1802a and 1802c may be carried out at a reduced amplitude compared to the amplitude that would be required for PV power device 1802c to transmit directly to system power device 1912. Significant power savings may be realized by not attempting to transmit data to system power device 1912 by PV power devices not physically close to system power device 1912. Furthermore, the size and cost of associated circuitry for transmitting PLC messages may be significantly reduced by limiting the transmitted data to a lower power amplitude.

Figure 19C:
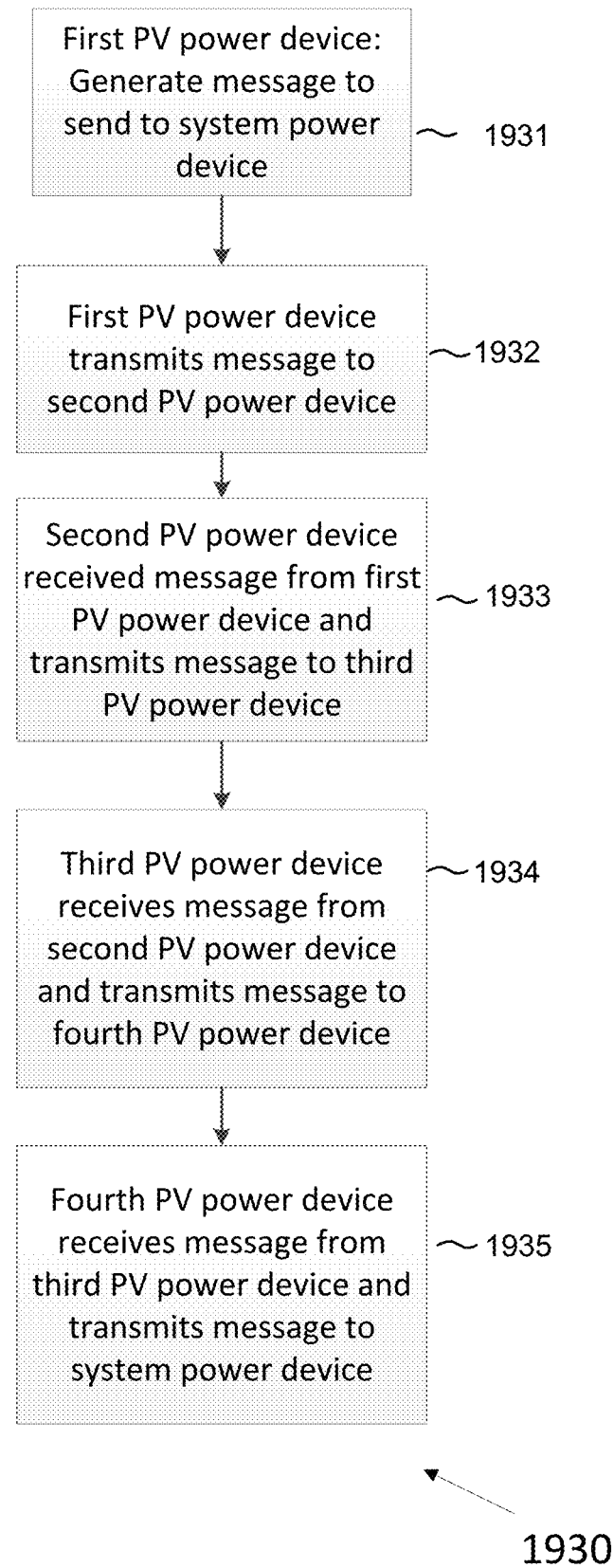

Reference is now made to FIG. 19C, which illustrates a method for point-to-point power line communications (PTP-PLC) according to illustrative embodiments. Method 1930 may be used when, for example, a first PV power device (e.g. PV power device 1802a of FIG. 19B) may send a message (e.g. comprising telemetry data or other operational data) to a system power device (e.g. system power device 1912.) At step 1931, the first PV power device (e.g., 1802a) generates the message to be sent. At step 1932, the first PV power device transmits the message using PTPPLC to a second, adjacent PV power device (e.g., 1802b). For example, the message may be encoded as a high-frequency (e.g. tens or hundreds of kHz) signal transmitted over a first bypass path between the PV power devices (e.g., 1913b of FIG. 19B). In some embodiments, the first PV power device may transmit a message to the second PV power device through a PV generator, e.g. the PV generator 101 coupled between PV power devices 1802a and 1802b). At step 1933, the second PV power device (e.g., 1802b) may receive the message transmitted over the bypass path, and may re-transmit the message to a third PV power device adjacent to the re-transmitting PV power device (e.g., 1802c) over a second bypass path (e.g., 1913c). At step 1934, the third PV power device (e.g. 1802c) may receive the message re-transmitted over the second bypass path (e.g., 1913c), and may re-transmit for a second time the message to a third PV power device (e.g. 1802d) over a third bypass path (e.g. 1913d). Each PV power device in a PV string may receive a message from a first adjacent PV power device, and re-transmit the message to a second adjacent PV power device, until the message is received by a final PV power device adjacent or in close physical proximity to a system power device (e.g. 1912). At step 1934, the final PV power device (e.g. 1802d) may receive the message transmitted over a final bypass path, and may forward the message to a system power device (e.g. 1912) over the power bus. In some embodiments, the communication connections may be reversed, i.e. the first PV power device (e.g. 1802a) may communicate directly with system power device 1912 over the ground bus, with messages generated by the final PV power device (e.g. 1802d) passing through intermittent PV power devices (e.g. 1802c, 1802b and 1802a). In some embodiments, the first and final PV power devices (e.g. 1802a and 1802d) may communicate directly with the system power device (e.g. 1912) over either the ground bus or the power bus, with messages generated by intermediate PV power devices (e.g. 1802b and 1802c) passing through the first or final PV power devices (e.g. 1802a or 1802d) for transmission to system power device (e.g. 1912).

Illustrative embodiments may include a system comprising a plurality of DC/DC converters, each DC/DC converter receiving power from a photovoltaic generator, the DC/DC converters coupled in series or in parallel between a ground bus and a power bus, the DC/DC converters configured to output a time-varying DC voltage. A system power device comprising a group of switches is coupled between the ground bus and the power bus, and is configured to receive the time-varying DC voltage and output an AC voltage. In some embodiments, the system power device further comprises a filter, a controller and/or a communication device. In some embodiments, the controller is configured to switch the switches featured by system power device. In some embodiments, the communication device is configured to communicate with communication devices featured by the PV power devices. In some embodiments, the system power device further comprises a second group of switches, the controller configured to switch the second group of switches in response to a failure of one or more of the first group of switches. In some embodiments, the system includes a second system power device, the second system power device operable in response to a failure of the first system power device. In some embodiments, the DC/DC converters are configured to output synchronized time-varying DC voltage and current signals.

In the illustrative embodiments disclosed herein, photovoltaic generators are used to exemplify power sources which may make use of the novel features disclosed. In some embodiments, the power sources may include batteries, supercapacitors, wind or hydroelectric turbines, fuel cells or other energy sources in addition to or instead of photovoltaic generators. The power sources may be alternating current (AC) power sources or direct current (DC) power sources. In some embodiments, batteries may be both used as a power source and used as an electrical load, and charged by the system power sources. The current routing methods and other techniques disclosed herein may be applied to alternative power sources such as those listed above, and the nearly exclusive mentioning of photovoltaic generators as power sources is not intended to be limiting in this respect.

It is noted that various connections are set forth between elements herein. These connections are described in general and, unless specified otherwise, may be direct or indirect; this specification is not intended to be limiting in this respect. Further, elements of one embodiment may be combined with elements from other embodiments in appropriate combinations or subcombinations. For example, the power device and current routing elements of one embodiment may be interchanged with the power device and current routing elements of other embodiments. For example, PV generator 101 from FIG. 9A may be interchangeable with PV generator 1301 from FIG. 13 and/or generator 101 of FIGS. 18A-18D and 18G, and string 905 from FIGS. 1A, 1C and 1D may be interchangeable with string 1005 of
FIG. 10A and/or string 1605 of FIG. 16.

What is claimed is:
1. An apparatus comprising:
a string of power devices configured to receive electrical power from a plurality of power generators, the string of power devices comprising:
a plurality of power devices arranged in a permanent physical order, each power device of the plurality of power devices comprising:
a printed circuit board (PCB),
at least one power input terminal configured to receive electrical power from one of the plurality of power generators, and
a unique identifier of a plurality of unique identifiers; and
a plurality of electrical cables,
wherein the PCBs of each adjacent pair of the plurality of power devices along the permanent physical order are permanently connected by a different one of the plurality of electrical cables without use of connectors, wherein a first quantity of the plurality of power devices is equal to a second quantity of the plurality of power generators thereby providing one of the plurality of power devices for each of the plurality of power generators, and wherein the plurality of unique identifiers indicate the permanent physical order of the plurality of power devices.

2. The apparatus of claim 1, wherein a sequential order of the plurality of unique identifiers identifies the permanent physical order of the plurality of power devices.

3. The apparatus of claim 1, further comprising a computer-readable non-transitory repository, wherein the permanent physical order is identified by a look-up table (LUT) stored in the computer-readable non-transitory repository.

4. The apparatus of claim 1, wherein each power device of the plurality of power devices comprises a device electromagnetic interference (EMI) shield, wherein each electrical cable of the plurality of electrical cables comprises a cable EMI shield, and wherein the device EMI shields of each adjacent pair of power devices along the permanent physical order are permanently connected by the cable EMI shield of a different one of the plurality of electrical cables without use of connectors.

5. The apparatus of claim 1, further comprising:
a plurality of second power devices arranged in a second permanent physical order;
a plurality of second electrical cables, wherein each adjacent pair of the second power devices along the second permanent physical order are permanently connected by a different one of the plurality of second electrical cables without use of connectors; and
an end cable comprising a male connector and a female connector mated together, wherein one of the plurality of power devices at an end of the permanent physical order is connected through the end cable to one of the plurality of second power devices at an end of the second permanent physical order.

6. An apparatus comprising:
a string of power devices configured for receiving electrical power from a plurality of power generators, the string of power devices comprising:
a plurality of power devices arranged in a permanent physical order, each power device of the plurality of power devices comprising:
a printed circuit board (PCB),
at least one power input terminal configured to receive electrical power from at least one power generator of the plurality of power generators, and
a device electromagnetic interference (EMI) shield at least partially encompassing the PCB; and
a plurality of electrical cables, wherein each electrical cable of the plurality of electrical cables comprises a conductor and a cable EMI shield,
wherein the PCBs and the device EMI shields of each adjacent pair of the plurality of power devices along the permanent physical order are permanently connected by the conductor and the cable EMI shield, respectively, of a different one of the plurality of electrical cables without use of connectors, and wherein a first quantity of the plurality of power devices is equal to a second quantity of the plurality of power generators thereby providing one of the plurality of power devices for each of the plurality of power generators.

7. The apparatus of claim 6, wherein each power device of the plurality of power devices comprises a unique identifier of a plurality of unique identifiers, and wherein the plurality of unique identifiers indicates the permanent physical order of the plurality of power devices.

8. The apparatus of claim 6, wherein each power device of the plurality of power devices comprises a unique identifier of a plurality of unique identifiers, and wherein a sequential order of the plurality of unique identifiers indicates the permanent physical order of the plurality of power devices.

9. The apparatus of claim 6, further comprising a computer-readable non-transitory repository, wherein each power device of the plurality of power devices comprises a unique identifier of a plurality of unique identifiers, and wherein the permanent physical order is identified by a look-up table (LUT) stored in the computer-readable non-transitory repository.

10. The apparatus of claim 6, further comprising:
a plurality of second power devices arranged in a second permanent physical order;
a plurality of second electrical cables, wherein each adjacent pair of the second power devices along the second permanent physical order are permanently connected by a different one of the plurality of second electrical cables without use of connectors; and
an end cable, comprising a male connector and a female connector mated together, wherein one of the plurality of power devices at an end of the permanent physical order is connected through the end cable to one of the plurality of second power devices at an end of the second permanent physical order.

11. A method comprising:
retrieving, by a central processor and from a plurality of power devices, a plurality of unique identifiers, each unique identifier being retrieved from a respective one of the plurality of power devices, wherein the plurality of power devices are permanently connected together with a plurality of electrical cables without use of connectors interleaved between the plurality of power devices;
determining, by the central processor, a permanent physical order of the plurality of power devices, based on the plurality of unique identifiers; and
storing the permanent physical order on a computer-readable non-transitory memory accessible to the central processor,
wherein each of the plurality of power devices is configured to connect to one of a plurality of power generators, and wherein a first quantity of the plurality of power devices is equal to a second quantity of the plurality of power generators thereby providing one of the plurality of power devices for each of the plurality of power generators.

12. The method of claim 11, further comprising retrieving a look-up table (LUT) stored on the computer-readable non-transitory memory, wherein the determining of the permanent physical order is further based on the LUT.

13. The method of claim 11, wherein the determining of the permanent physical order is further based on sorting the plurality of unique identifiers.

14. The method of claim 11, wherein each power device of the plurality of power devices comprises: a printed circuit board (PCB) comprising a controller, and at least one power input terminal configured to receive electrical power from at least one power generator and provide the electrical power to the PCB, wherein the plurality of unique identifiers are retrieved from the controller of the PCB.

15. The method of claim 11, wherein each power device of the plurality of power devices comprises a controller, wherein the plurality of unique identifiers are retrieved from the controllers of the plurality of power devices.

16. The method of claim 11, wherein each power device of the plurality of power devices comprises at least one power input terminal, and wherein the method further comprises receiving power input from at least one power generator via the at least one power input terminal.

17. A system comprising:
a string of power devices configured for receiving electrical power from a plurality of power generators, the string of power devices comprising:
a plurality of power devices arranged in a permanent physical order, each power device of the plurality of power devices comprising a printed circuit board (PCB), a unique identifier of a plurality of unique identifiers, and at least one power input terminal configured to electrically connect to at least one power generator; and
a plurality of electrical cables, wherein each pair of PCBs of adjacent power devices of the plurality of power devices along the permanent physical order are permanently connected by a different one of the plurality of electrical cables without use of connectors, and wherein the plurality of unique identifiers identifies the permanent physical order of the plurality of power devices,
wherein a first quantity of the plurality of power devices is equal to a second quantity of the plurality of power generators in the system.

18. A system comprising:
a string of power devices configured for receiving electrical power from a plurality of power generators, the string of power devices comprising:
a plurality of power devices arranged in a permanent physical order, each power device of the plurality of power devices comprising a printed circuit board (PCB), a device EMI shield encompassing the PCB, and at least one power input terminal configured to receive electrical power from at least one power generator; and
a plurality of electrical cables, wherein each electrical cable of the plurality of electrical cables comprises a cable EMI shield;
wherein each pair of PCBs of adjacent power devices of the plurality of power devices along the permanent physical order are permanently connected by a different one of the plurality of electrical cables without use of connectors,
wherein a first quantity of the plurality of power devices is equal to a second quantity of the plurality of power generators thereby providing one of the plurality of power devices for each of the plurality of power generators in the system, and
wherein the device EMI shields of each adjacent pair of power devices are electrically connected to the cable EMI shield of a different one of the plurality of electrical cables.

19. A system comprising:
a plurality of power generators; and
a string of power devices comprising:
a plurality of power devices arranged in a permanent physical order, each power device of the plurality of power devices comprising an electrical circuit, a unique identifier of a plurality of unique identifiers, and at least one power input terminal configured to receive electrical power from at least one power generator of the plurality of power generators, and
a plurality of electrical cables, wherein electrical circuits of each adjacent pair of power devices along the permanent physical order are permanently connected by a different one of the plurality of electrical cables, wherein the plurality of unique identifiers identify the permanent physical order of the plurality of power devices, and wherein a quantity of the plurality of power devices is greater than a quantity of the plurality of power generators thereby providing one or more spare power devices.

* * * * *